(12) United States Patent
Yamamoto et al.

(10) Patent No.: US 8,103,945 B2
(45) Date of Patent: Jan. 24, 2012

(54) DECODING METHOD AND DECODING APPARATUS AS WELL AS PROGRAM

(75) Inventors: Makiko Yamamoto, Tokyo (JP); Satoshi Okada, Tokyo (JP); Toshiyuki Miyauchi, Kanagawa (JP); Takashi Yokokawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 922 days.

(21) Appl. No.: 11/959,551

(22) Filed: Dec. 19, 2007

(65) Prior Publication Data
US 2008/0168333 A1 Jul. 10, 2008

(30) Foreign Application Priority Data

Jan. 5, 2007 (JP) ............................... P2007-000534
Jan. 5, 2007 (JP) ............................... P2007-000535
Jan. 5, 2007 (JP) ............................... P2007-000536
Jan. 5, 2007 (JP) ............................... P2007-000538

(51) Int. Cl.
*G06F 11/00* (2006.01)
(52) U.S. Cl. ..................................................... 714/800
(58) Field of Classification Search .................. 714/786, 714/794–795, 800–801
See application file for complete search history.

(56) References Cited

FOREIGN PATENT DOCUMENTS

| JP | 2005-347883 | 12/2005 |
|---|---|---|
| JP | 2006-217442 | 8/2006 |
| JP | 2006-238127 | 9/2006 |
| JP | 2006-279396 | 10/2006 |

OTHER PUBLICATIONS

Caire et al., A new data compression algorithm for sources with memory based on error correcting codes, Apr. 2003, IEEE, p. 291-295.*
Yen Chin Liao et al., Self-compensation technique for simplified belief propagation algorithm, Jun. 2007, IEEE, Trans. on Signal Process. vol. 55, No. 6, p. 3061-3072.*
V. Guruswami et al., "Improved Decoding of Reed-Solomon and Algebraic-Geometry Codes", IEEE Transactions on Information Theory, vol. 45, No. 6, pp. 1757-1767 (1999).
R. Koetter et al., "Algebraic Soft-Decision Decoding of Reed-Solomon Codes", IEEE Transactions on Information Theory, vol. 49, No. 11, pp. 2809-2825 (2003).

(Continued)

*Primary Examiner* — Shelly A Chase
(74) *Attorney, Agent, or Firm* — Finnegan, Henderson, Farabow, Garrett & Dunner, L.L.P.

(57) ABSTRACT

A decoding method for sorting received words in the order of the magnitude of the reliability of the received words, performing belief propagation using a parity check matrix diagonalized in the order to update the reliabilities, and repetitively performing the sorting and the belief propagation for the updated values, includes an inner repeated decoding process step of performing belief propagation using a parity check matrix diagonalized in an order of columns corresponding to symbols having comparatively low reliability values of the received words to update the reliability and repetitively performing the belief propagation based on the updated reliability; the inner repeated decoding process step in the second or later cycle of repetition thereof including diagonalization of the parity check matrix for restricted ones of the columns of the parity check matrix.

21 Claims, 46 Drawing Sheets

OTHER PUBLICATIONS

R. Koetter et al., "Efficient Interpolation and Factorization in Algebraic Soft-Decision Decoding of Reed-Solomon Codes", Proceedings of ISIT2003.

D. MacKay, "Good Error-Correcting Codes Based on Very Sparse Matrices", IEEE Transactions on Information Theory, vol. 45, No. 2, pp. 399 -431 (1999).

E. Berlekamp et al., "On the Inherent Intractability of Certain Coding Problems", IEEE Transactions on Information Theory, vol. IT-24, No. 3, pp. 384-386 (1978).

J. Jiang et al., "Iterative Soft Decision Decoding of Reed Solomon Codes Based on Adaptive Parity Check Matrices," Proceedings—2004 IEEE International Sympposium on Information Theory, Jun. 27-Jul. 2, 2004.

* cited by examiner

33A

DECODING METHOD AND DECODING APPARATUS AS WELL AS PROGRAM

CROSS REFERENCES TO RELATED APPLICATIONS

The present invention contains subject matter related to Japanese Patent Application JP 2007-000534, JP 2007-000535, JP 2007-000536, and JP 2007-000538 these filed with the Japan Patent Office on Jan. 5, 2007, the entire contents of which being incorporated herein by reference.

BACKGROUND OF THE INVENTION

1. Field of the Invention

This invention relates to a decoding method and a decoding apparatus as well as a program which are applied to a circuit and a program storage medium for implementing an error correction code technique which uses, for example, an algebraic method.

2. Description of the Related Art

A decoding method for an algebraic code such as, for example, a Reed-Solomon code or a BCH code as a subfield partial code of a Reed-Solomon code is known which makes use of an algebraic property of the code and is superior in both of the performance and the calculation cost.

For example, where a Reed-Solomon code having a code length n, an information length k, a definition GF(q) ($q=p^m$, p: prime number) and a minimum distance $d=n-k$ is represented by RS(n, k), it is well known that minimum distance decoding (normal decoding) which decodes a hard decision received word into a codeword having a minimum Hamming distance assures correction of t error symbols which satisfy $t<d/2$.

Meanwhile, list decoding (hereinafter referred to as G-S list decoding) by Guruswami-Sudan assures correction of t error symbols which satisfy $t<\sqrt{nk}$ as disclosed in V. Guruswami and M. Sudan, "Improve decoding of Reed-Solomon and Algebraic-Geometry codes", IEEE Transactions on Information Theory, vol. 45, pp. 1757-1767, 1999.

List decoding (hereinafter referred to as K-V list decoding) by Koetter-Vardy which uses soft decision received words as an extended version of list decoding of Guruswami-Sudan includes four steps of (1) calculation of the reliability of each symbol from received information, (2) extraction of two-variable polynomial interpolation conditions from the reliabilities, (3) interpolation of a two-variable polynomial, and (4) production of a decoded word list by factorization of the interpolation polynomial similarly to the G-S list decoding. It is known that the K-V list decoding has a higher performance than hard decision decoding. The K-V list decoding is disclosed in R. Koetter and A. Vardy, "Algebraic soft-decision decoding of Reed-Solomon codes", IEEE Transactions on Information Theory, 2001.

Further, it is known that re-encoding can reduce the calculation cost to a level in a realistic region as disclosed in R. Koetter, J. Ma, A. Vardy and A. Ahmed, "Efficient Interpolation and Factorization in Algebraic Soft-Decision Decoding of Reed-Solomon codes", Proceedings of ISIT2003.

On the other hand, as a linear code, a low density parity check code (LDPC code) by which a high performance near to a critical performance can be obtained by repeated decoding which uses belief propagation (BP) attracts attention recently. The LDPC code is disclosed in D. MacKay, "Good Error-Correcting Codes Based on Very Sparse Matrices", IEEE Transactions on Information Theory, 1999.

It is known theoretically that generally the belief propagation (BP) used for the LDPC code is effective only for linear codes having a low density parity check matrix. Further, it is known as NP-hard to make a parity check matrix of Reed-Solomon codes or BCH codes sparse as disclosed in Berlekamp, R. McEliece and H. van Tilhog, "On the inherent intractability of certain coding problems", IEEE Transactions on Information Theory, vol. 24, pp. 384-386, May, 1978.

Therefore, it has been considered difficult to apply the belief propagation (BP) to the Reed-Solomon code or the BCH code.

However, it was introduced by Narayanan et al. in 2,004 that it is effective to use a parity check matrix for which diagonalization is performed in response to the reliability of received words and apply the belief propagation (BP) to a linear code such as the Reed-Solomon code, the BCH code or any other linear code having a non-sparse parity check matrix, as disclosed in Jing Jiang and K. R. Narayanan, "Soft Decision Decoding of RS Codes Using Adaptive Parity Check Matrices", Proceeding of IEEE International Symposium on Information Theory 2004.

This technique is called adaptive belief propagation (ABP) decoding. The ABP decoding method is described below.

For example, a linear code C having, for example, a code length n=6, an information length k=3 and a coding rate r=½ and having the following 3×6 matrix H as a parity check matrix is considered:

$$H = \begin{pmatrix} 1 & 0 & 1 & 0 & 0 & 1 \\ 1 & 1 & 0 & 1 & 0 & 1 \\ 0 & 1 & 1 & 1 & 1 & 1 \end{pmatrix} \quad \text{[Expression 1]}$$

The code space C is represented in the following manner:

$$C = \{c = (c_1, c_2, \ldots, c_6), c_1, c_2, \ldots, c_6 \in 0,1 | H \cdot c^t = 0\} \quad \text{[Expression 2]}$$

It is assumed that a certain codeword is received as the following received word r by a receiver after it passes, for example, BPSK modulation+AWGN channel (Additive White Gaussian Noise channel):

$$r = (r_1, r_2, \ldots, r_6) = (0.4, 1.2, 0.1, 0.7, 0.3, 0.7) \quad \text{[Expression 3]}$$

At this time, the magnitude of each of absolute values of received values represents the height of the reliability of the received word. In other words, if the received words are numbered in the ascending order of the reliability, then they are represented in the following manner:

$$r = \underset{<3>}{(0.4,} \underset{<6>}{1.2,} \underset{<1>}{0.1,} \underset{<4>}{0.7,} \underset{<2>}{0.3,} \underset{<4>}{0.7)} \quad \text{[Expression 4]}$$

Then, diagonalization of the parity check matrix H is performed in order from a column corresponding to a symbol having a comparatively low reliability. In the present example, the columns corresponding to those symbols which have comparatively low reliabilities are the third, fifth, first, fourth or sixth, and second columns in order. Therefore, diagonalization of the matrix H is performed in this order of priority.

[Expression 5]

<1> Basic transform with the third column set as a pivot $$H = \begin{pmatrix} 1 & 0 & \text{①} & 0 & 0 & 1 \\ 1 & 1 & 0 & 1 & 0 & 1 \\ 1 & 1 & 0 & 1 & 1 & 0 \end{pmatrix} \quad \text{[Expression 6]}$$

<2> Basic transform with the fifth column set as a pivot $$H = \begin{pmatrix} 1 & 0 & ① & 0 & 0 & 1 \\ 1 & 1 & 0 & 1 & ① & 0 \\ 1 & 1 & 0 & 1 & 0 & 1 \end{pmatrix}$$ [Expression 7]

<3> Basic transform with the first column set as a pivot $$H_{new} = \begin{pmatrix} 0 & 1 & ① & 1 & 0 & 0 \\ 0 & 0 & 0 & 0 & ① & 0 \\ ① & 1 & 0 & 1 & 0 & 1 \end{pmatrix}$$

If a column whose diagonalization is attempted is linearly dependent on another column which has been diagonalized before then, then this column is left as it is, and it is attempted to diagonalize a different column which is next in the order.

A new parity check matrix Hnew obtained as a result of diagonalization performed for the rank of the matrix R in this manner is used to update the reliability by belief propagation (BP).

FIG. 1 is a Tanner graph corresponding to the parity check matrix Hnew.

Belief propagation (BP) is implemented by causing messages to come and go along an edge of a Tanner graph.

A node corresponding to each column of a matrix is called variable node 1, and a node corresponding to each row is called check node 2.

Where a message from an ith variable node to a jth check node is represented by Qi,j while another message from the jth check node to the ith variable node is represented by Ri,j and an Index set of check nodes connecting to the ith variable node is represented by J(i) and an index set of variable nodes connecting to the jth check node is represented by I(j), the updating expressions for them are such as given below:

$$R_{i,j} = 2\tanh^{-1}\left(\prod_{i \in f(j)/j} \tanh(Q_{i,j}/2)\right)$$ [Expression 8]

$$Q_{i,j} = r_i + \theta \sum_{i=j(i)/j} R_{i,t}$$

where $\theta$ is a coefficient called vertical step damping factor and satisfies a condition of $0<\theta \leq 1$. The initial value of Qi,j is set to rj, and updating of extrinsic information $\Lambda_i^x$ is performed in accordance with the following expression:

$$\Lambda_i^x = \sum_{t \in J(i)} R_{i,t}$$ [Expression 9]

Further, updating of LLR $\Lambda_i^q$ of each code bit is performed in accordance with the following expression:

$$\Lambda_i^q = r_i + \alpha_i \Lambda_i^x$$ [Expression 10]

where $\alpha 1$ is a coefficient called adaptive belief propagation damping factor and satisfies a condition of $0 < \alpha 1 \leq 1$.

The updating of the LLR by the belief propagation (BP) is repeated until a repetition stopping condition prepared in advance becomes satisfied, for example, until a maximum repetition number $It_H$ is reached.

Meanwhile, all columns need not be determined as an object of updating of the LLR, but such updating may be performed for some of the columns, for example, only for those columns which are made as an object of diagonalization.

By performing diagonalization using the reliability of the LLR updated by the reliability propagation (BP), that is, using the magnitude of the absolute value of each LLR value as a reliability, in the order of columns corresponding to symbols having comparatively low reliabilities, repeated decoding by new belief propagation (BP) can be performed.

This is referred to as inner repeated decoding. This updating of the LLR is repeated until after an inner repeated decoding stopping condition SC1 prepared in advance is satisfied.

Further, a plurality of rankings other than the reliability of received values are prepared as initial values of the diagonalization priority ranking of columns of a parity check matrix. The inner repeated decoding is performed serially or parallelly using a plurality of rankings.

This is referred to as outer repeated decoding. This LLR updating is repeated until after an outer repeated decoding stopping condition SC2 prepared in advance becomes satisfied.

The LLR values updated repeatedly by the ABP (Adaptive Belief Propagation) procedure described above are inputted to a decoder to perform decoding.

Now, if it is assumed that the object linear code is a Reed Solomon code, the repeated decoding stopping conditions SC1 and SC2 may be, for example, such as given below:

(A) H·d== or repetition rate $t \geq N$,
(B) Success in critical distance decoding or repetition rate $t \geq N$,
(C) Success in Koetter-Vardy soft decision list decoding or repetition rate $t \geq N$.

where $d=(d_1, d_2, \ldots, d_6)$ is a result of the hard decision of $\Lambda_i$, $d_i = \{1$ if $d_i = (\Lambda_i^q > 0)$, but 0 if $\Lambda_i^q = 0\}$, and N is a maximum number of cycles of repetition determined in advance.

Meanwhile, the following methods may be applied as the decoding method:

(a) Hard decision decoding
(b) Critical distance decoding
(c) Koetter-Vardy soft-decision list decoding FIG. 2 illustrates repeated decoding which uses the ABP decoding method.

Referring to FIG. 2, a search for the reliability order of received words is performed (step ST1) and then order conversion is performed (step ST2).

Diagonalization of a parity check matrix is performed in response to the resulting order (step ST3), and belief propagation (BP) is performed using the parity check matrix (step ST4).

Thereafter, the LLR is calculated (step SP5), and the reliability order of the calculated LLR values is searched (step ST6). Then, the decoded words are added to a list (step ST7).

Then, the processes described above are repeated until after the repeated decoding stopping conditions N1 and N2 are satisfied (steps ST8 and ST9).

Then, one of the decoded words is selected (step ST10).

SUMMARY OF THE INVENTION

Incidentally, in the technique described above, a sorting apparatus is demanded which carries out a work of sorting column indexes in the order of the magnitude of the reception LLR and another work of re-sorting the column indexes using LLR values updated by belief propagation (BP).

However, it is not proposed specifically how the sorting apparatus is implemented.

Further, the technique described above has various restrictive conditions. In particular, it is necessary to output column indexes at a timing desired by a diagonalization apparatus at the following stage after sorting is performed. Further, where, when updated LLR values are sorted, only LLR values in some columns are updated and only the updated indexes are inputted, it is necessary for the indexes whose LLR is updated in the sorted index order prior to the updating.

Furthermore, there is such a characteristic unique to the ABP decoding that, where indexes are sorted, if different indexes have an equal LLR value, then there is no necessity to particularly care about the inputting order of the indexes.

In addition, as the sorting method, various methods such as a selection lining up method, an insertion lining up method and a shell sorting method are available.

From the foregoing, it is not simple to determine a sorting apparatus and a sorting method suitable for the restrictive conditions or the characteristic unique to the ABP decoding method described above.

Further, actually most systems are designed for a RS code having a code length greater than the matrix H such as a Reed-Solomon code RS(204, 188) code, and it is difficult to implement such systems with a realistic operation frequency using existing techniques.

FIG. 3 illustrates an example of a flow for each repetition of an ABP decoding apparatus.

If received words arrive, then they are sorted in an order of the magnitude of the reliability, and diagonalization for a matrix H of 128 columns having comparatively low reliabilities is performed. Then, the parity check matrix after the diagonalization is represented by H1.

This parity check matrix H1 is utilized to perform belief propagation (BP). In this instance, the reliability is updated only for the 128 columns which have been an object of the diagonalization. Also in the second and later cycles of repetition, it is repeated similarly to re-sort updated reliability values, diagonalize the matrix H of 128 columns having comparatively low reliabilities and perform belief propagation (BP).

Where such an ABP decoding apparatus as described above is to be implemented, a demanded operation frequency can be estimated in the following manner.

For example, where a Reed-Solomon code RS(240,188) is assumed and it is assumed to implement the inner repeated decoding by means of an apparatus, the clock cycle number necessary for ABP decoding in conditions that the inner repetition number is 10, that the updating of the LLR is restricted only to 128 columns of an object of diagonalization and that the repetition number of the belief propagation (BP) becomes such as described below:

$$T=T_1+T_2\times 9 \quad \text{[Expression 11]}$$

where T1 is the clock cycle number demanded for the first cycle of repetition, and T2 is the clock cycle number demanded for the second and later cycles of repetition.

The clock cycle number T1 is given by the following expression:

$$T_1=T_{sort1}+T_{diag}+T_{bp} \quad \text{[Expression 12]}$$

where Tsort1 is the clock cycle number demanded for sorting, and where the inverse mapping sorting is used, at least 1,632 clock cycles equal to the input bit number are demanded. Meanwhile, Tdiag is the clock cycle number required for diagonalization. Where a diagonalization apparatus which performs pivot search and sweeping out by reading out of one row and besides performs basic transform of a plurality of columns, for example, four columns, in parallel, if R columns are basically transformed in parallel in the present cycle, then at least a number of 128×128/4=4,096 clock cycles are demanded. Further, Tbp is the clock cycle number demanded for belief propagation (BP), and since LLR updating is performed only for the 128 columns of an object of diagonalization, at least 128 clock cycles are demanded.

From the foregoing, the clock cycle number T1 becomes as given by the following expression:

$$T_1=1632+4096+128=5856 \quad \text{[Expression 13]}$$

Further, the clock cycle number T2 in the second and later cycles of the inner repetition becomes as given by the following expression:

$$T_2=T_{sort2}+T_{diag}+T_{bp} \quad \text{[Expression 14]}$$

where Tsort is the clock cycle number required for the sorting in the second and later cycles of the inner repetition, and where column indexes whose LLR is updated include 128 columns, it is considered that Tsort2=128.

However, in the second and later cycles of repetition, if the reliability updated for every one column by belief propagation (BP) of the preceding cycle of repetition is inputted for each clock cycle to the sorting apparatus, then it is possible to perform the belief propagation "BP" and the sorting almost at the same time. Therefore, Tsort2 can be set to Tsort2=0. In other words, T2 becomes such as given by the following expression:

$$T_2=0+4096+128=4224 \quad \text{[Expression 15]}$$

From the foregoing, T is given by the following expression:

$$T=5856+4224\times 9=43872 \quad \text{[Expression 16]}$$

Here, where a case wherein data of 64 [Mbps] are ABP decoded is considered, the operation frequency is given by the following expression:

$$\frac{64\ [\text{Mbps}]}{1632\ [\text{bit}/codeward]}\times 43872\ [clk]=1.72\ [\text{GHz}] \quad \text{[Expression 17]}$$

In this manner, the operation frequency of 1.72 GHz is required, and this is not practical with existing techniques.

Therefore, it is demanded to provide a decoding method and a decoding apparatus as well as a program by which the operation frequency can be suppressed to an available frequency and decoding of high reliability can be performed at a high speed with a reduced amount of calculation and with a small circuit scale.

Incidentally, in the technique described above, the maximum repetition number $It_H$ of the belief propagation (BP) is not particularly specified. Further, the calculation amount increases as the number of times of repetition increases.

Further, if the LLR updating is performed for all nodes of codewords, then a considerable amount of calculation is demanded.

Particularly since, in nodes other that diagonalization object columns, partial matrixes are very dense, the mathematical operation amount is very great.

Particularly, a belief propagation (BP) apparatus must perform both of check node mathematical operation and variable node mathematical operation, and both of a parity check row and a column of a parity check matrix are demanded for both operations. It is difficult to read out both of them from the diagonalization circuit at the preceding stage even with a general configuration of a memory.

Further, it is necessary for a message memory to have a number of words equal to the number of is in a parity check matrix. However, since the parity check matrix varies at any time, it is hard to set the memory word number to a fixed number, or if it is tried to assure a sufficient word number, then an increased memory capacity is demanded.

Therefore, it is demanded to provide a decoding method and a decoding apparatus as well as a program which can perform decoding with a high degree of reliability at a high speed through a reduced amount of calculation and with a reduced circuit scale.

According to an embodiment of the present invention, there is provided a decoding method for sorting received words in the order of the magnitude of the reliability of the received words, performing belief propagation using a parity check matrix diagonalized in the order to update the reliabilities, and repetitively performing the sorting and the belief propagation for the updated values, including an inner repeated decoding process step of performing belief propagation using a parity check matrix diagonalized in an order of columns corresponding to symbols having comparatively low reliability values of the received words to update the reliability and repetitively performing the belief propagation based on the updated reliability, the inner repeated decoding process step in the second or later cycle of repetition thereof including diagonalization of the parity check matrix for restricted ones of the columns of the parity check matrix.

According to another embodiment of the present invention, there is provided a decoding apparatus which sorts received words in the order of the magnitude of the reliability of the received words, performs belief propagation using a parity check matrix diagonalized in the order to update the reliabilities, and repetitively performs the sorting and the belief propagation for the updated values, including a processing section for performing, when belief propagation is performed using a parity check matrix diagonalized in an order of columns corresponding to symbols having comparatively low reliability values of the received words to update the reliability and the belief propagation is repetitively performed based on the updated reliability, in the second or later cycle of repetition, diagonalization of the parity check matrix for restricted ones of the columns of the parity check matrix.

Preferably, the processing section removes, in the second or later cycle of repetition of the inner repeating decoding process, pivot rows corresponding to those columns newly excepted from an object of diagonalization from a past pivot row list and performs the diagonalization only for column indexes which newly become an object of diagonalization using the matrix after the diagonalization in the preceding cycle.

In this instance, preferably the processing section performs, in the second or later cycle of repetition of the inner repeating decoding process, exchange between column indexes which become an object of diagonalization and column indexes which do not become an object of the diagonalization only for restricted sequences.

Further, in this instance, preferably the processing section compares, in the second or later cycle of repetition of the inner repeating decoding process, when the reliability values of those column indexes which become an object of diagonalization upon the preceding cycle of repetition are updated and newly sorted, sequences whose updated reliability values are comparatively high and sequences whose reliability values are comparatively low from among those column indexes which are excepted from an object of diagonalization in the preceding cycle of repetition with each other and excepts those sequences whose reliability values are comparatively low are added to the object of diagonalization but those sequences whose reliability values are comparatively high from the object of diagonalization.

Alternatively, the processing section may compulsorily except, in the second or later cycle of repetition of the inner repeating decoding process, those sequences whose updated reliability values are comparatively high from among the column indexes which become the object of diagonalization in the preceding cycle of repetition from the object of diagonalization and may compulsorily set those sequences whose reliability values are comparatively low from among the column indexes which are excepted from the object of diagonalization in the preceding cycle of repetition as a new object of diagonalization.

According to a further embodiment of the present invention, there is provided a program for causing a computer to execute a decoding process for sorting received words in the order of the magnitude of the reliability of the received words, performing belief propagation using a parity check matrix diagonalized in the order to update the reliabilities, and repetitively performing the sorting and the belief propagation for the updated values, including an inner repeated decoding process step of performing belief propagation using a parity check matrix diagonalized in an order of columns corresponding to symbols having comparatively low reliability values of the received words to update the reliability and repetitively performing the belief propagation based on the updated reliability, the inner repeated decoding process step in the second or later cycle of repetition thereof including diagonalization of the parity check matrix for restricted ones of the columns of the parity check matrix.

In the decoding method, decoding apparatus and program, the dividing method between a set of columns which make an object of diagonalization and another set of columns which do not make the object of diagonalization in the second or later cycle of repetition of the inner repeating decoding process is applied restrictively only to the exchange of restricted ones of the columns of the two sets in the preceding cycle of repetition. Then, only with regard to those columns which newly become the object of diagonalization by the exchange, the diagonalization is performed for the parity check matrix updated by the preceding cycle of diagonalization.

The decoding method, decoding apparatus and program are advantageous in that the operation frequency can be suppressed to an available frequency and decoding of high reliability can be performed at a high speed with a reduced amount of calculation and with a small circuit scale.

According to a still further embodiment of the present invention, there is provided a decoding method for sorting received words in the order of the magnitude of the reliability of the received words, performing belief propagation using a parity check matrix diagonalized in the order to update the reliabilities, and repetitively performing the sorting and the belief propagation for the updated values, including a belief propagation step of performing belief propagation of the reliability of the received words, the belief propagation at the belief propagation step being performed only using indexes of columns to be updated, pivot columns of the parity check matrix corresponding to the columns and reliability values of all columns.

Preferably, the belief propagation step includes a first step of performing check node mathematical operation using input reliability values and parity check rows to produce updating messages, and a second step of updating reliability values of columns to be updated with reliability values of the columns to be updated selected based on the indexes of the columns to be updated and the updating messages produced at the first step.

Preferably, at the second step, the updating of the reliability is performed only for the columns of the object of diagonalization.

According to an additional embodiment of the present invention, there is provided a decoding apparatus which sorts received words in the order of the magnitude of the reliability of the received words, performs belief propagation using a parity check matrix diagonalized in the order to update the reliabilities, and repetitively performs the sorting and the belief propagation for the updated values, including a belief propagation section performing belief propagation of the reliability of the received words, the belief propagation section performing the belief propagation only using indexes of columns to be updated, pivot columns of the parity check matrix corresponding to the columns and reliability values of all columns.

Preferably, the belief propagation section includes a mathematical operation section for performing check node mathematical operation using input reliability values and parity check rows to produce updating messages, and an updating section configured to update reliability values of columns to be updated with reliability values of the columns to be updated selected based on the indexes of the columns to be updated and the updating messages produced at the first step.

Preferably, the updating section performs the updating of the reliability only for the columns of the object of diagonalization.

According to another additional embodiment of the present invention, there is provided a program for causing a computer to execute a decoding process for sorting received words in the order of the magnitude of the reliability of the received words, performing belief propagation using a parity check matrix diagonalized in the order to update the reliabilities, and repetitively performing the sorting and the belief propagation for the updated values, including a belief propagation step of performing belief propagation of the reliability of the received words, the belief propagation at the belief propagation step being performed only using indexes of columns to be updated, pivot columns of the parity check matrix corresponding to the columns and reliability values of all columns.

In the decoding method, decoding apparatus and program, originally a node having a high reliability has a high degree of possibility that it may not be wrong while a node having a low reliability has a high degree of possibility that it may be wrong. Meanwhile, exchange between diagonalization object columns and non-diagonalization object columns is likely to occur between them where they have reliabilities close to each other, but is much less likely to occur between them where they have high reliabilities. From this, updating of the reliability is not performed for nodes other than those of the diagonalization object.

Further, in the belief propagation (BP), when 2n cycles exist on a Tanner graph, if repetition of belief propagation is performed by more than n times, then there is the possibility that the independency between different messages may be damaged, resulting in deterioration of the performance. Actually, also a parity check matrix has a large number of cycles of n=2 of a very high density. From this, in the present invention, the number of times of repetition of the belief propagation (BP) is restricted to once.

Therefore, the decoding method, decoding apparatus and program are advantageous in that they can perform decoding with a high degree of reliability at a high speed through a reduced amount of calculation and with a reduced circuit scale.

The above and other objects, features and advantages of the present invention will become apparent from the following description and the appended claims, taken in conjunction with the accompanying drawings in which like parts or elements denoted by like reference symbols.

DETAILED DESCRIPTION OF THE PREFERRED EMBODIMENTS

In the following, the present invention is described in detail in connection with preferred embodiments thereof which are shown in the accompanying drawings.

A decoding apparatus according to a first embodiment of the present invention can be applied to a circuit for implementing error correction coding which uses an algebraic technique, for example, an adaptive belief propagation decoder.

ABP decoding is a decoding method for a Reed Solomon (RS) code, a BCH code or any other linear code having a parity check matrix which is not low in density and updates, if a codeword is received from a certain transmission line, the received codeword into a more reliable value.

In the following, the position of a decoding apparatus for ABP decoding on a communication system is described first, and then a particular configuration and function of the communication system according to the present embodiment are described.

Figure 1:
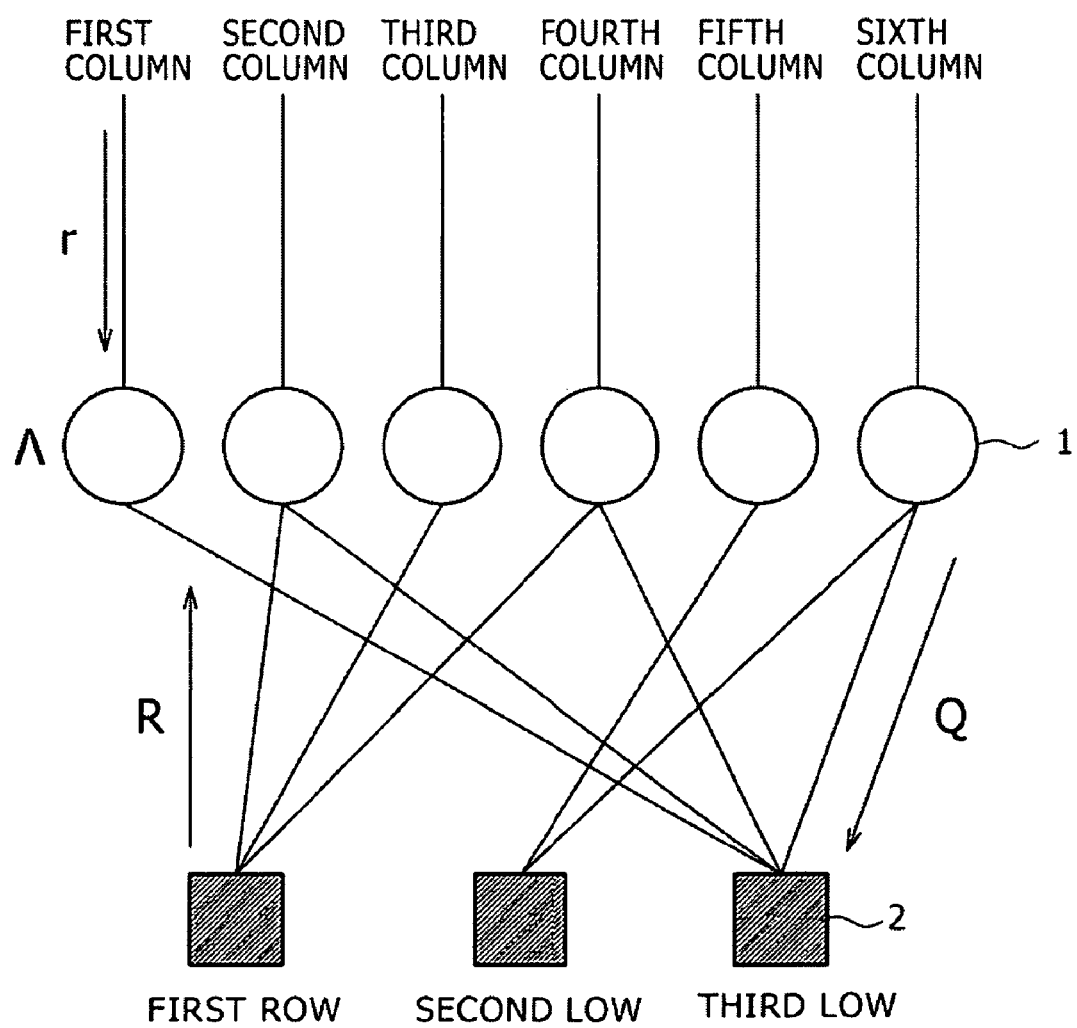
FIG. 1 is a Tanner graph corresponding to a parity check matrix.
Figure 2:
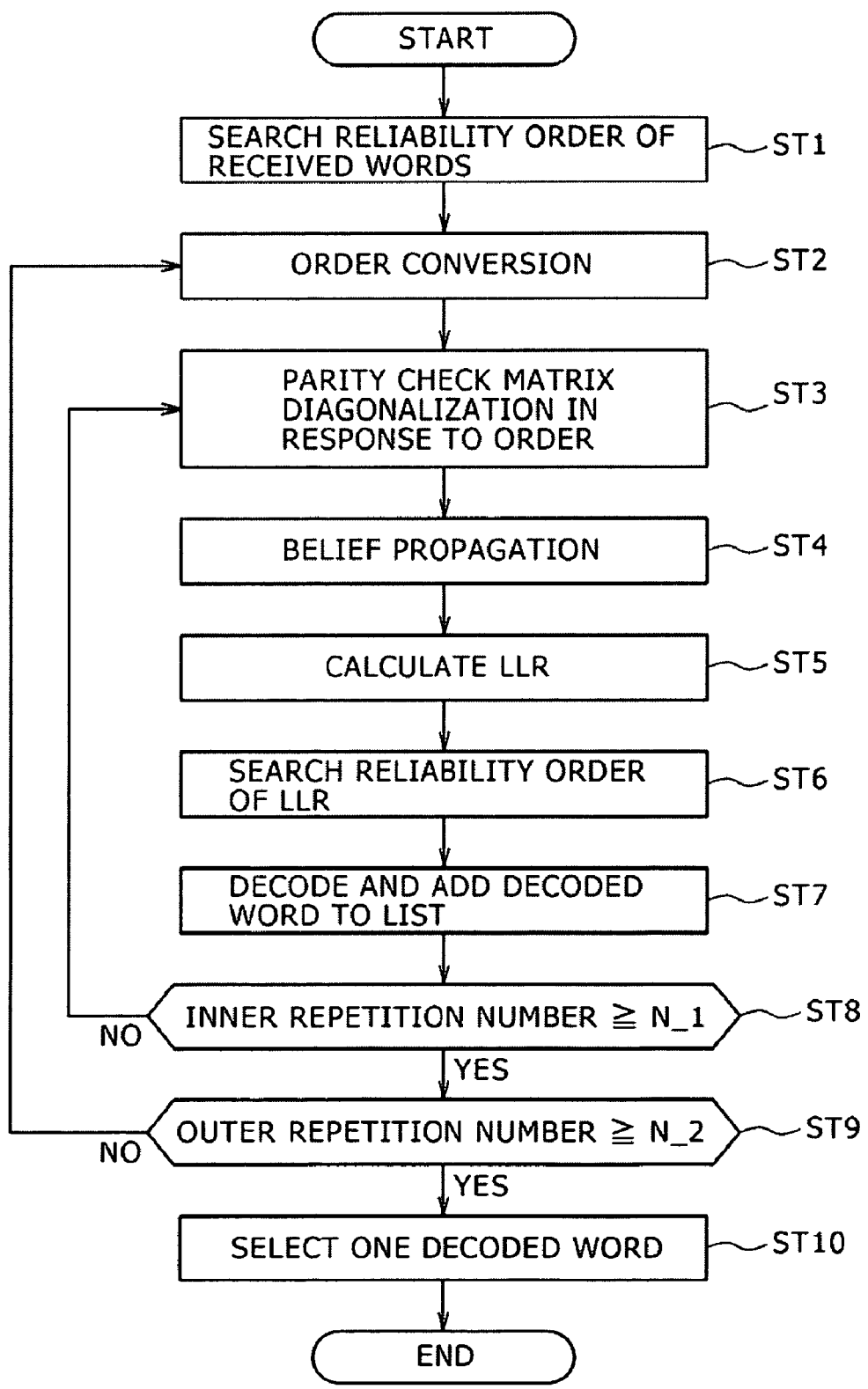
FIG. 2 is a flow chart of repeated decoding in which an ABP decoding method is used.
Figure 3:
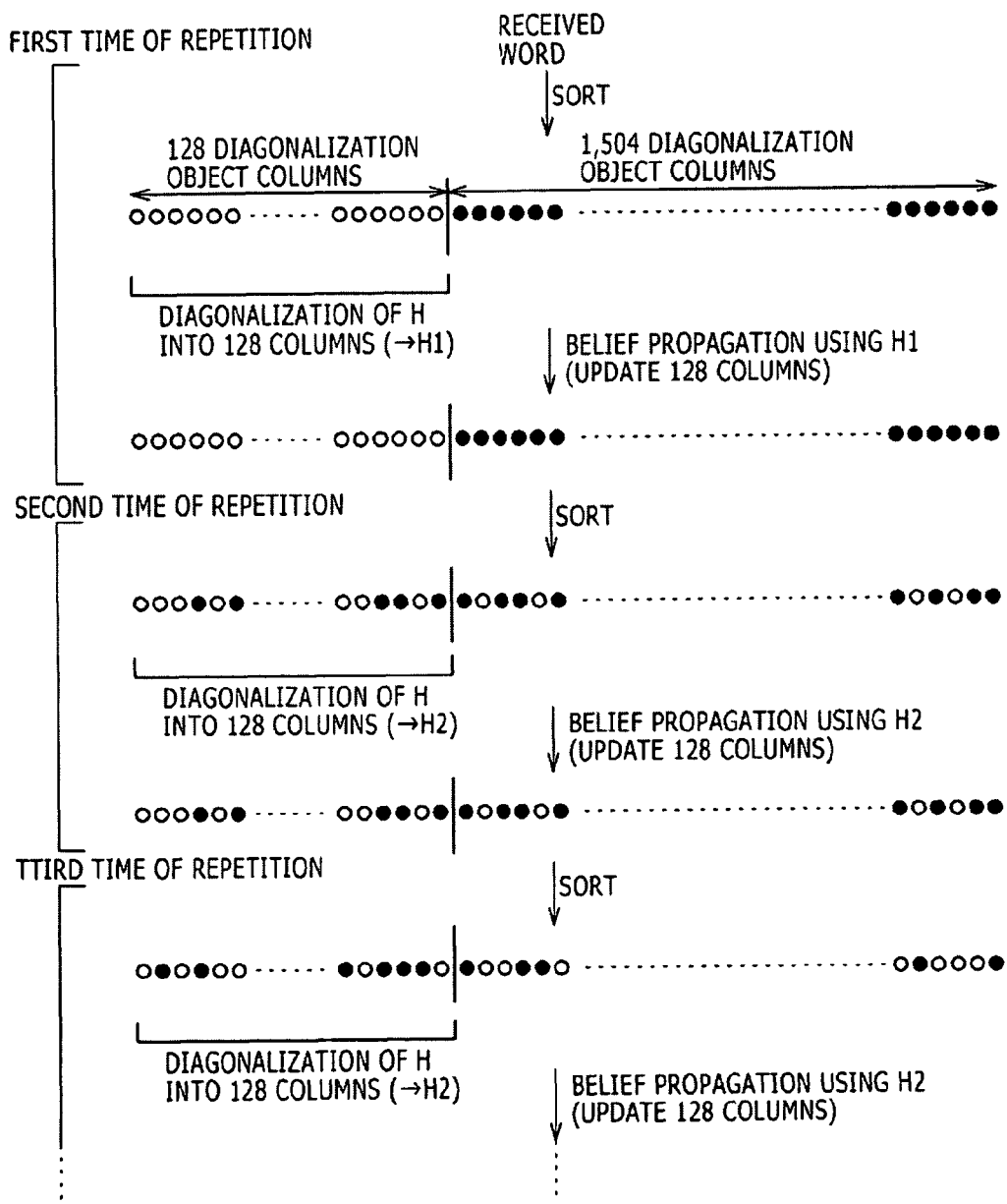
FIG. 3 is a diagrammatic view illustrating an example of a flow for each cycle of repetition of an ABP decoding apparatus.
Figure 4:
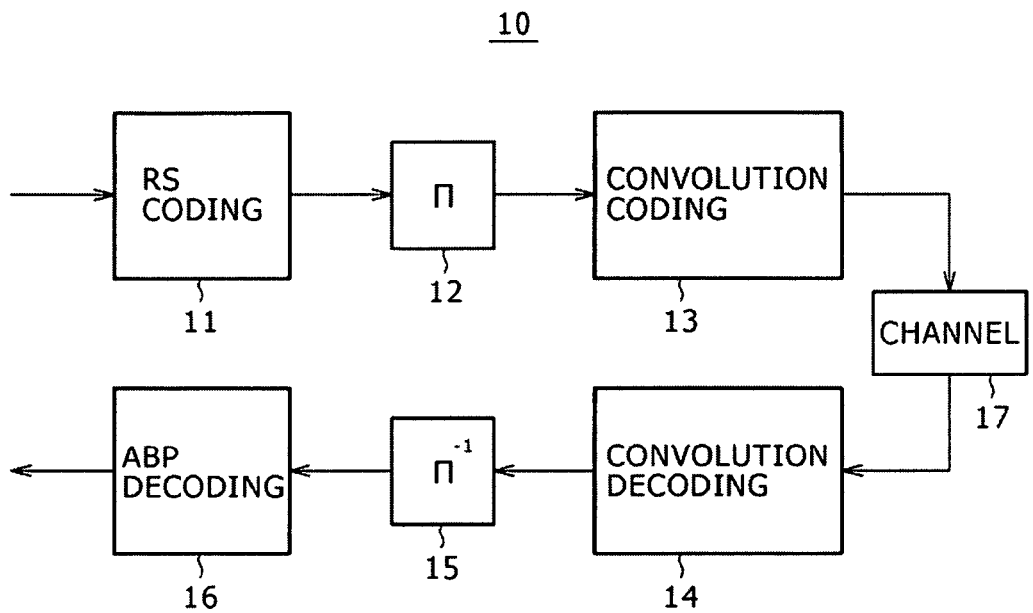
FIG. 4 is a block diagram showing an example of a configuration of a communication system wherein an ABP decoder is used in an error correction system for a digital signal receiver such as, for example, a digital television set.

FIG. 4 shows an example of a configuration of a communication system wherein an ABP decoder is used in an error correction system for a digital signal receiver such as a digital television set.

Referring to FIG. 4, the communication system 10 shown includes a RS encoder 11, an interleaver 12, a convolution encoder 13, a convolution code soft output decoder 14, a deinterleaver 15, an ABP repeated decoder 16 with known information of a RS code and a channel 17.

In the present communication system 10, RS coded and convolution coded transmission words are subjected to ABP decoding after soft output decoding of convolution codes.

The soft output decoding of convolution codes here is decoding, for example, by the BCJR algorithm or the SOVA.

The ABP decoder 16 performs, after updating of the reliability by the ABP decoding, hard decision posteriori critical distance decoding, list decoding or soft decision list decoding which uses the values as they are as an input.

Figure 5:
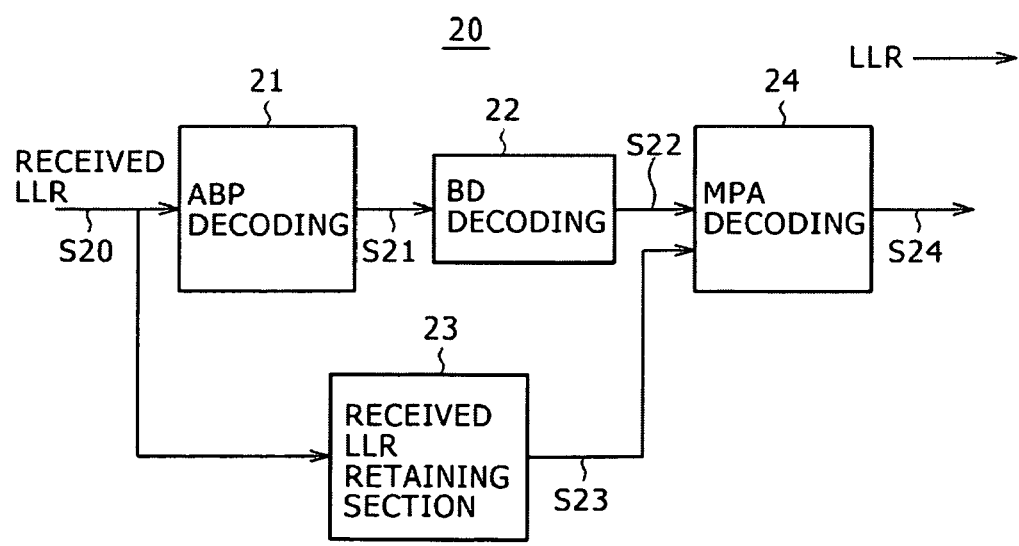
FIG. 5 is a block diagram showing an example of a configuration of an ABP decoder followed by a MAP decoder.

FIG. 5 shows an example of a configuration of the ABP decoder followed by MAP decoding.

Referring to FIG. 5, the decoder 20 includes an ABP decoder 21, a critical distance (BD) decoder 22, a received reliability (LLR) retaining section 23, and a MAP decoder 24.

In the decoder 20, reliabilities (LLR) are updated first and then hard decided by the ABP decoder 21, and then critical distance decoding is performed by the critical distance (BD) decoder 22. Resulting values of the critical distance decoding are collected into a list. Finally, the MAP decoder 24 performs maximum a posteriori probability (MAP) decoding.

Figure 6:
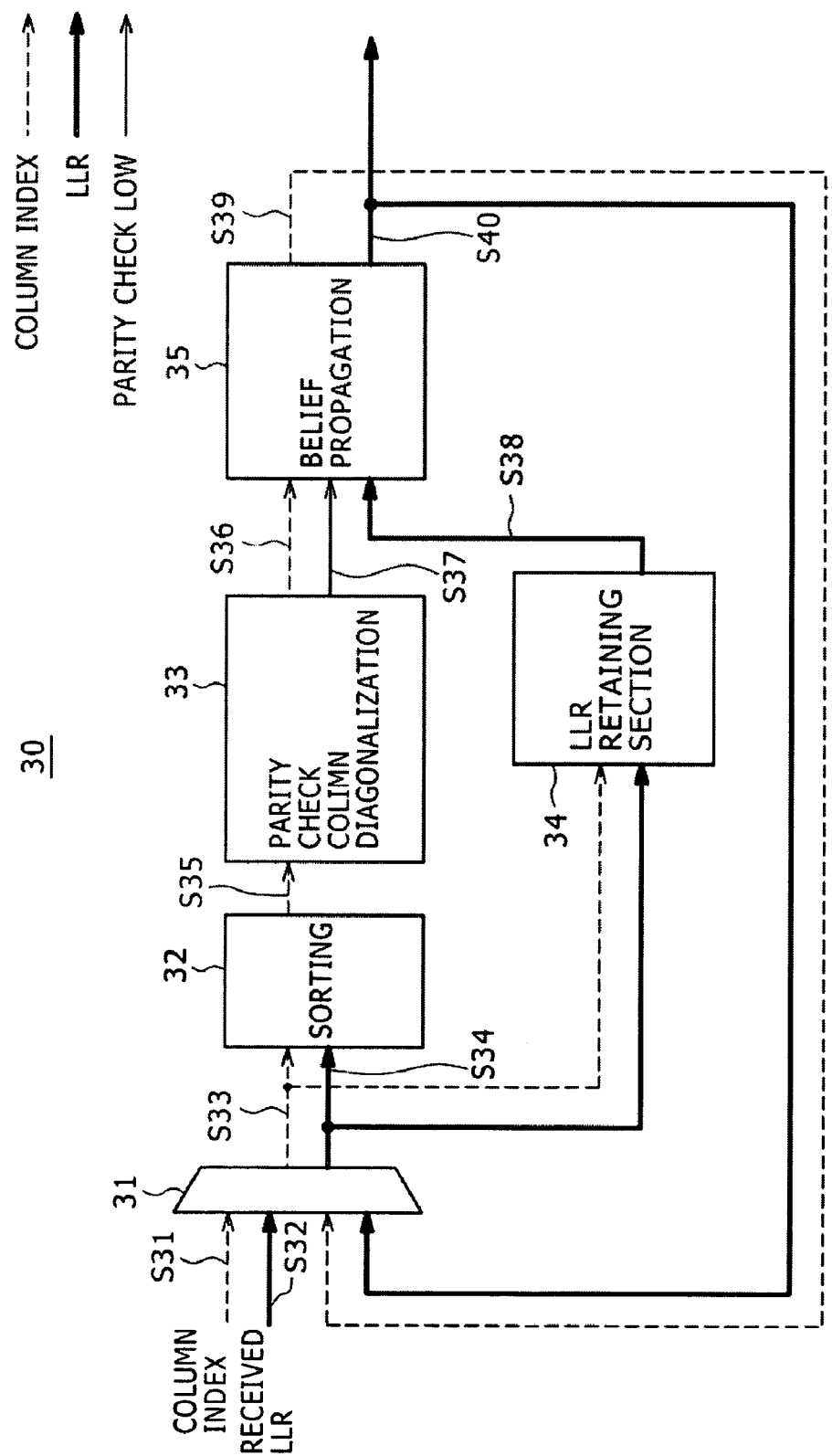
FIG. 6 is a block diagram showing an example of a configuration of a decoding apparatus of the ABP decoder.

FIG. 6 shows an example of a configuration of a decoding apparatus of an ABP decoder.

The ABP decoder 30 of FIG. 6 can be applied to the ABP repeated decoder 16 of FIG. 4 or the ABP decoder 21 of FIG. 5 and includes a sort input selection section 31, a sorting section 32, a parity check matrix diagonalization section 33, a reliability (LLR) retaining section 34 and a belief propagation (BP) section 35.

It is to be noted that a processing section according to the present embodiment is formed from the sorting section 32 and the diagonalization section 33.

In the ABP decoder 30, a received LLR S32 is inputted as an input thereto.

A column index S31 produces, from the beginning of a codeword of the received LLR inputted thereto, a value counted up as 0, 1, 2, 3, . . . by means of a counter and utilizes the count value.

The sort input selection section 31 selects, in the first cycle, the column index S31 and the received LLR S32, but selects, in the second and later cycles of repetition, an updated LLR S40 and a column index S39 of the same.

As seen in FIG. 5, if a received word is inputted, then the sorting section 32 first sorts column indexes in response to the magnitude of the reliability (LLR) of the received word.

Then, the diagonalization section 33 performs diagonalization of the parity check matrix in order beginning with a column corresponding to a symbol having a comparatively low reliability.

Finally, the diagonalized parity check matrix is used to perform belief propagation (BP) to update the values.

For the updated values, sorting, diagonalization and belief propagation (BP) are performed again for the updated values. The number of times of repetition is determined in advance, and the sorting, diagonalization and belief propagation (BP) are performed by the determined number of times.

In the sorting section 32 which forms the processing section of the ABP decoder 30, data sorting apparatus according to embodiments of the present invention can be applied.

First Embodiment

Figure 7:
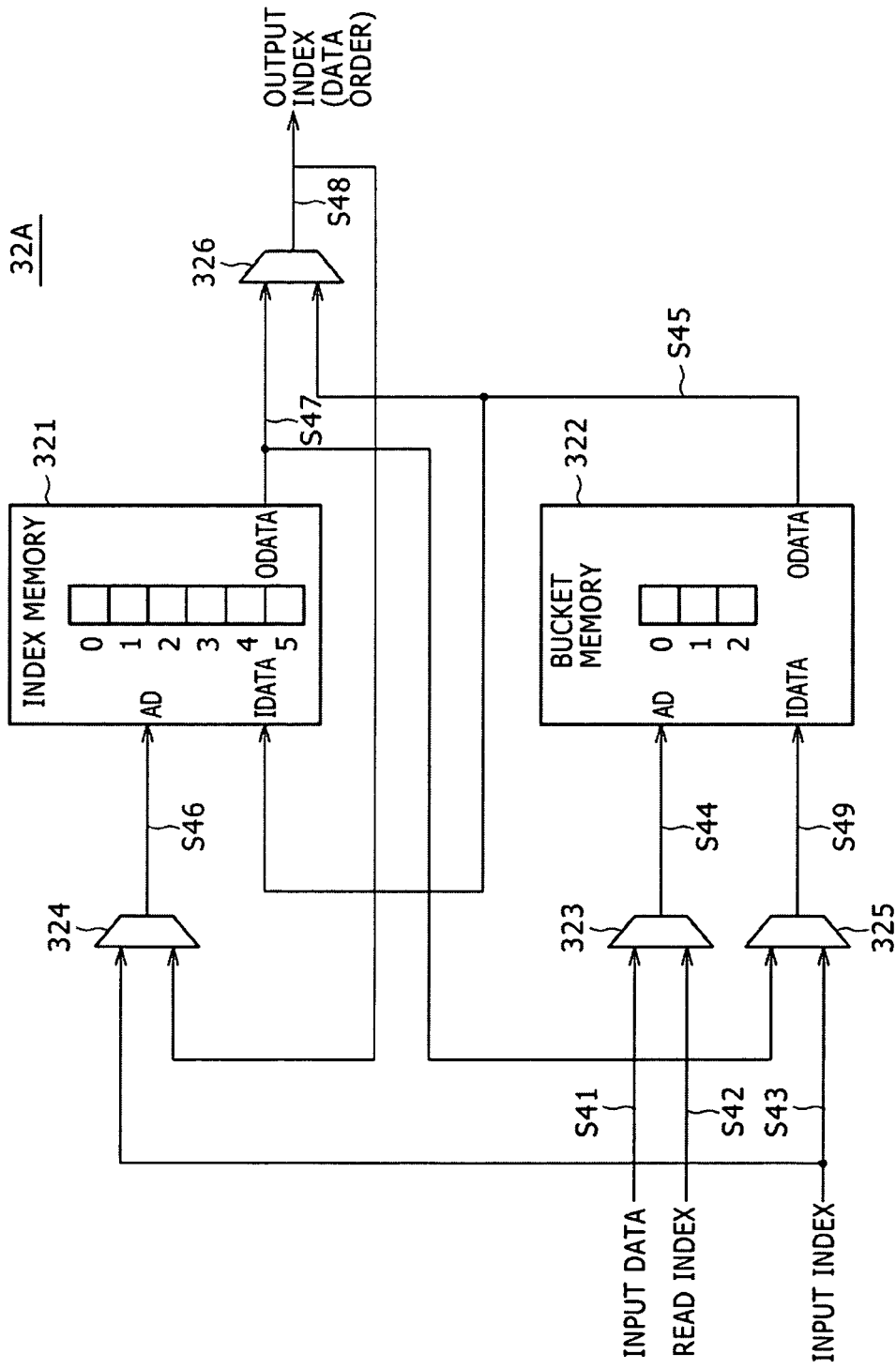
FIG. 7 is a block diagram showing an example of a configuration of a data sorting apparatus for an ABP decoder according to a first embodiment of the present invention and illustrating processing of the data sorting apparatus.

FIG. 7 shows an example of a configuration of a data sorting apparatus of an ABP decoder according to a first embodiment of the present invention.

Referring to FIG. 7, the data sorting apparatus 32A according to the present first embodiment has addresses corresponding to the size of data and includes an index memory 321 and a bucket memory 322 serving as a buffer. The data sorting apparatus 32A further includes a first writing and reading out address selection section 323, a second writing and reading out address selection section 324, a write data selection section 325, and an output index selection section 326.

The index memory 321 receives, at an address input AD thereof, a second writing and reading out address S46 from the second writing and reading out address selection section 324 and, at an input IDATA thereof, a bucket top index S45 from the bucket memory 322 and designate a certain index as an address. Then, the index memory 321 retains a different index whose data has a same size, and outputs, from an output ODATA thereof, a readout index S17 to an output index selection section 328 and the write data selection section 325.

The bucket memory 322 receives, at an address input AD thereof, a first writing and reading out address S44 from the first writing and reading out address selection section 323 and, at an input IDATA thereof, a write index S49 from the write data selection section 325, and retains an index representative of the data into each address thereof. Then, the bucket memory 322 outputs, from an output ODATA thereof, a bucket top index S45 to the index memory 321 and the output index selection section 326.

The first writing and reading out address selection section 323 selects one of input data S41 and readout data S42 under the control of a control system not shown and outputs the selected data as a first writing and reading out address S44 to the address input AD of the bucket memory 322.

The second writing and reading out address selection section 324 selects one of an input index s43 and an output index S48 outputted from the output index selection section 326 under the control of the control system not shown. Then, the sorting section 32 outputs the selected index as a second writing and reading out address S46 to the address input AD of the index memory 321.

The write data selection section 325 selects one of the input index S43 and a readout index S47 from the index memory 321 under the control of the control system not shown and outputs the selected index as a write index S49 to the input IDATA of the bucket memory 322.

The write data selection section 325 is controlled so as to select the input index S43 upon inputting but select the readout index S47 of the index memory 321 upon outputting.

The output index selection section 326 selects one of the bucket top index S45 outputted from the bucket memory 322 and the readout index S47 from the index memory 321 under the control of the control system not shown. Then, the output index selection section 326 outputs the selected index as an output index S48 to the diagonalization section 33 at the succeeding stage and the second writing and reading out address selection section 324.

In the following, an example of operation of the data sorting apparatus 32A according to the first embodiment of the present invention is described with reference to FIGS. 7 to 17.

Here, a case is considered wherein the sorting section 32 decodes a linear code having a code length n=6, an information length k=3 and a coding rate r=½ and has a matrix H as a parity check matrix. In this instance, the sorting section 32 sorts an input thereto and outputs an index of three columns of a diagonalization object.

Referring to FIG. 7, LLR values are inputted to the input data S41 and column indices are inputted to the input index S43. Readout data S42 is a parameter produced in the sorting apparatus.

After the inputting of the input data S41 and the input index S43 is completed, column indices re-arranged in an order of the magnitude of data are read out as output column indices. Since the LLR values are compared between absolute values thereof, the input data S41 is converted into absolute values after it is inputted.

When the input data S41 and the input index S43 are inputted, they are written into the index memory 321 and the bucket memory 322, respectively.

First, indices which do not exist as initial values of the bucket memory 322 are retained in the bucket memory 322. In this instance, if it is assumed that the column indices include 0th to 5th indices, then the index which does not exist is set to a sixth index. After inputting is started, the bucket top index S45 read out from the bucket memory 322 using the input data S41 as the readout address S44 is written into the index memory 321 using the input index S43 as the address S46.

Figure 8:
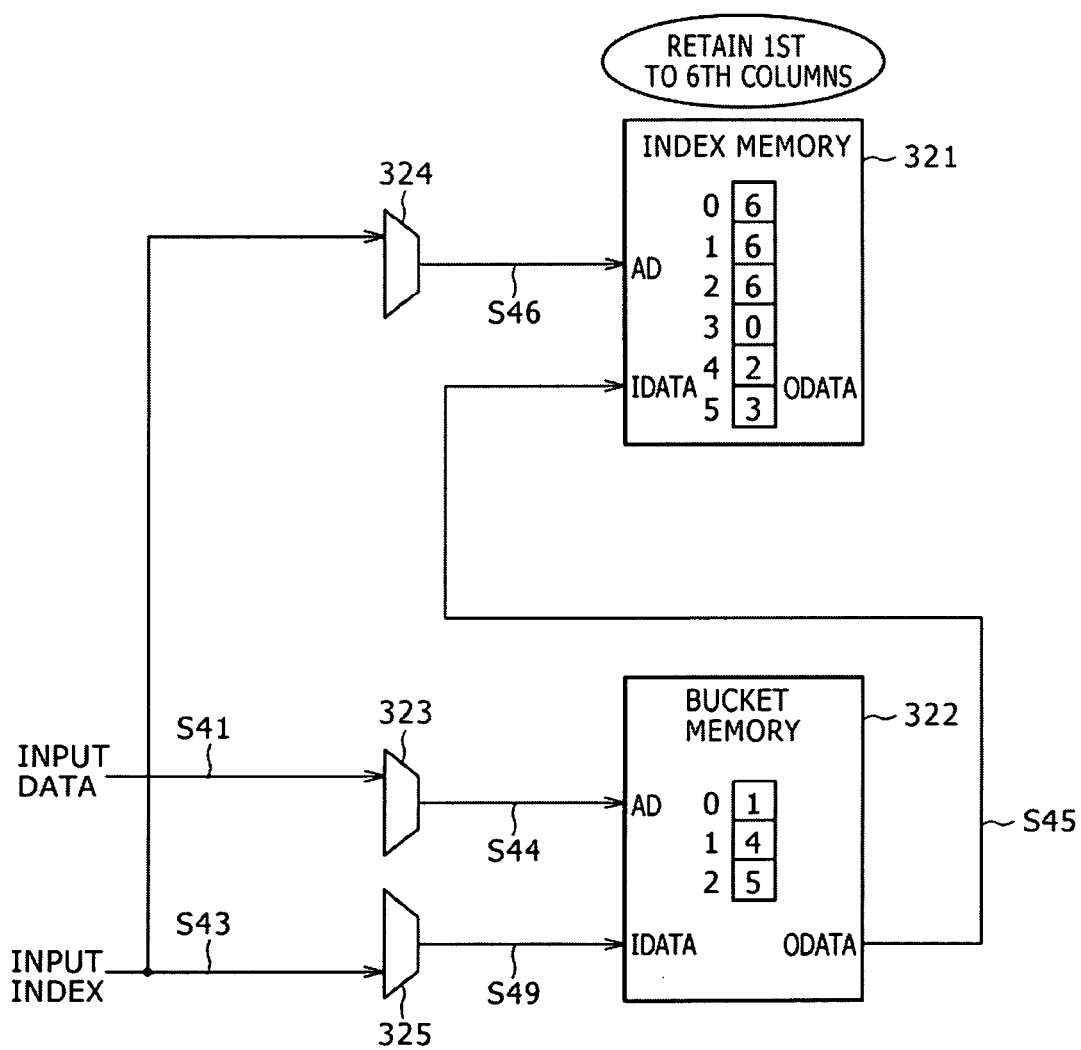
FIGS. 8 to 17 are circuit block diagrams illustrating different processes of the sorting apparatus of FIG. 7.

Further, the input index S43 is written into the bucket memory 322 using the input data S41 as the address S44. If it is assumed that the input data S41={2, 0, 1, 2, 1, 2} is inputted, then after the inputting is completed, the data sorting apparatus 32A exhibits such a state as seen in FIG. 8.

Upon outputting, the column indices are read out as seen in FIGS. 9 to 13. Also rewriting of the bucket memory 322 is performed. The outputting ends at a point of time when the three columns of an object of diagonalization are read out.

Figure 9:
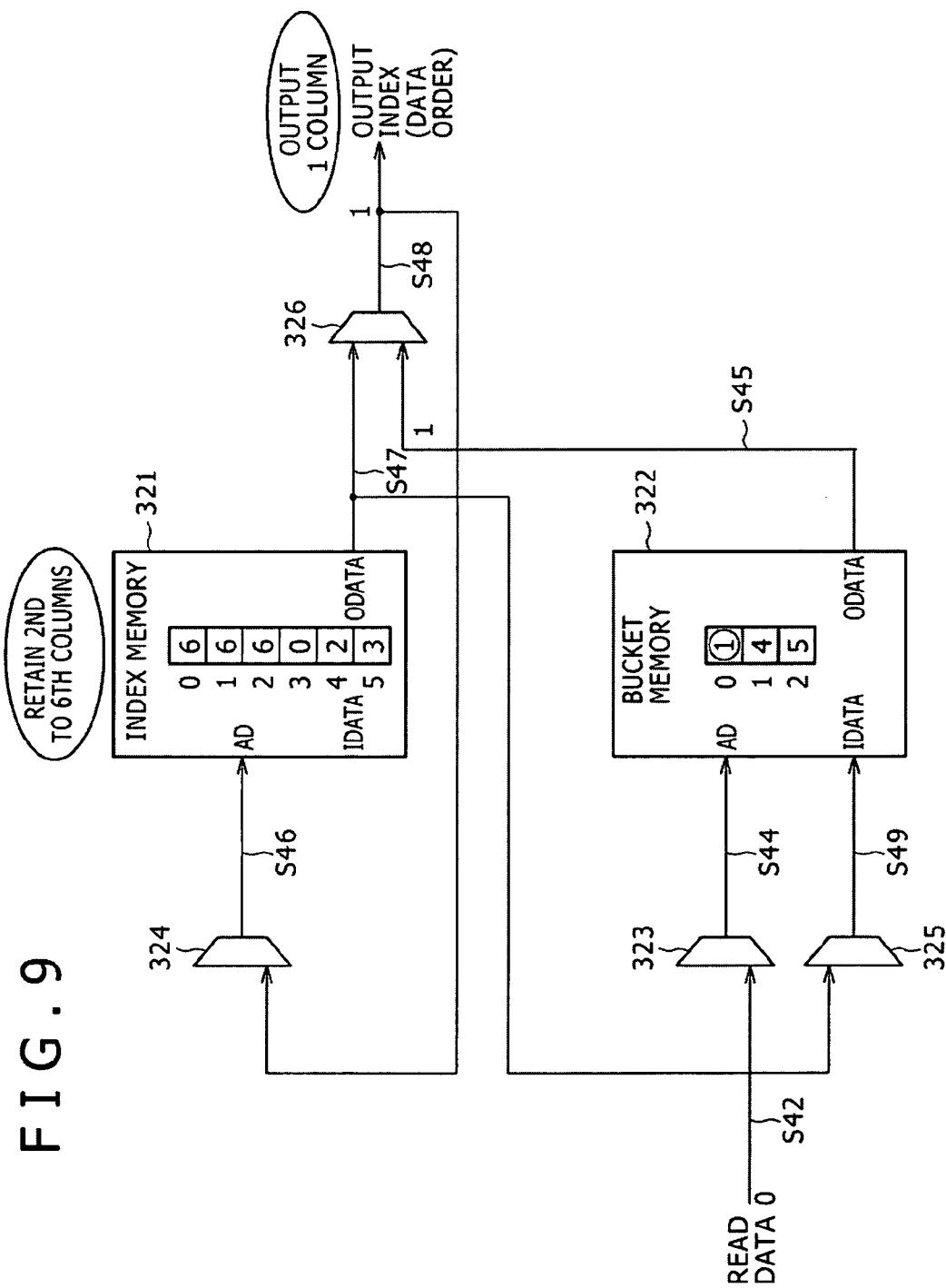

First, as seen in FIG. 9, reading out of the index of the data 0 is started. The value 1 is read out from the bucket memory 322 and outputted. Since the index is not the index 6 at which no output data exists, the reading out of the index of the data 0 is continued.

Figure 10:
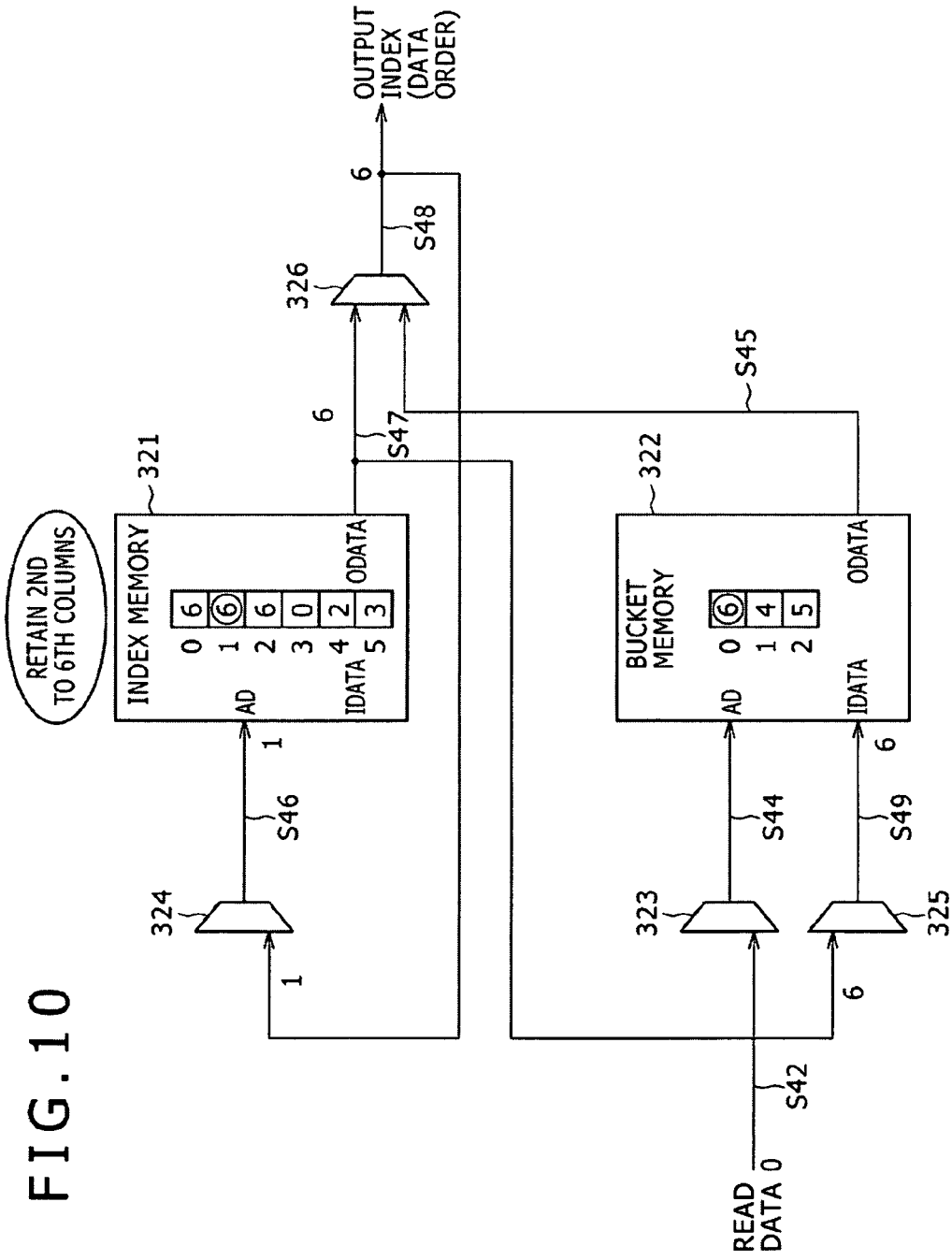

Then, as seen in FIG. 10, the value 6 is read out first from the index memory 321 using the value 1, which is the output index S48, as an address. Further, the read out value 6 is written into the address 0 of the bucket memory 322. Consequently, the index outputted already is brought out of a series of the index order. Further, since the index 6 which does not exist in the output index S48 is read out, the index of the data 1 is read out next.

Figure 11:
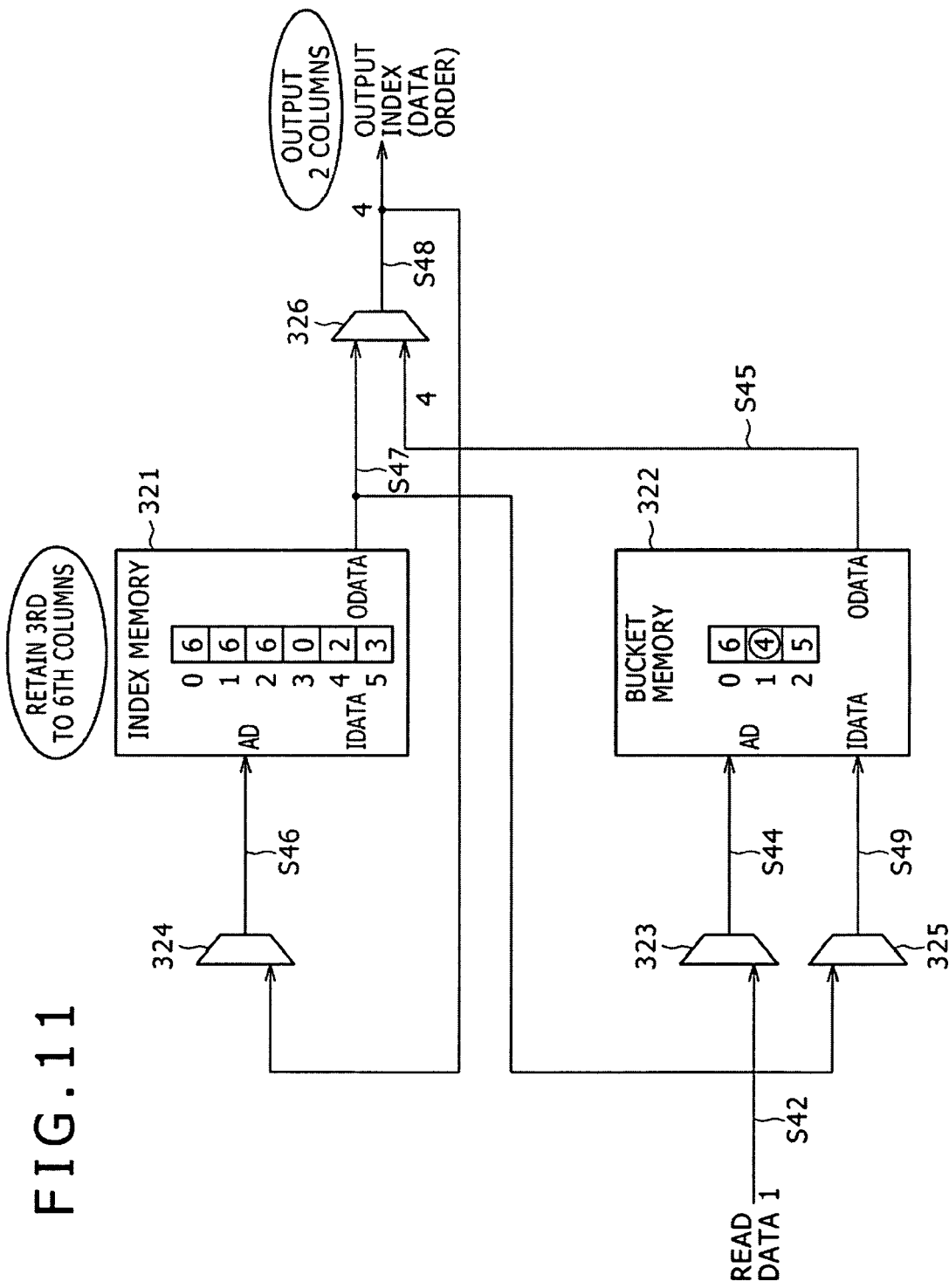

Then, the readout data 1 is designated as seen in FIG. 11. The value 4 is read out into the output index S48.

Figure 12:
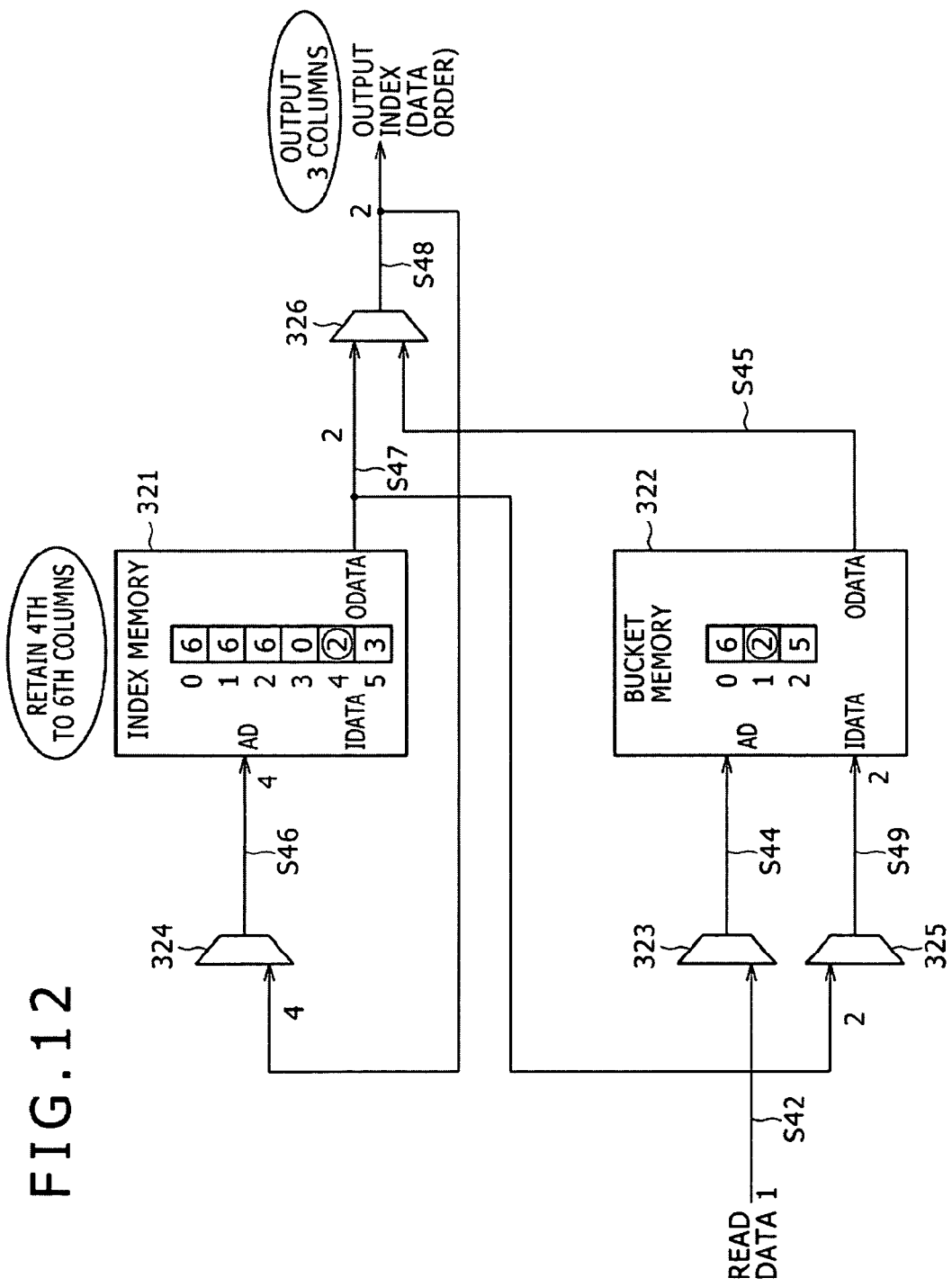

Thereafter, the value 2 is read out into the output index S48 as seen in FIG. 12. Further, the value 2 is written as the readout index S47 into the address 1 of the bucket memory 322.

Figure 13:
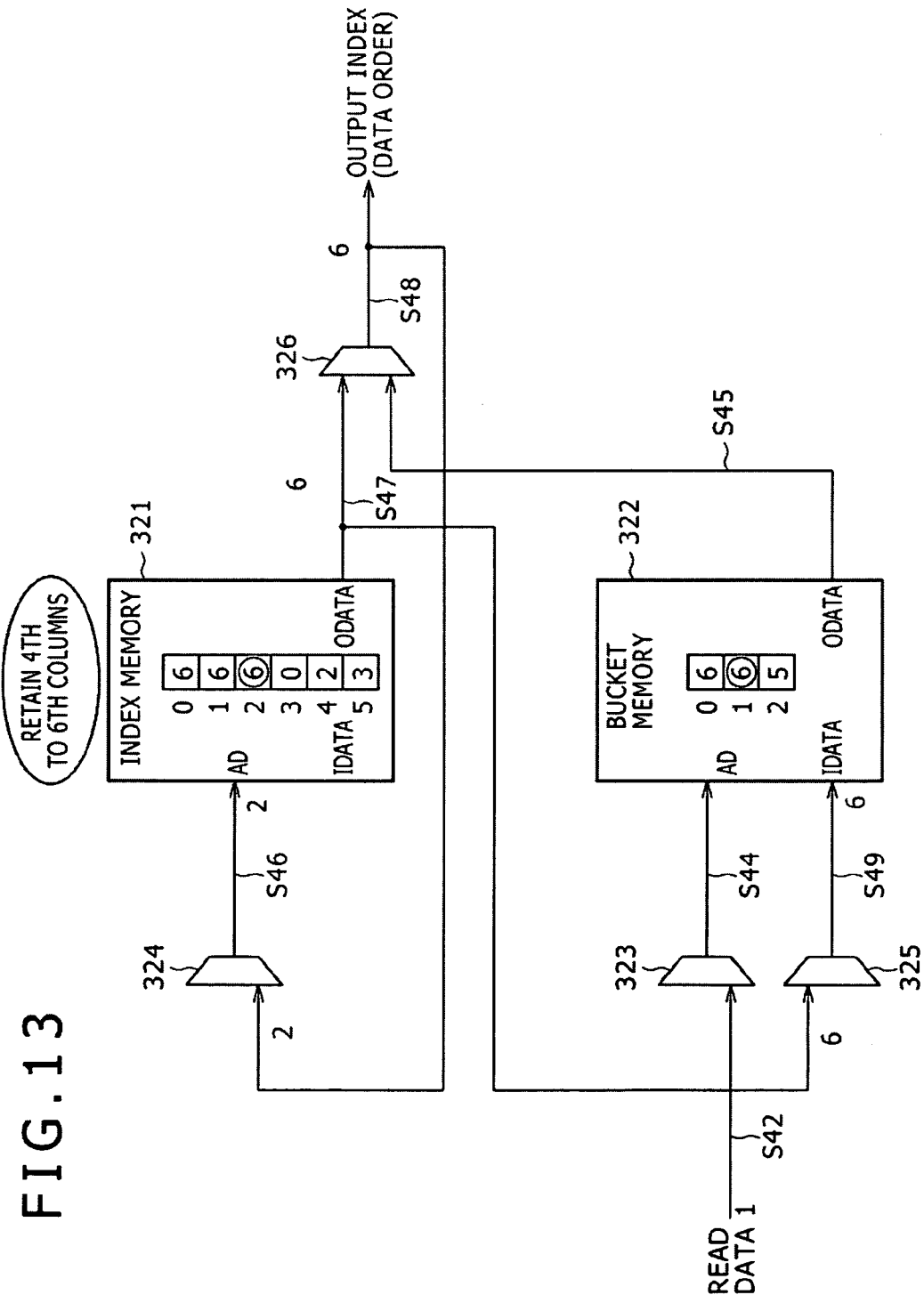

Since the three columns are read out already, although the outputting is completed at this point of time, the value "6" is finally written as the readout index S47 into the address 1 of the bucket memory 322 as seen in FIG. 13. Also the updating of information of the index order in the memory is completed thereby.

By the operations described above, the data information of the index S48={1, 4, 2} outputted to the parity check matrix diagonalization section 33 is already removed from the list of the index system in the memory.

Now, a case is considered wherein the LLR values of the outputted output index S48={1, 4, 2} are updated by belief propagation (BP) and inputted to the sorting apparatus again.

Figure 14:
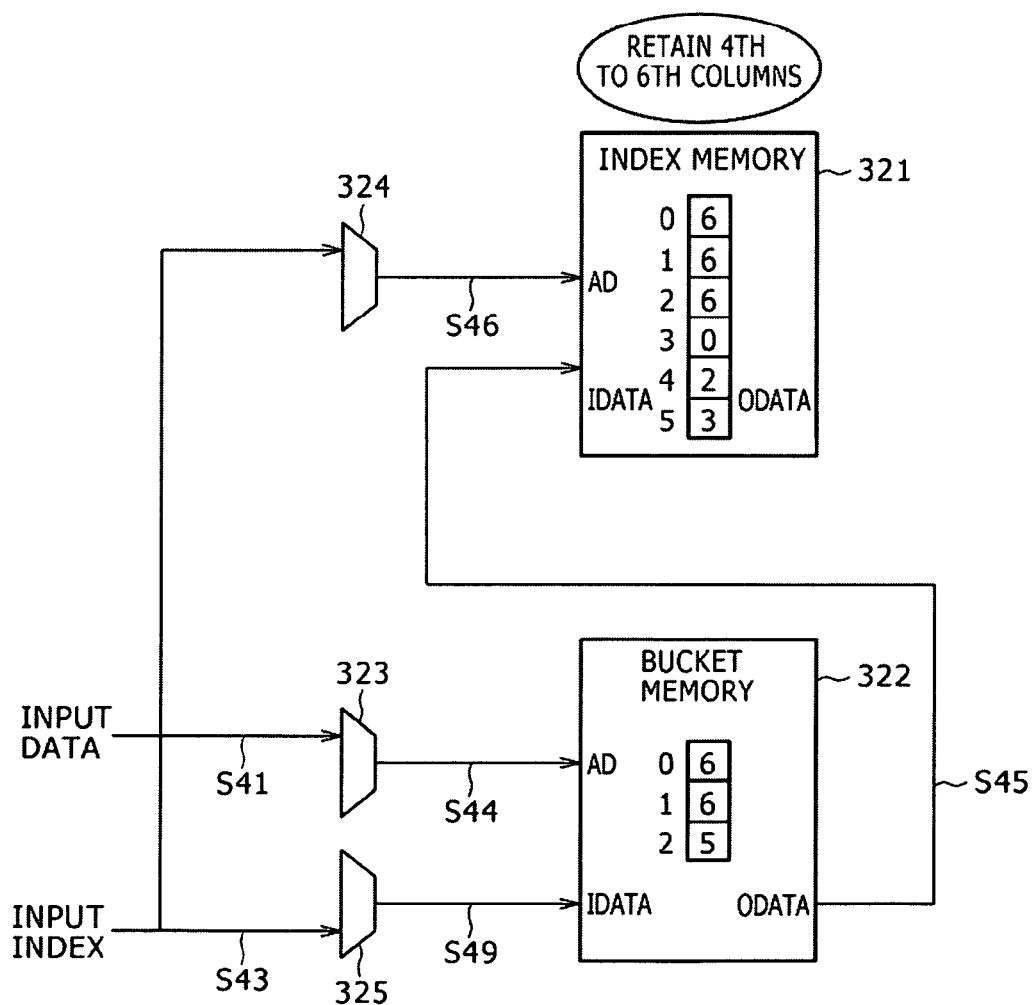
Figure 15:
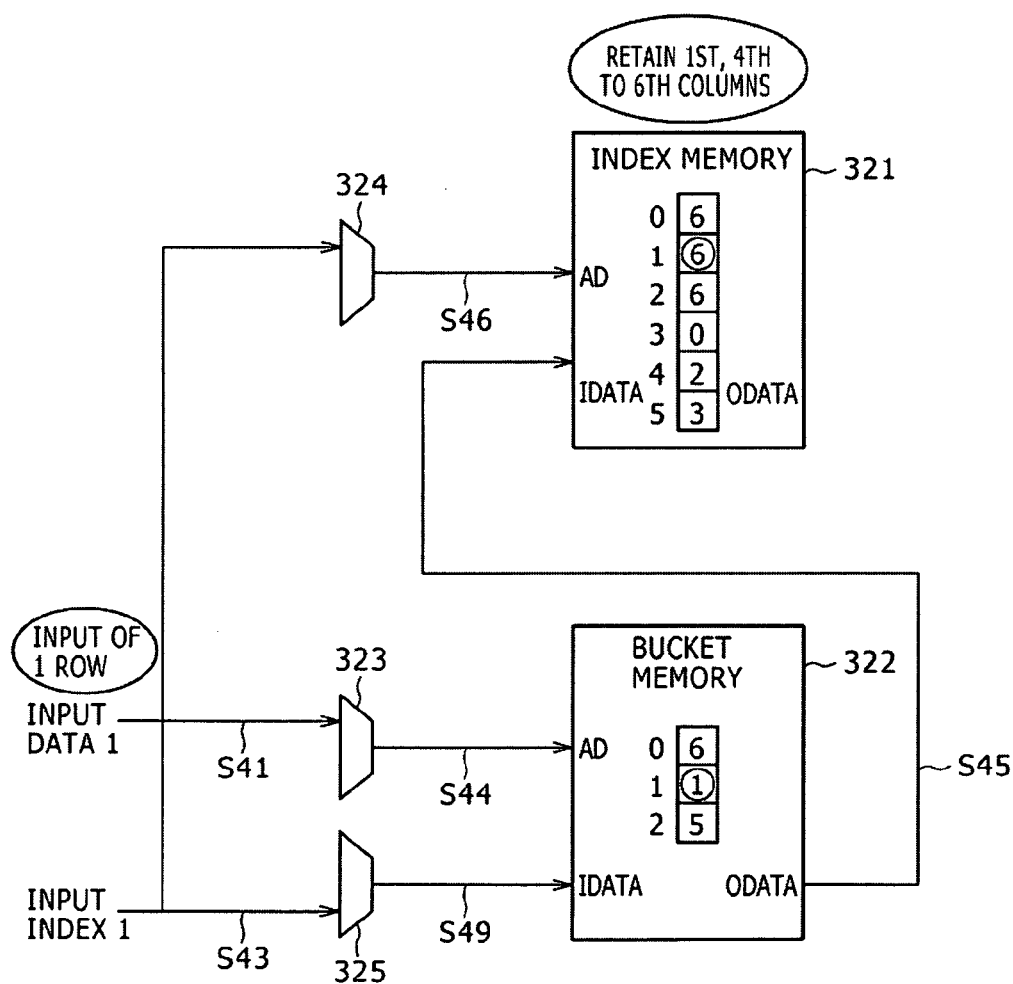

At the point of time of the second repeated inputting, the column indices stored in the memory are such as seen in FIG. 14 similarly to FIG. 13. It is assumed that, upon such second time repeated inputting, the input data S41={1, 0, 2} and the input index S43={1, 4, 2} are inputted.

When the value 1 is inputted as the input index S43 and the updated input data S41 is 1 and is inputted, the value 1 is written into the bucket memory 322 and the value 6 which is the bucket top index S45 read out from the bucket memory 322 is written into the index memory 321 using the input index S43 as an address similarly as in the ordinary writing operation.

Figure 16:
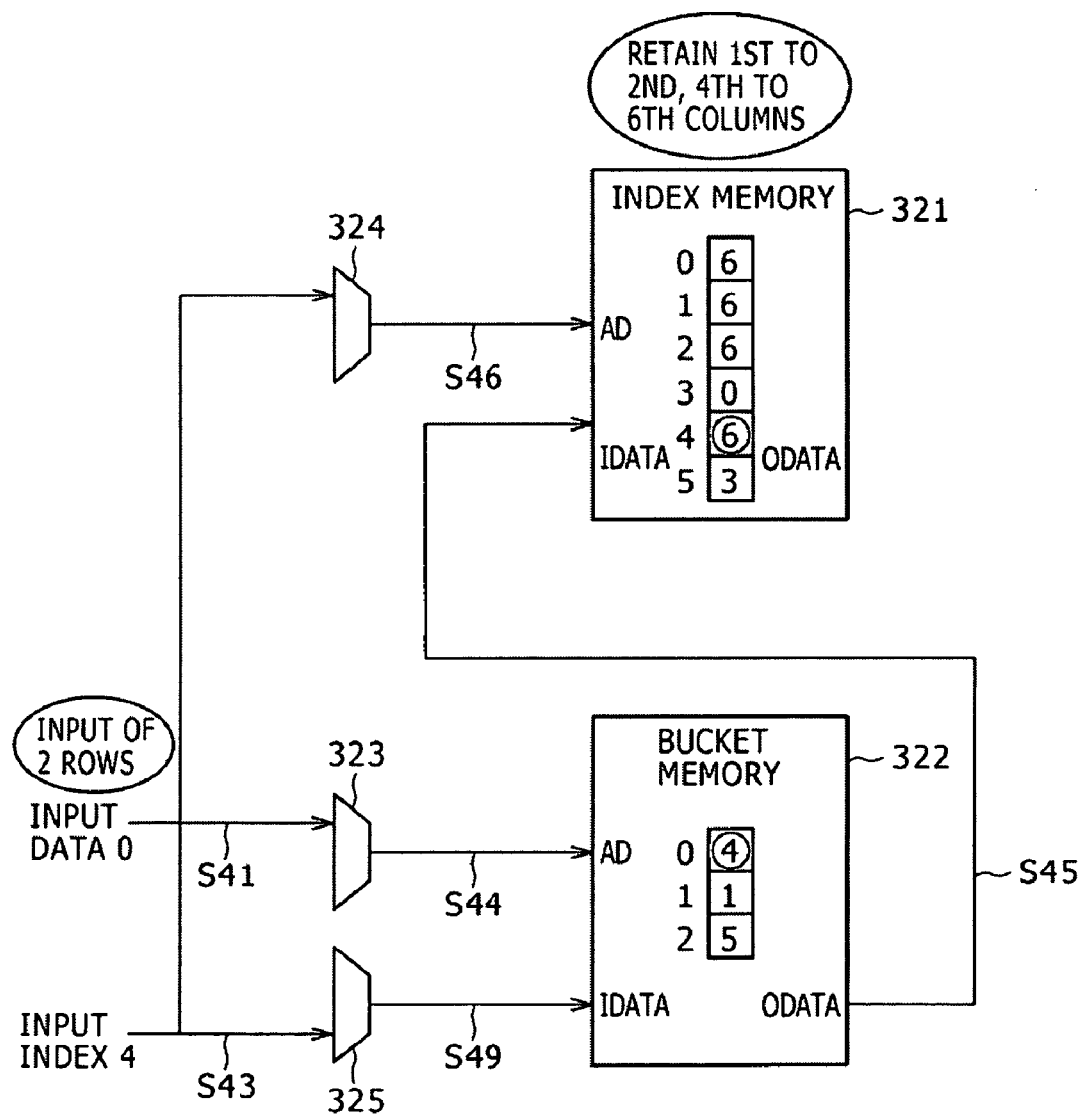
Figure 17:
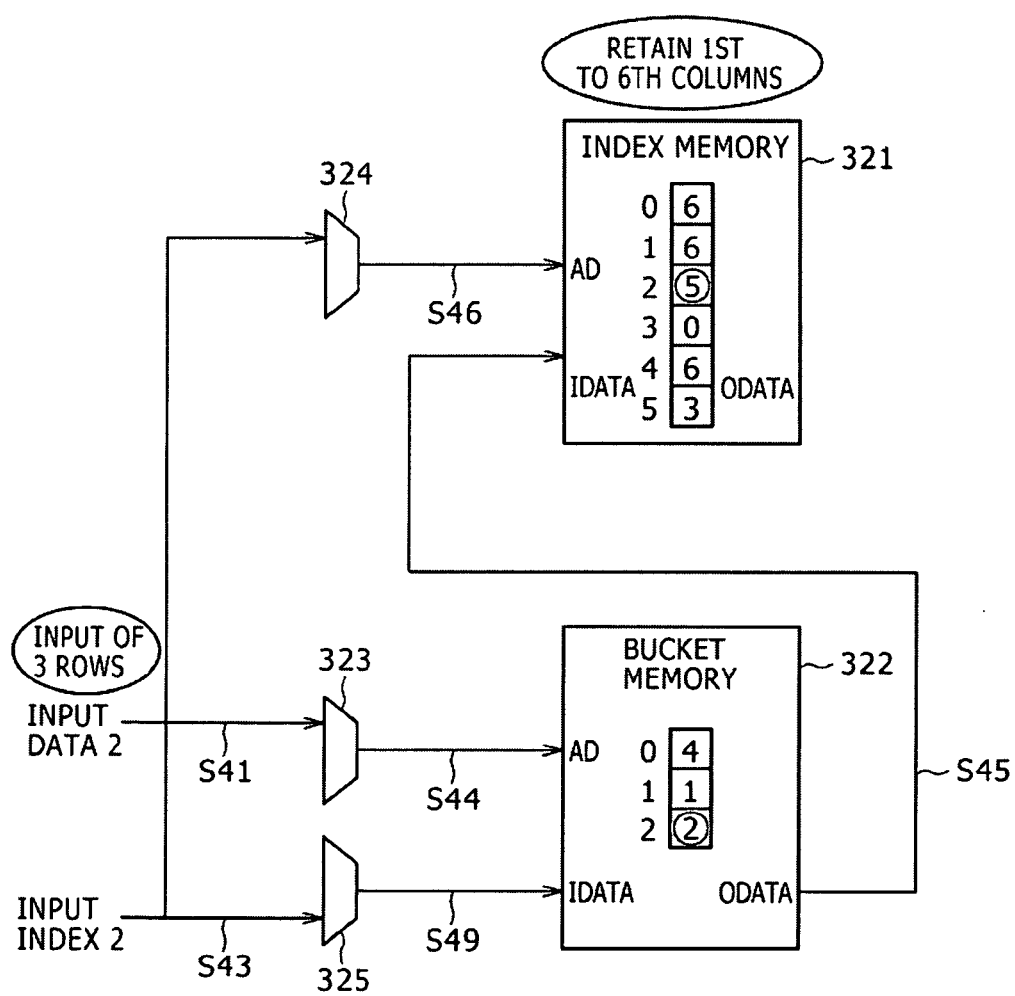

Then, as seen in FIGS. 16 and 17, similar operations are performed also with regard to the column indices 4 and 2, respectively. The inputting is completed therewith. Then, if the column indexes are read out similarly as in the normal reading out operation, then they are sorted correctly and read out in the order of the index of the data 0={4}, the index 1 of the data 1={1} and the index of the data 0={2, 5, 3, 0}.

Even if repeating progresses, if the bucket memory 322 is updated in such a manner as described above every time an index is outputted, then a case wherein only some indices whose LLR is updated are inputted can be coped with.

Sorting of data is implemented as described above.

Now, a configuration which can implement an operation frequency for implementing ABP decoding which can be applied to practical use is described.

Figure 18:
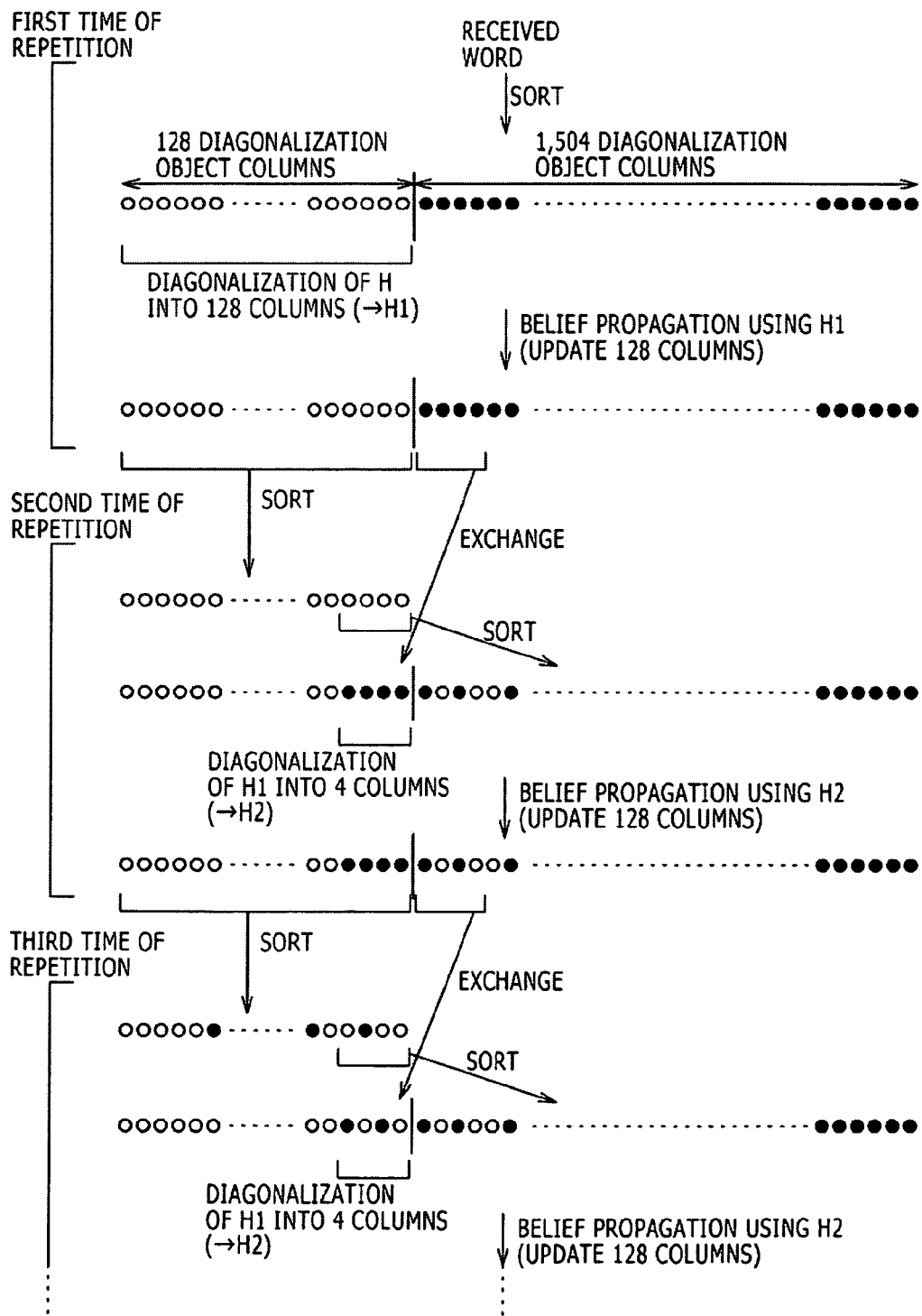
FIG. 18 is a diagrammatic view illustrating an operation flow of an ABP decoder which can operate with an operation frequency suitable for practical use.

FIG. 18 illustrates an operation flow of an ABP decoder which can operate with an operation frequency suitable for practical use.

In the present example, a dividing method between a set of columns which make an object of diagonalization in the second or later cycle of repetition and another set of columns which do not make the object of diagonalization is restricted to exchange of part of two sets in the preceding cycle of repetition. Then, only with regard to those columns which are newly placed into an object of diagonalization, diagonalization is performed for a parity check matrix updated in the preceding diagonalization.

In this instance, as seen in FIG. 18, after decoding in the first cycle of repetition is performed, upon sorting for the second time, only four columns having comparatively high reliabilities from among the 128 columns for which the reliability is updated are removed from an object of diagonalization. Then, four columns which have comparatively low reliabilities from among the remaining 1,504 columns are newly added to the set of 128 columns of the object of diagonalization.

With regard to the new four columns of the diagonalization object, diagonalization is performed for the parity check matrix after diagonalized in the preceding cycle of repetition.

At this time, pivot rows corresponding to the columns newly removed from the diagonalization object are excepted from the past pivot row list. Then, the parity check matrix is used to perform belief propagation (BP). This is repeated in the later cycles of repetition.

Based on the foregoing, the operation frequency is investigated particularly. Where a Reed-Solomon code RS(204, 188) is assumed and it is assumed that inner repeated decoding is implemented by an apparatus, necessary clock cycles for ABP decoding in conditions that the number of times of the inner repeated decoding is 10 and updating of the LLR is limited only to 128 columns of a diagonalization object and besides the belief propagation (BP) is performed once is given by the following expression:

$$T = T_1 + T_2 \times 9 \qquad \text{[Expression 18]}$$

where $T_1$ is the clock cycle number necessary for the first cycle of repetition, and $T_2$ is the clock cycle number necessary for the second or later cycle of repetition.

The necessary clock cycle number $T_1$ is given by the following expression:

$$T_1 = 5856 \qquad \text{[Expression 19]}$$

Meanwhile, the necessary clock cycle number $T_2$ is given by the following expression:

$$T_2 = T_{sort2} + T_{diag2} + T_{bp} \qquad \text{[Expression 20]}$$

where $T_{sort2}$ is the clock cycle number necessary for sorting in the second or later cycle of inner repetition, $T_{diag2}$ is the clock cycle number necessary for diagonalization, and $T_{bp}$ is the clock cycle number necessary for belief propagation (BP).

First, the clock cycle number $T_{sort2}$ is studied.

In the second and later cycles of repetition, the LLR is updated for column indexes for 128 columns. First, sorting of the 128 columns is performed. Then, a number of columns having comparatively high LLR values from among the 128 columns and a number of columns having comparatively low LLR values from among columns which are not included in an object of diagonalization in the preceding cycle of repetition are exchanged for each other. Here, it is assumed that both numbers of columns are four, and exchange between the former four columns and the latter four columns is performed.

In the example, the four columns having comparatively low LLR values from among the totaling eight columns may be re-selected, or may be exchanged compulsorily, or in other words, four columns having comparatively low LLR values from among those columns which are excepted from an object of diagonalization in the preceding cycle of repetition may be added as a new object of diagonalization.

Here, it is assumed that the compulsory exchange is used, and the clock cycle number $T_{sort2}$ is set to $T_{sort2}=0$. Further, in the diagonalization of the parity check matrix at the following stage, the parity check matrix diagonalized in the preceding cycle of repetition is utilized and basic transform is performed only for those four columns which have newly become an object of diagonalization in the present cycle. At this time, as regards the four columns newly excepted from the diagonalization object in the present cycle, corresponding pivot rows are removed from a row list of pivot columns in the past and can be made pivot rows corresponding to the four columns which have newly become the diagonalization object in the present cycle.

From the foregoing, in the present apparatus, since diagonalization is performed parallelly for four columns, the clock cycle number $T_{diag2}$ is $T_{diag2}=128$. Further, belief propagation (BP) is performed similarly as in the first cycle of repetition. In other words, the clock cycle number $T_2$ is given by the following expression:

$$T_2 = 0 + 128 + 128 = 256 \qquad \text{[Expression 21]}$$

From the foregoing, T is given by the following expression:

$$T = 5856 + 256 \times 9 = 8160 \qquad \text{[Expression 22]}$$

Here, where data of 64 Mbps is to be ABP decoded, the operation frequency is given by the following expression:

$$\frac{64 \,[\text{Mbps}]}{1632 \,[\text{bit}/codeward]} \times 8160 \,[clk] = 320 \,[\text{MHz}] \qquad \text{[Expression 23]}$$

In this manner, the operation frequency of 320 MHz is demanded, and this is a considerably realistic operation frequency.

It is to be noted that, if two ABP decoders are juxtaposed and input codewords are inputted alternately to the ABP decoders for each one codeword, then the operation frequency can be suppressed down to 320/2=160 MHz. Further, if two sorting apparatus are juxtaposed, then since only it is necessary to complete ABP decoding of a preceding input codeword in first 1,632 clock cycles after a codeword is inputted, the operation frequency can be suppressed down to 128 Mbps in the following manner:

$$\frac{8160 - 1632}{8160} \times 160 = 128 \,[\text{MHz}] \qquad \text{[Expression 24]}$$

In the following, a sorting apparatus (sorting section shown in FIG. 6) and a diagonalization apparatus (diagonalization section shown in FIG. 6) which form such a processing section as implements the operation flow of FIG. 18 are described as a second embodiment of the present invention.

Second Embodiment

Figure 19:
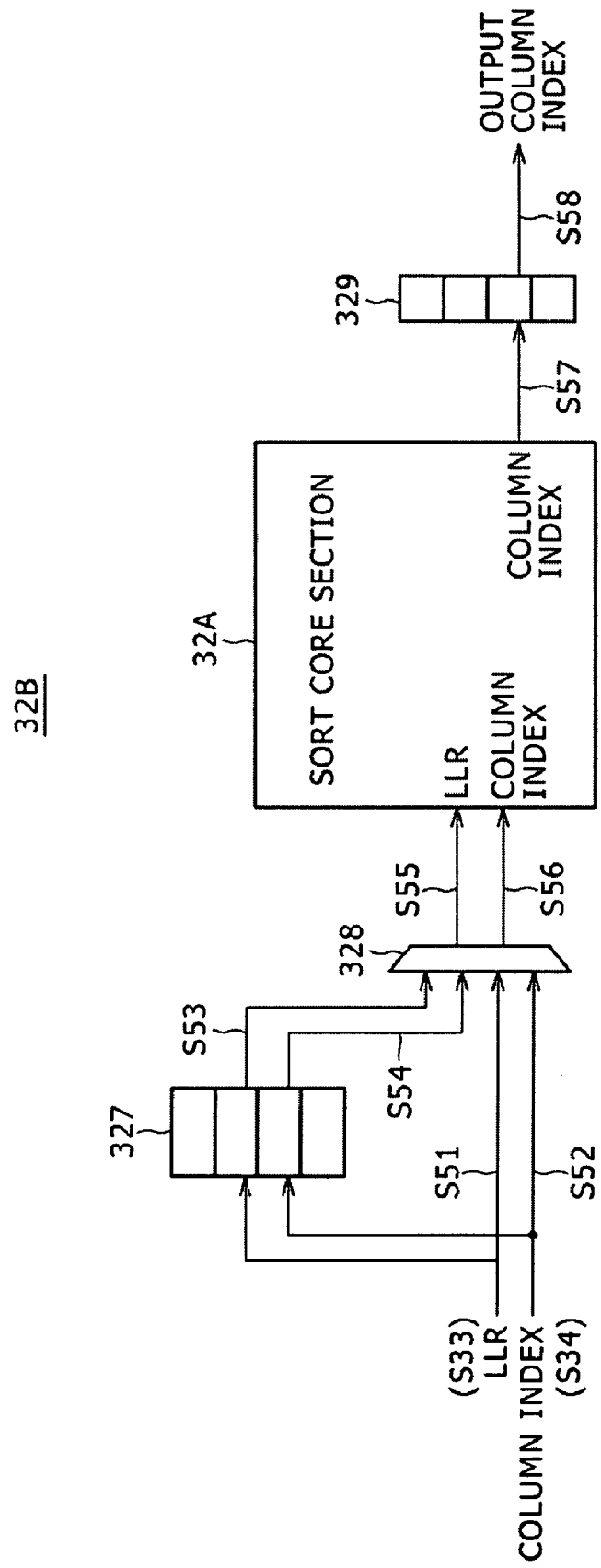
FIG. 19 is a block diagram showing an example of a configuration of a data sorting apparatus for an ABP decoder according to a second embodiment of the present invention and illustrating processing of the data sorting apparatus.

FIG. 19 shows an example of a configuration of a data sorting apparatus of an ABP decoder according to the second embodiment of the present invention.

The data sorting apparatus 32B according to the second embodiment has addresses corresponding to the size of data and includes a sorting core apparatus 32A formed from the data sorting apparatus of FIG. 7 which includes, in addition to the index memory 321 and the bucket memory 322 which serves as a buffer, the first writing and reading out address selection section 323, second writing and reading out address selection section 324, write data selection section 325 and output index selection section 326. The data sorting apparatus 32B includes, in addition to the sorting core apparatus 32A, a four-column memory 327, a sorting core input selection section 328, and a diagonalization four-column memory 329.

The four-column memory 327 retains four columns excepted from an object of diagonalization in the present cycle of repetition.

In the first cycle of repetition, the sorting core input selection section 328 selects an input LLR S51 (S31 in FIG. 6) and a column index S52 (S32 in FIG. 6). However, in the second or later cycle of repetition, the sorting core index selection section 328 selects an LLR S53 and a column index S54 of the four columns newly excepted from the object of diagonalization in the present cycle.

The diagonalization four-column memory 329 retains indexes of the fourth columns to be subsequently sent out to the diagonalization section 33 at the succeeding stage in advance.

Now, processing of the data sorting apparatus according to the second embodiment of the present invention is described with reference to FIGS. 20 to 27.

Figure 20:
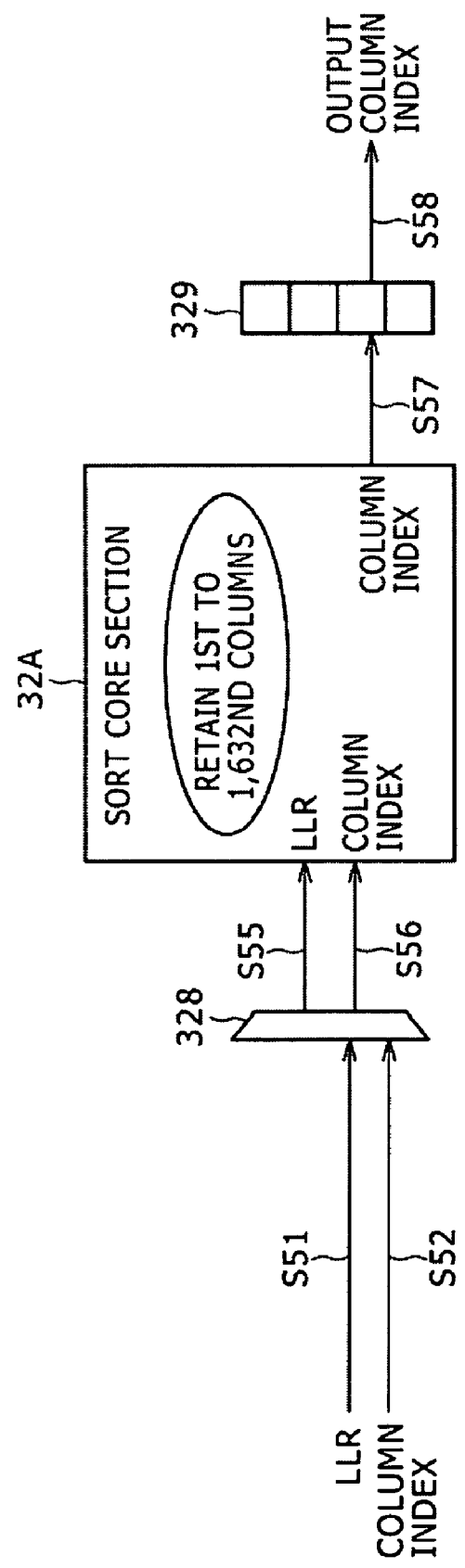
FIGS. 20 to 27 are circuit block diagrams illustrating different processes of the sorting apparatus of FIG. 19.

First, in the first cycle of repetition of decoding, 1,632 values are inputted regarding the input LLR S51 and the column index S52 as seen in FIG. 20 and sorted by the sorting core apparatus 32A.

Figure 21:
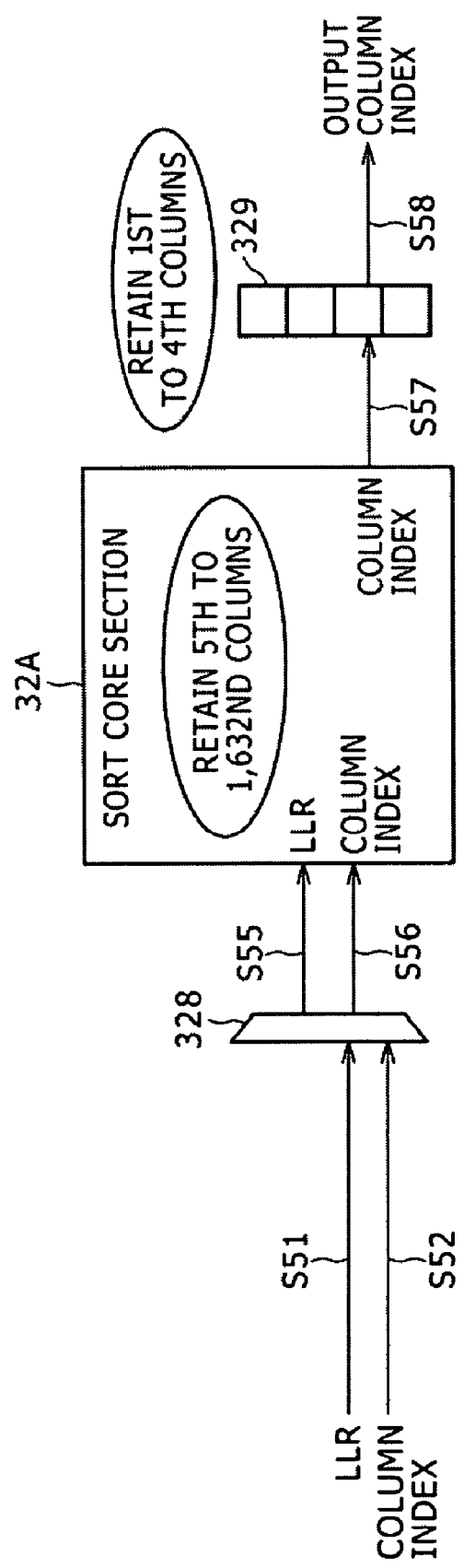
Figure 22:
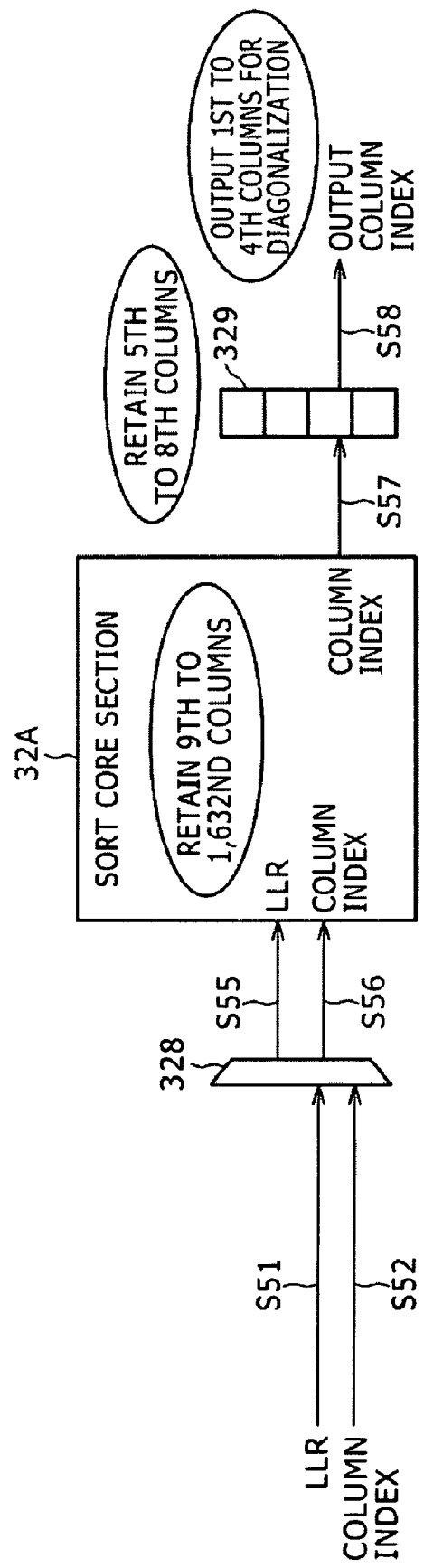
Figure 23:
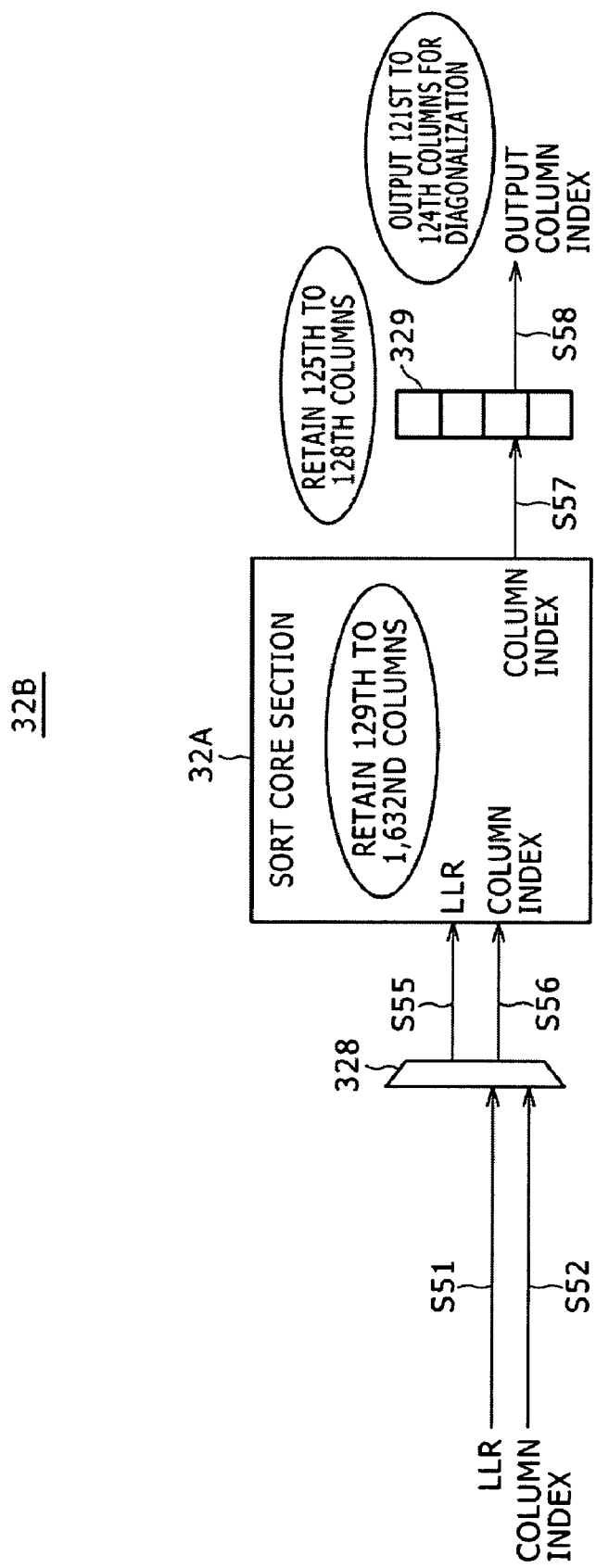
Figure 24:
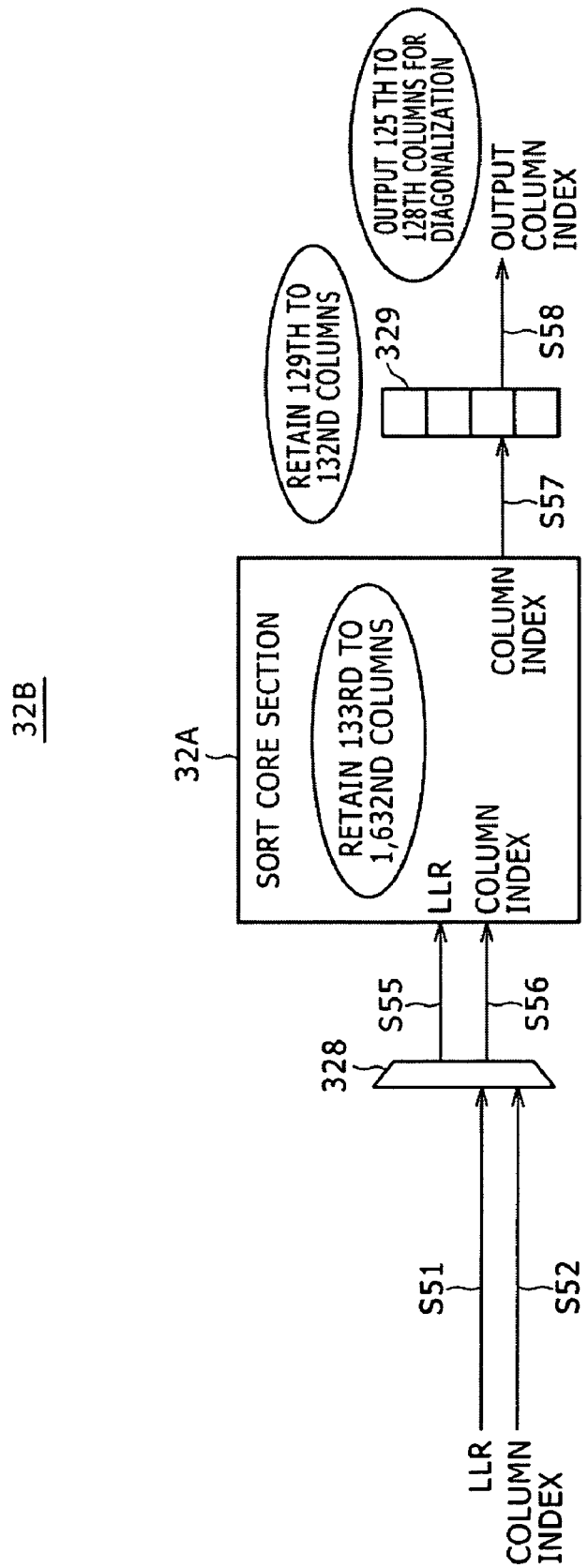

Thereafter, since it is necessary to perform diagonalization of 128 columns by means of the diagonalization section 33 at the succeeding stage, the diagonalization object columns are outputted for each four columns as seen in FIGS. 21, 22 and 23.

Further, for subsequent repetition, also the 129th to 132nd columns are retained in advance into the diagonalization four-column memory 329.

In the second cycle of repetition, indexes of the 128 columns whose LLR is updated and the updated LL values are inputted from the belief propagation (BP) section 35 to the sorting section 32 shown in FIG. 6.

Figure 25:
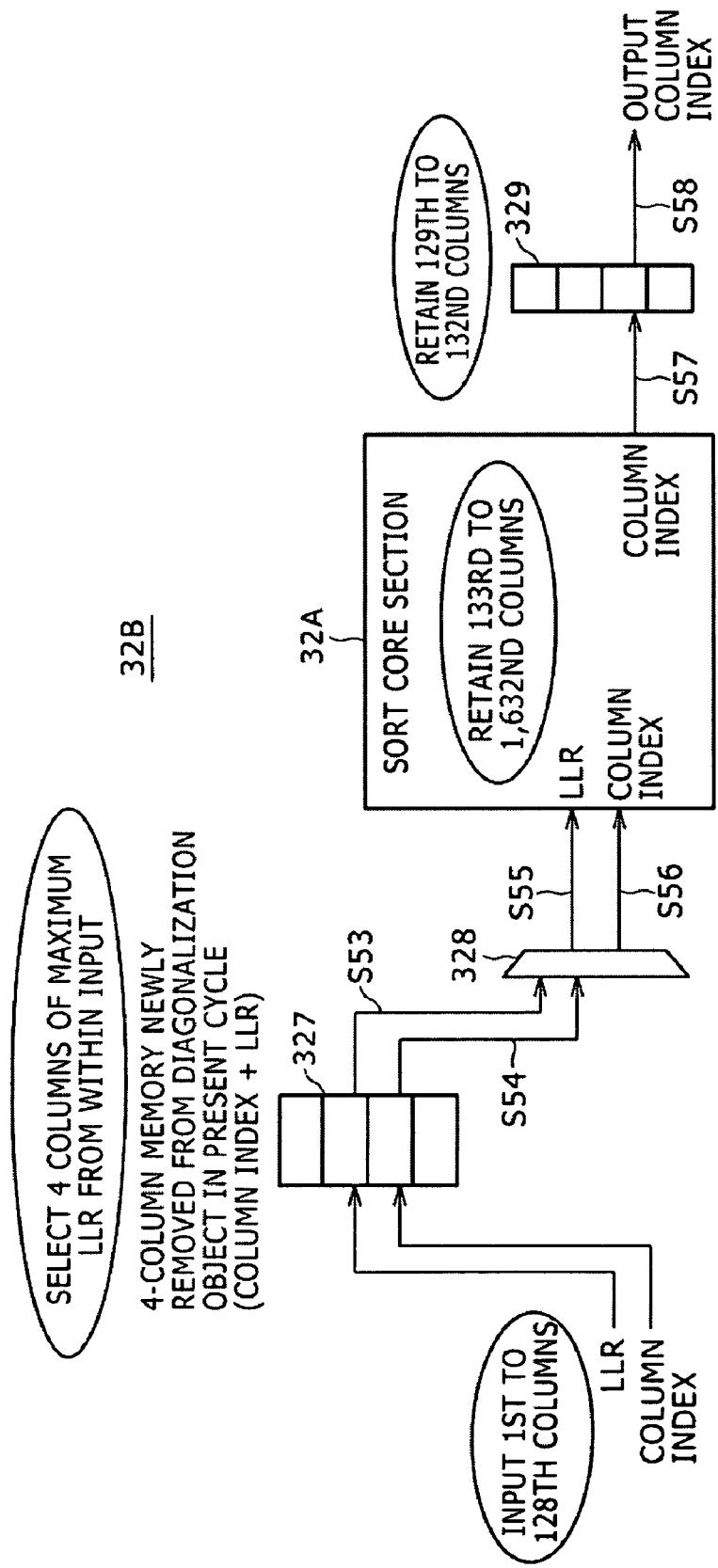
Figure 26:
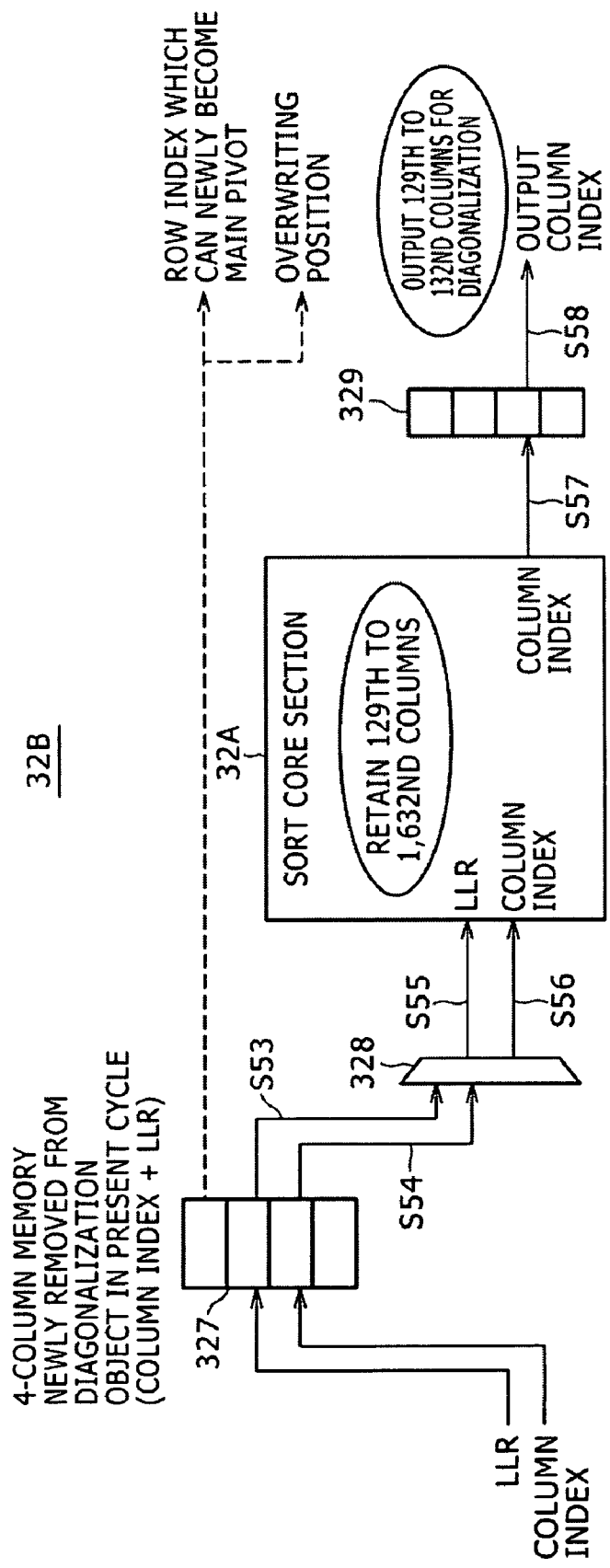

Thus, as seen in FIG. 25, the indexes of the 1st to 128th columns are inputted to the sorting section 32, and four columns to be newly removed from the diagonalization object in the present cycle are selected from among the inputted indexes. In particular, the LLR values inputted in order beginning with that of the 1st column are compared with each other, and those four columns which have the four highest absolute values of the LLR values are always retained in the four-column memory 327.

After the inputting of the 128 columns is completed, the LLR S53 and the column index S54 thereof are outputted from the four-column memory, in which the four columns newly excepted from the diagonalization object in the present cycle are retained, to the sorting core apparatus 32A. Consequently, the 1,504 columns excepted from the diagonalization object in the present cycle are re-arranged into the order of the LLR and retained into the sorting core apparatus 32A.

Further, the four columns for which diagonalization is to be performed in the present cycle are read out from the diagonalization four-column memory 329 to an output index S58.

Thereupon, in diagonalization of the parity check matrix in the diagonalization section 33, the parity check matrix diagonalized in the preceding cycle of repetition is utilized to perform basic transform only for the four columns which have newly become the diagonalization object. At this time, as regards the four columns newly excepted from the diagonalization object in the present cycle, corresponding pivot rows are removed from the list of rows which were pivot rows in the past and can become pivot columns corresponding to the four columns which have newly become the diagonalization object in the present cycle.

The pivot rows corresponding to the four rows newly excepted from the diagonalization object in the present cycle are bundled together with the column indexes and stored together into the four-column memory 327. Then, when the output index S58 is outputted, the pivot rows to be newly excepted in the present cycle may be outputted to the parity check matrix diagonalization section 33 at the succeeding stage.

Further, also what numbered data from among the 128 columns are excepted from the diagonalization circuit may be outputted as overwriting positions to the diagonalization circuit at the succeeding stage.

Figure 27:
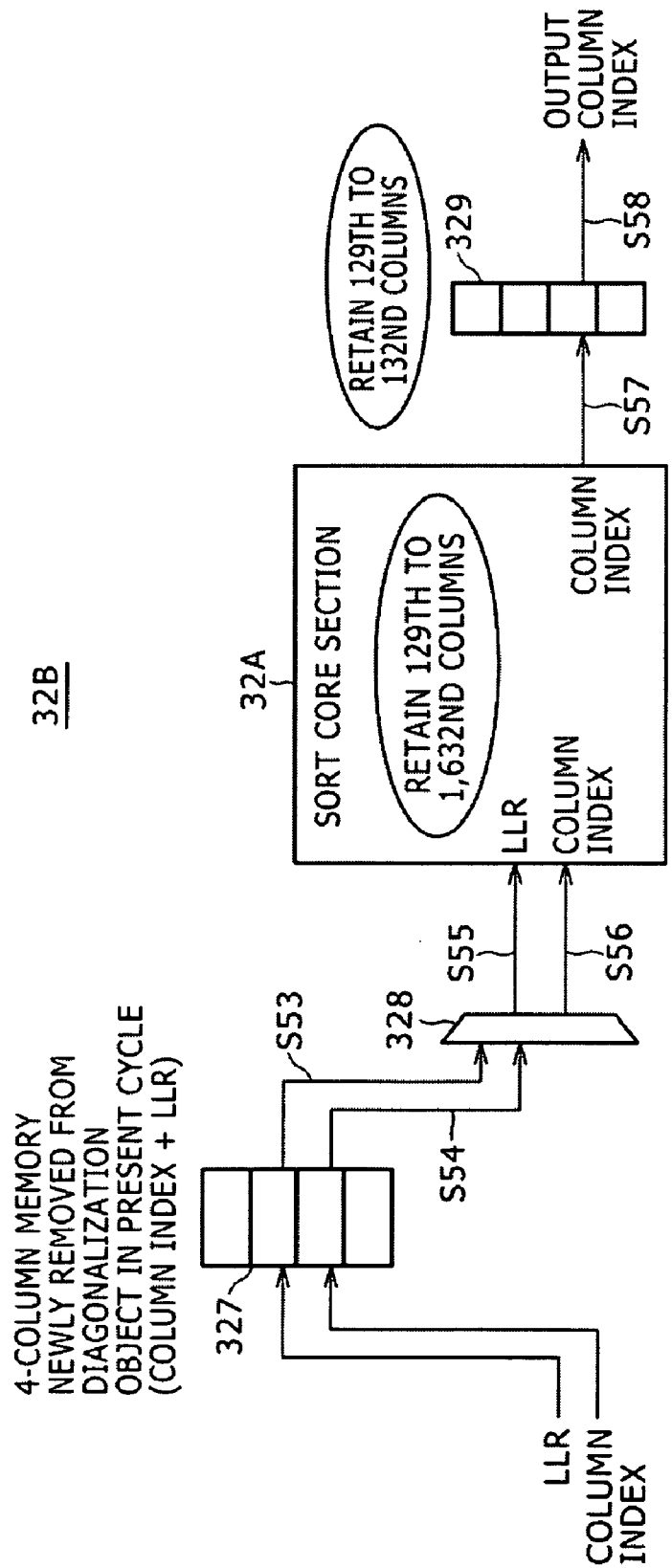

Further, as seen in FIG. 27, for the next cycle of repetition, the 123rd to 132nd columns are outputted to and retained into the diagonalization four-column memory 329 in advance.

Here, an example of a flow of diagonalizing only those columns which have newly become the diagonalization object is described using matrixes.

In this instance, for simplified description, an example is studied wherein diagonalization is performed for the first, second, third and fourth columns is performed first in the first cycle of repetition and then, in the second cycle of repetition, diagonalization performed for the fifth and sixth columns.

At this time, if the two columns to be newly excepted from the diagonalization object are the second and third columns, then since the corresponding pivot rows are the third and fourth columns, the third and fourth rows can newly become pivot columns.

$$H = \begin{pmatrix} 0 & 0 & 0 & 1 & 1 & 1 \\ 1 & 1 & 1 & 0 & 1 & 1 \\ 1 & 0 & 0 & 1 & 0 & 1 \\ 0 & 0 & 1 & 1 & 0 & 1 \end{pmatrix} \quad \text{[Expression 25]}$$

If the matrix H is diagonalized with regard to the first, second, third and fourth columns, then the following parity check matrix $H_{new}$ is obtained:

$$H_{new} = \begin{pmatrix} 0 & 0 & 0 & ① & 1 & 1 \\ ① & 0 & 0 & 0 & 1 & 0 \\ 0 & ① & 0 & 0 & 1 & 1 \\ 0 & 0 & ① & 0 & 0 & 1 \end{pmatrix} \quad \text{[Expression 26]}$$

In the second cycle, the third and fourth columns are newly excepted from the diagonalization object, and the fifth and sixth columns newly become the diagonalization object. At this time, the third and fourth columns which originally are pivot rows to the second and third columns can newly become pivot rows.

First, the fifth column is subjected to basic transform in the following manner:

$$H_{new2} = \begin{pmatrix} 0 & 1 & 0 & ① & 0 & 0 \\ ① & 1 & 0 & 0 & 0 & 1 \\ 0 & 1 & 0 & 0 & ① & 1 \\ 0 & 0 & 1 & 0 & 0 & 1 \end{pmatrix} \quad \text{[Expression 27]}$$

Then, the sixth column is basically transformed in the following manner:

$$H_{new3} = \begin{pmatrix} 0 & 1 & 0 & ① & 0 & 0 \\ ① & 1 & 1 & 0 & 0 & 0 \\ 0 & 1 & 1 & 0 & ① & 0 \\ 0 & 0 & 1 & 0 & 0 & ① \end{pmatrix} \quad \text{[Expression 28]}$$

The diagonalization of the fifth and sixth columns is newly completed therewith.

The diagonalization section 33 of the ABP decoder 30 repeats, after it performs diagonalization of the matrix, outputting of the diagonalization object columns and corresponding pivot rows for belief propagation by the belief propagation (BP) section 35 at the succeeding stage.

In the following, an example of a particular configuration and operation of the diagonalization section according to the second embodiment is described with reference to FIGS. 28 to 40.

FIGS. 28 to 40 show a particular configuration and operation of the diagonalization section in the second and later cycles of repletion.

FIGS. 28 to 36 illustrate a diagonalization phase of a parity check matrix, and FIGS. 37 to 40 illustrate a phase wherein diagonalization object columns and corresponding pivot rows for belief propagation (BP) are outputted.

Figure 28:
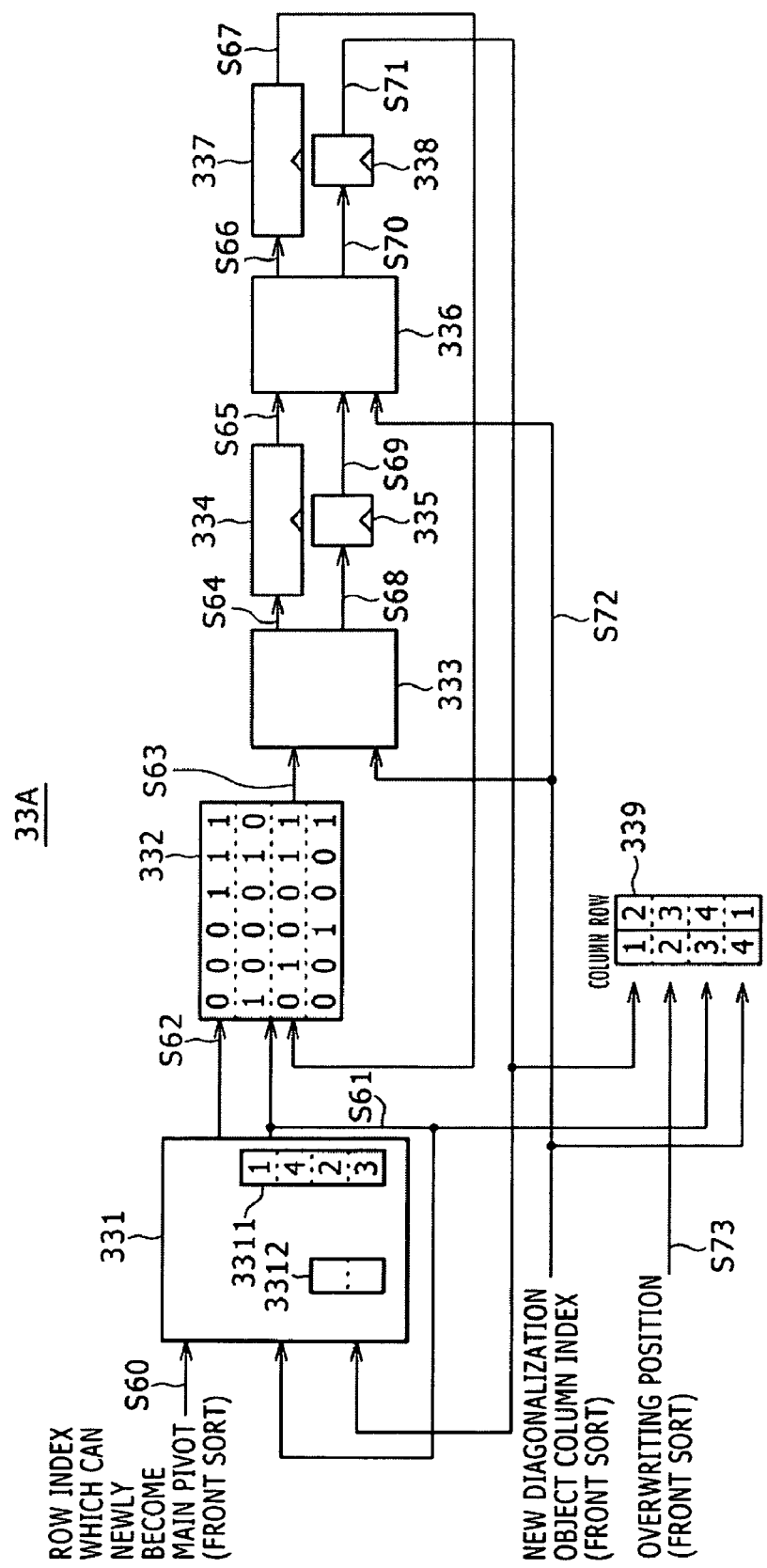
FIG. 28 is a block diagram showing an example of a configuration of a diagonalization section according to the second embodiment of the present invention and illustrating processing of the diagonalization section.

Referring to FIG. 28, the diagonalization section 33A includes a row index memory 331 for storing indexes of rows, a matrix memory 332 for storing a matrix, a first pivot search and sweeping out circuit 333, a first row retaining section 334, and a first pivot flag retaining section 335. The diagonalization section 33A further includes a second pivot search and sweeping out circuit 336, a second row retaining section 337, a second pivot flag retaining section 338 and a pivot column and row index memory 339.

In the reading out order of parity check rows to be sent to the pivot search and sweeping out circuit 333 or 336 in the diagonalization section 33A, it is necessary to preferentially read out those rows which have not been a pivot in the past. In other words, in diagonalization in the second or later cycle of repetition, those rows which can newly become a pivot are preferentially read out. Further, the parity check matrix diagonalization section 33 performs diagonalization of a plurality of columns by one row reading out operation.

As seen in FIG. 28, the diagonalization section 33A includes the row index memory 331, matrix memory 332, and pivot search and sweeping out circuits 333 and 336.

The pivot column and row index memory 339 retains diagonalization object columns and corresponding pivot row indexes.

After diagonalization of the first, second, third and fourth columns of the matrix H is performed, a diagonalized matrix is retained in the matrix memory 332 and row indexes are retained in the row index memory 331.

A list of the indexes of a readout row index retaining section 3311 of the row index memory 331 has become such a state as seen in FIG. 28 because indexes of rows, which have made a pivot by the first pivot search and sweeping out circuit 333 or 336, are written next to the address and the indexes of the other rows are written into the indexes in order beginning with the top address.

Further, the diagonalization object columns and corresponding pivot row indexes are retained in the pivot column and row index memory 339.

Now, a case is considered wherein a row index S60 which can newly become a pivot in the second cycle of repetition and a new diagonalization column index S72 are inputted. In the present cycle, a case is considered wherein the second and third columns are excepted from the diagonalization object and hence corresponding third and fourth rows can newly become a pivot while the fifth and sixth columns newly become the diagonalization object.

In particular, a row index S60={2, 4} which can newly become a pivot row, a new diagonalization column index S72={5, 6} and an overwriting position S73={2, 3} are inputted as input values. The overwriting position represents into which address of the pivot column and row index memory 339 the new diagonalization object columns and corresponding pivot rows should be written.

Figure 29:
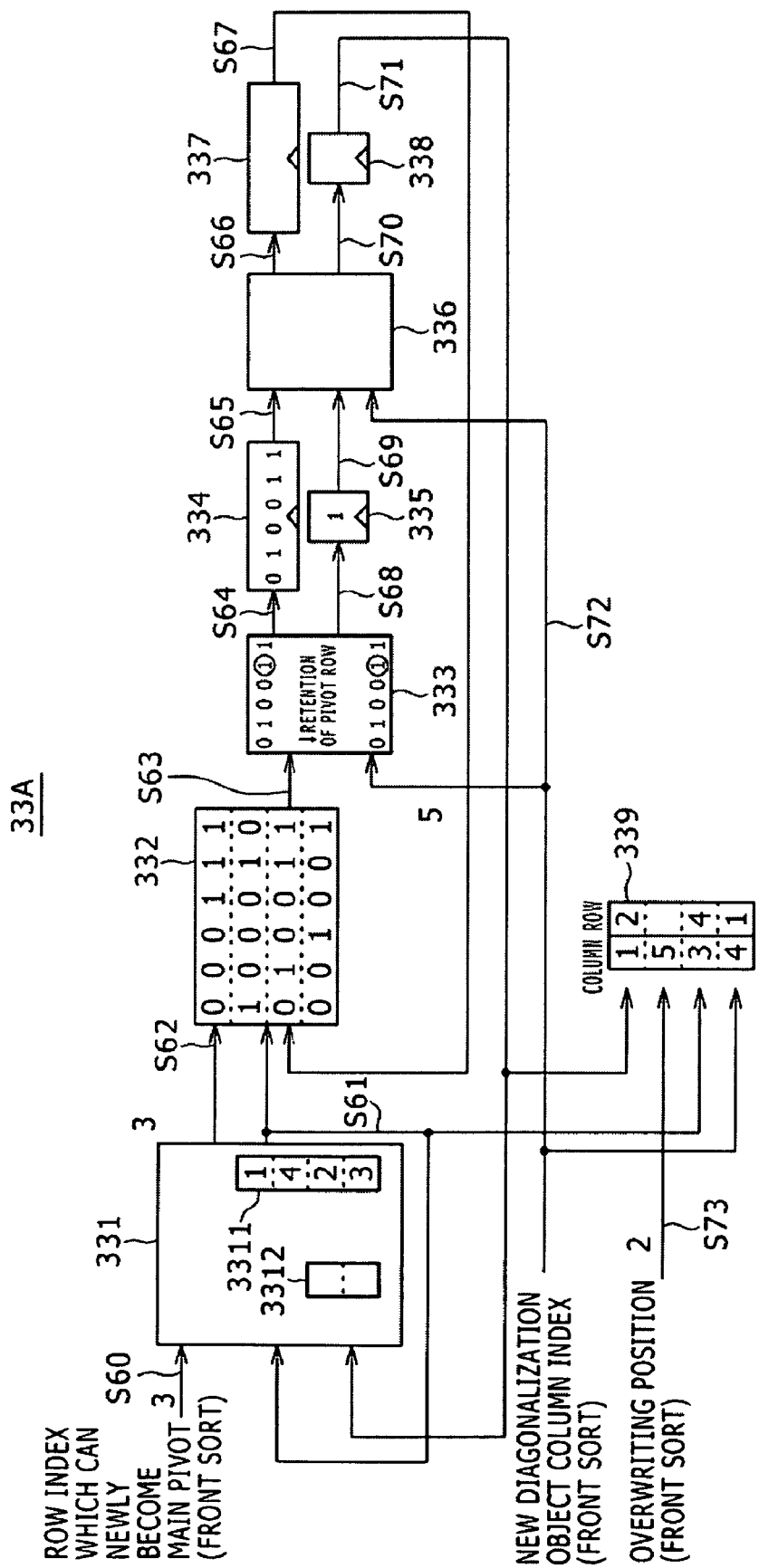
FIGS. 29 to 40 are circuit block diagrams illustrating different processes of the diagonalization section of FIG. 28.
Figure 30:
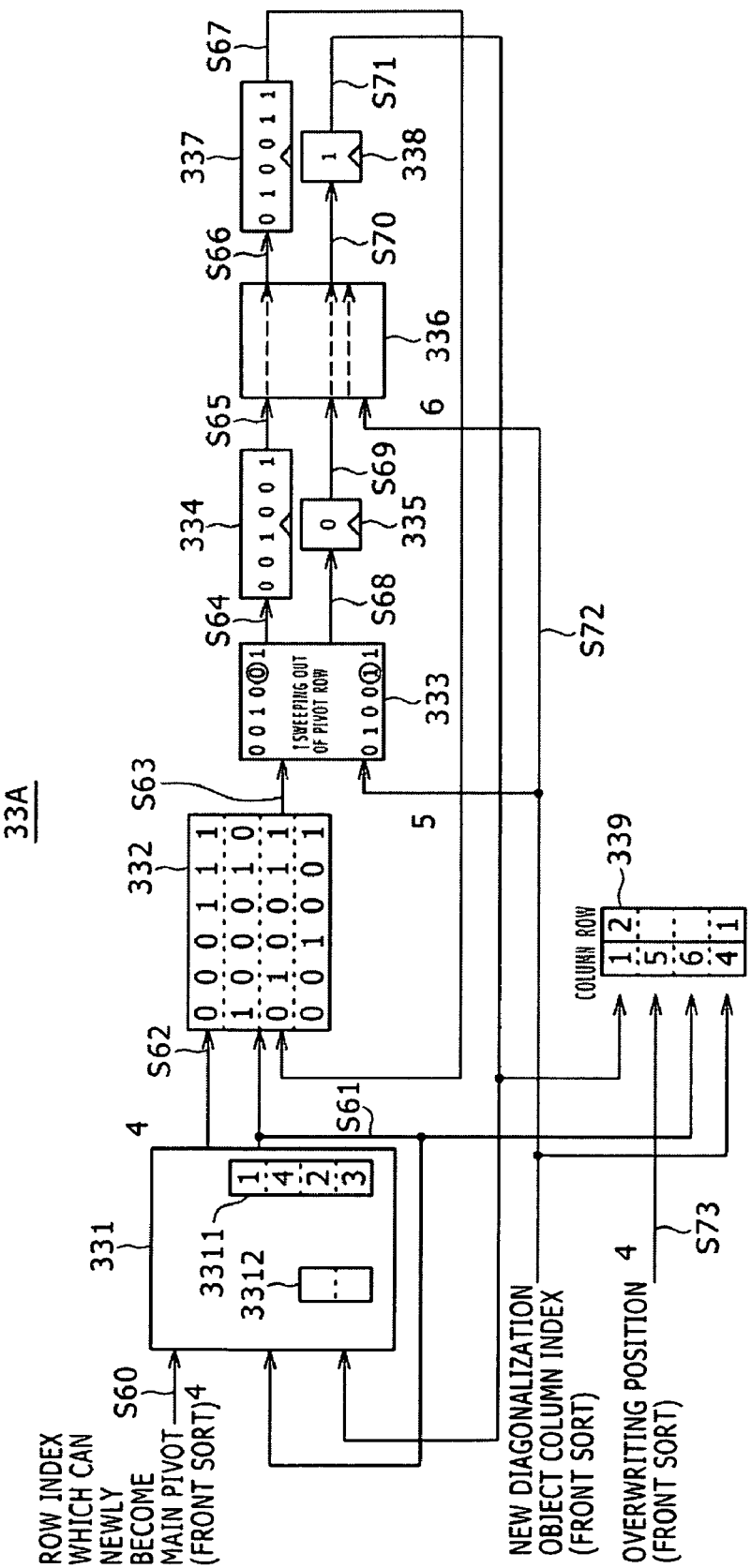

As seen in FIG. 29, the value 2 is inputted as the overwriting position S73. Consequently, the pivot column of the address 2 of the pivot column and row index memory 339 is overwritten if a new diagonalization object column index 5 is inputted.

Further, the diagonalization object column index 5 is set to the first pivot search and sweeping out circuit 333. If the value 3 which is the row index S60 which newly becomes a pivot is inputted, then this is read into the matrix memory 332 and a parity check matrix fourth row S63 is outputted.

The parity check row S63 is sent to the first pivot search and sweeping out circuit 333, by which, if the object column is not zero, then the row is retained into the inside of the first pivot search and sweeping out circuit 333, and after a pivot is found, sweeping out to the row to be inputted is performed. Similar operation is performed also in the second pivot search and sweeping out circuit 336.

Also in the processing illustrated in FIGS. 31 to 36, similar pivot search-sweeping out operation is performed.

Figure 31:
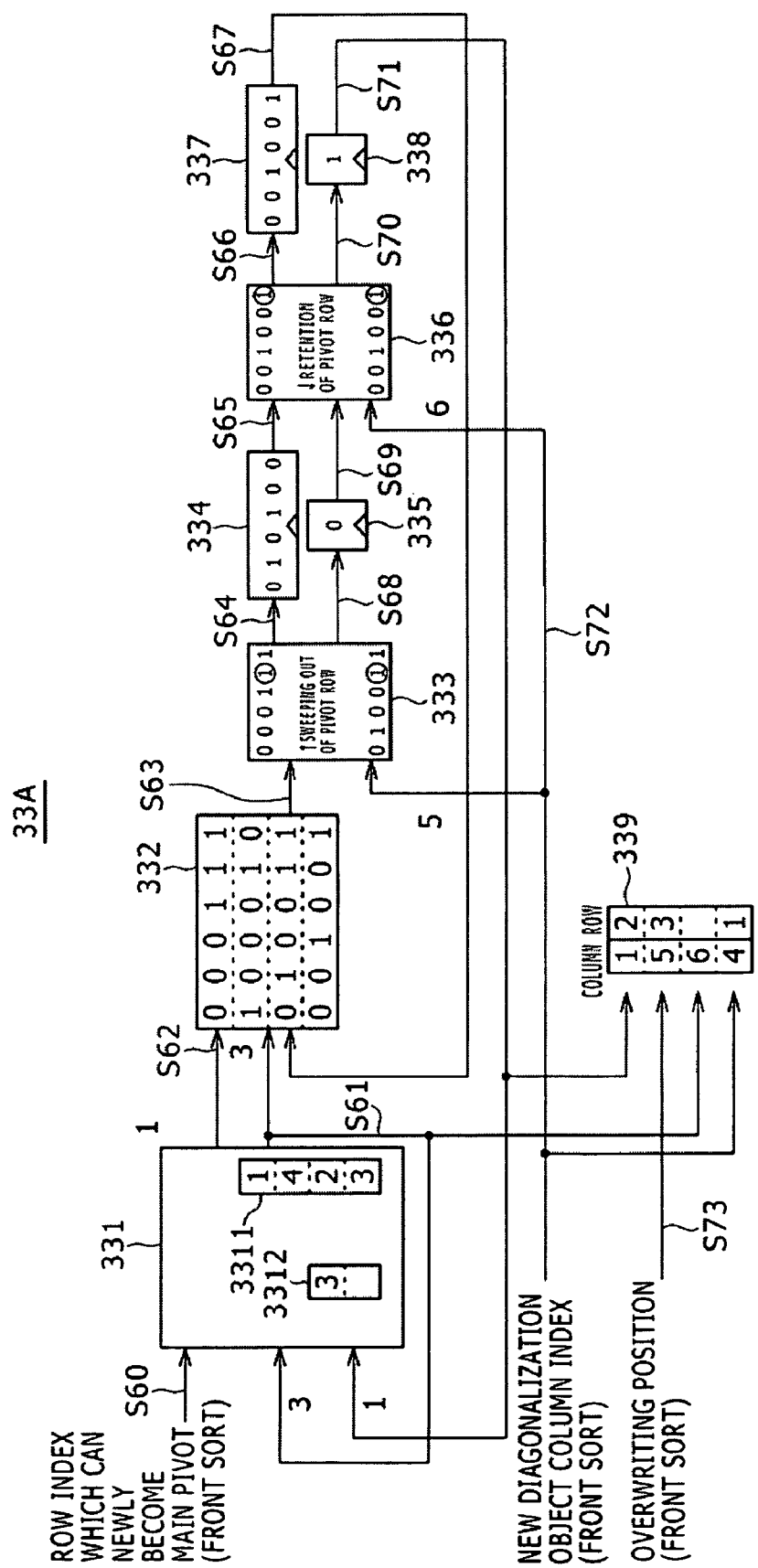

In addition, as seen in FIG. 31, since the write row index 3 and the pivot flag 1 arrive as a pivot row of the fifth column in the present cycle, the pivot row 3 is written corresponding to the pivot column into the pivot column and row index memory 339.

Figure 32:
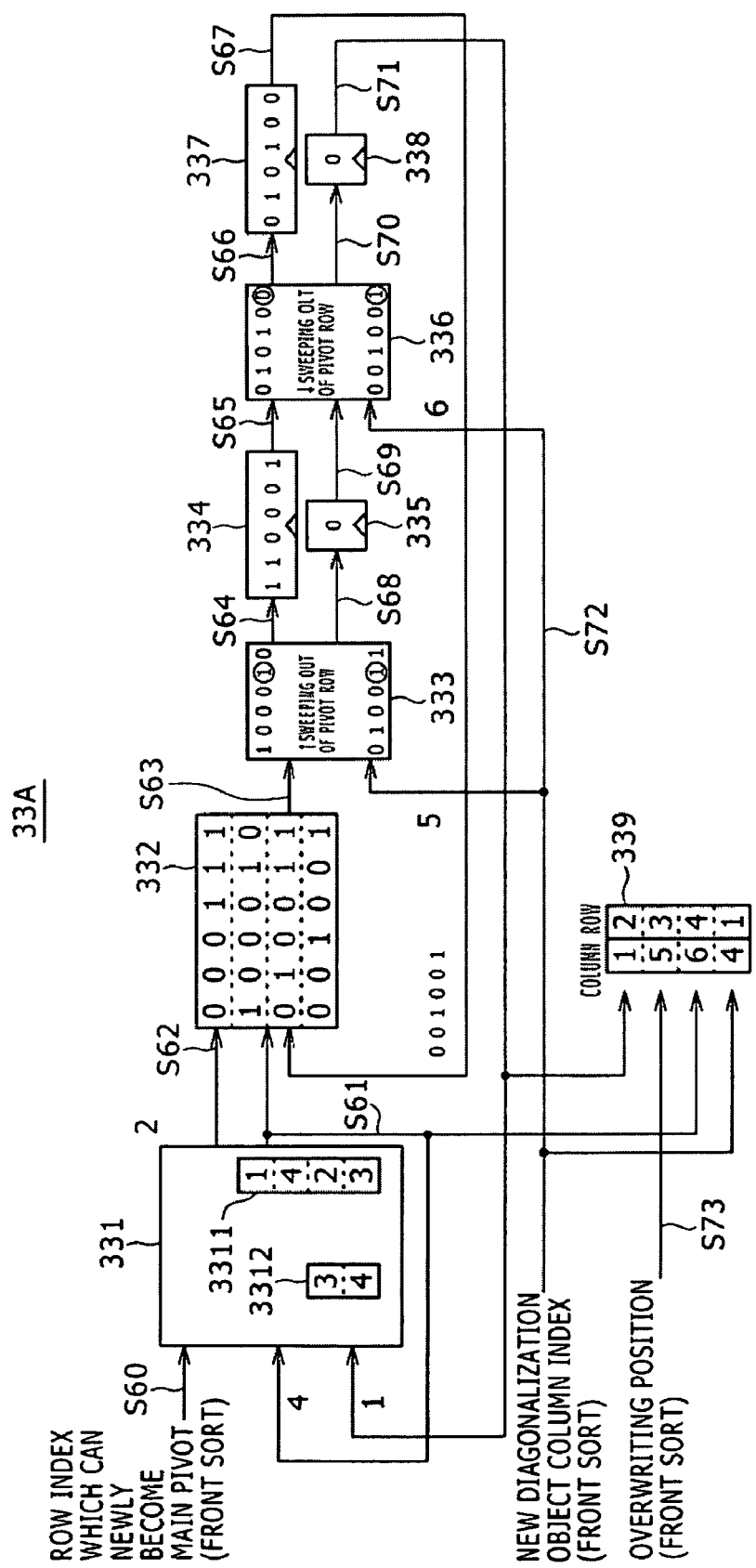
Figure 33:
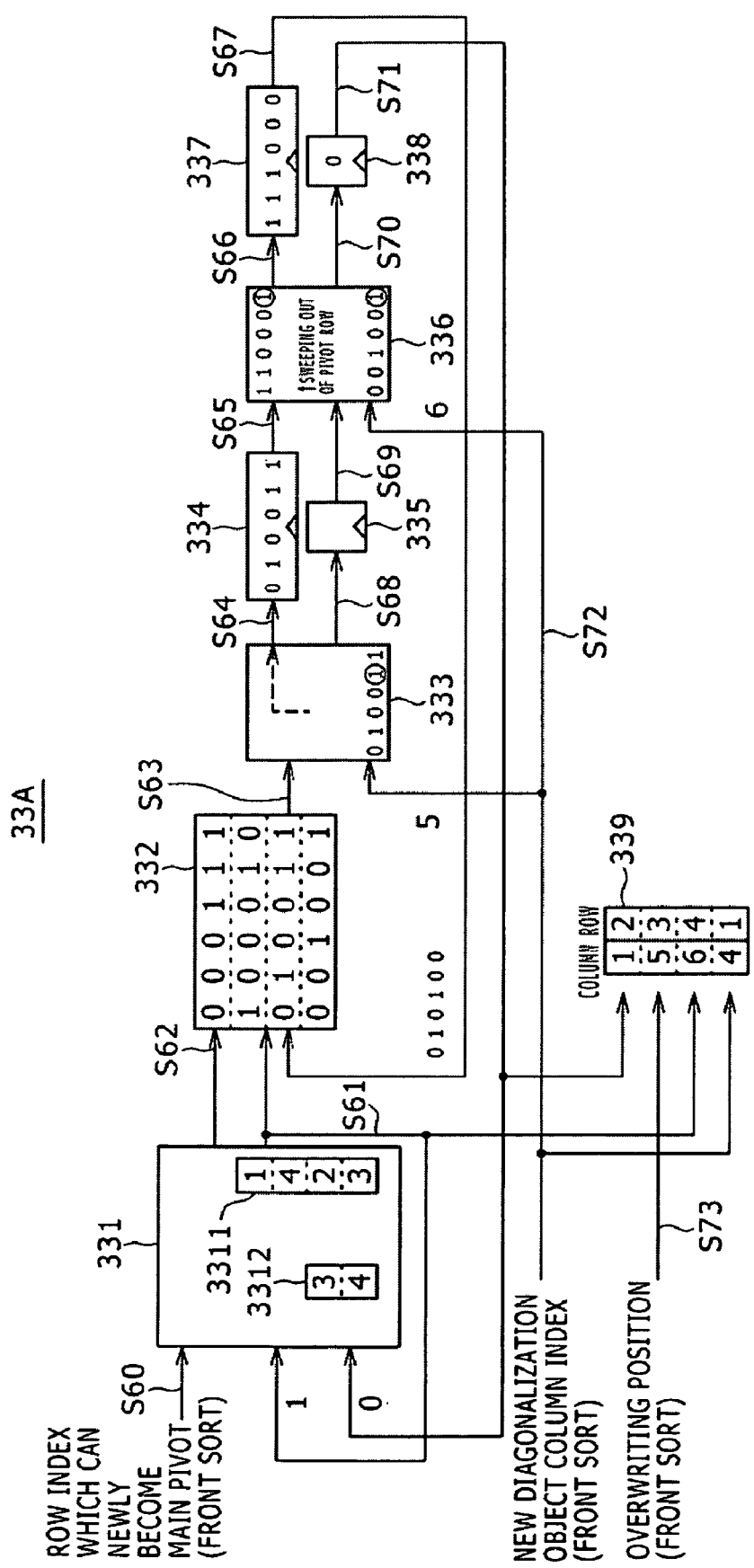
Figure 34:
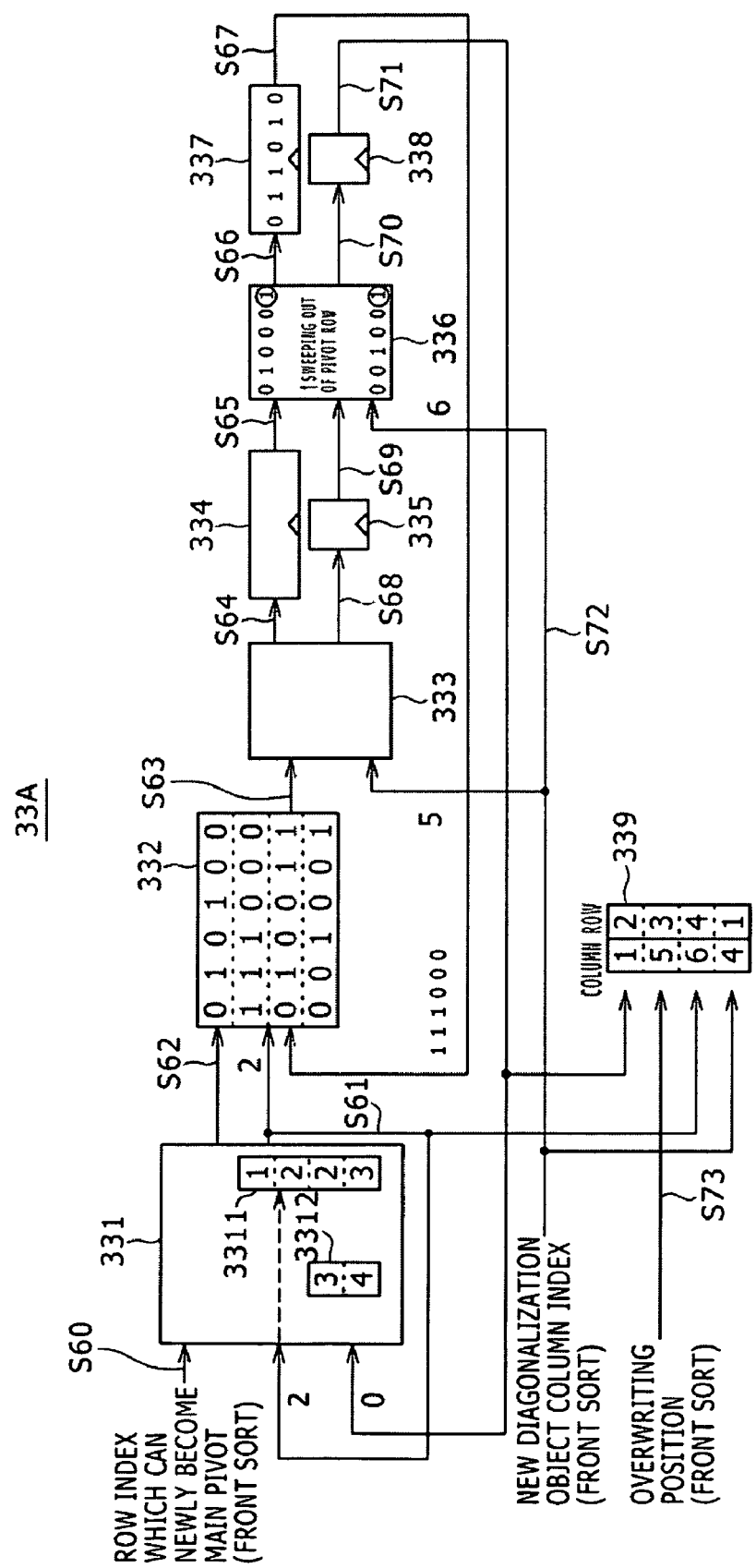
Figure 35:
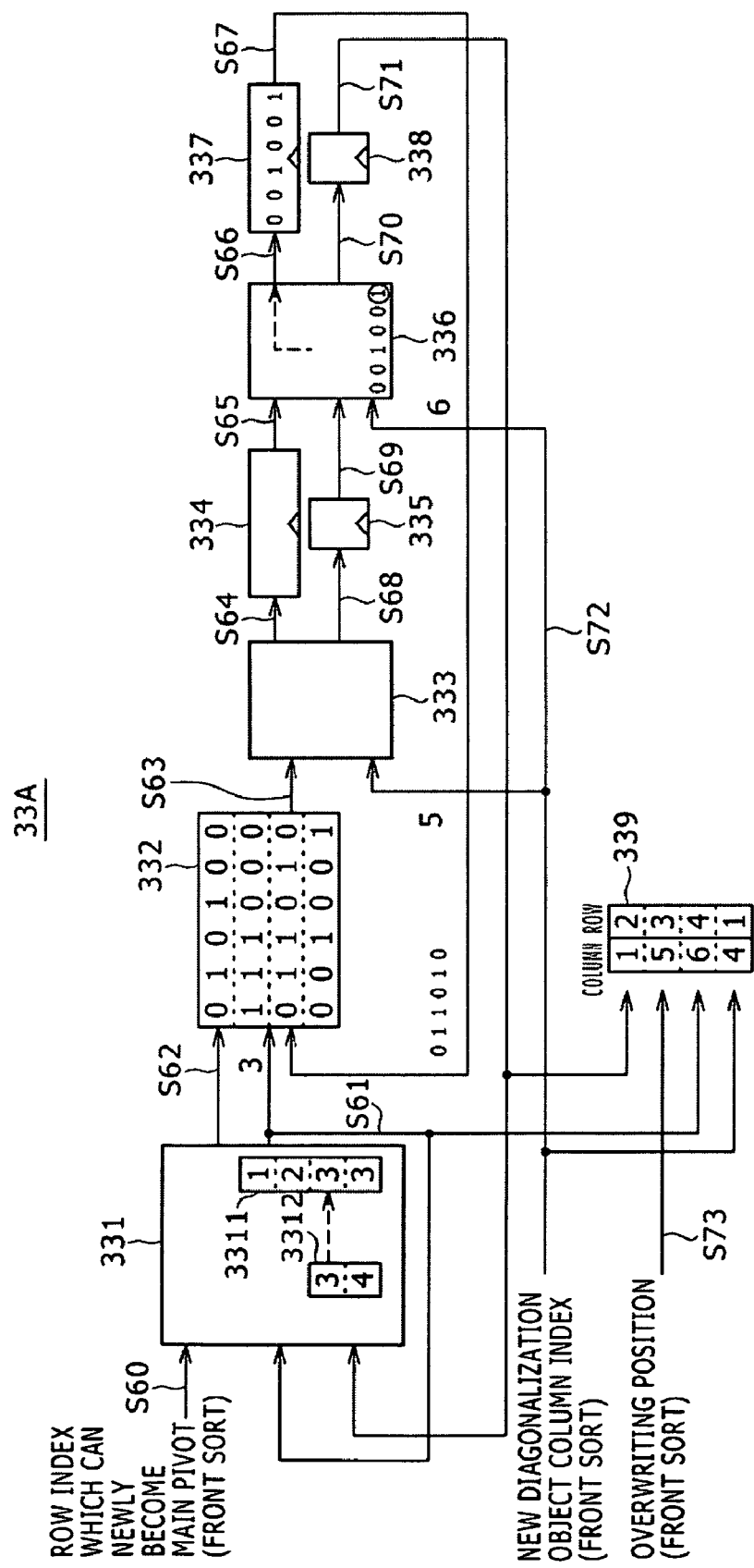
Figure 36:
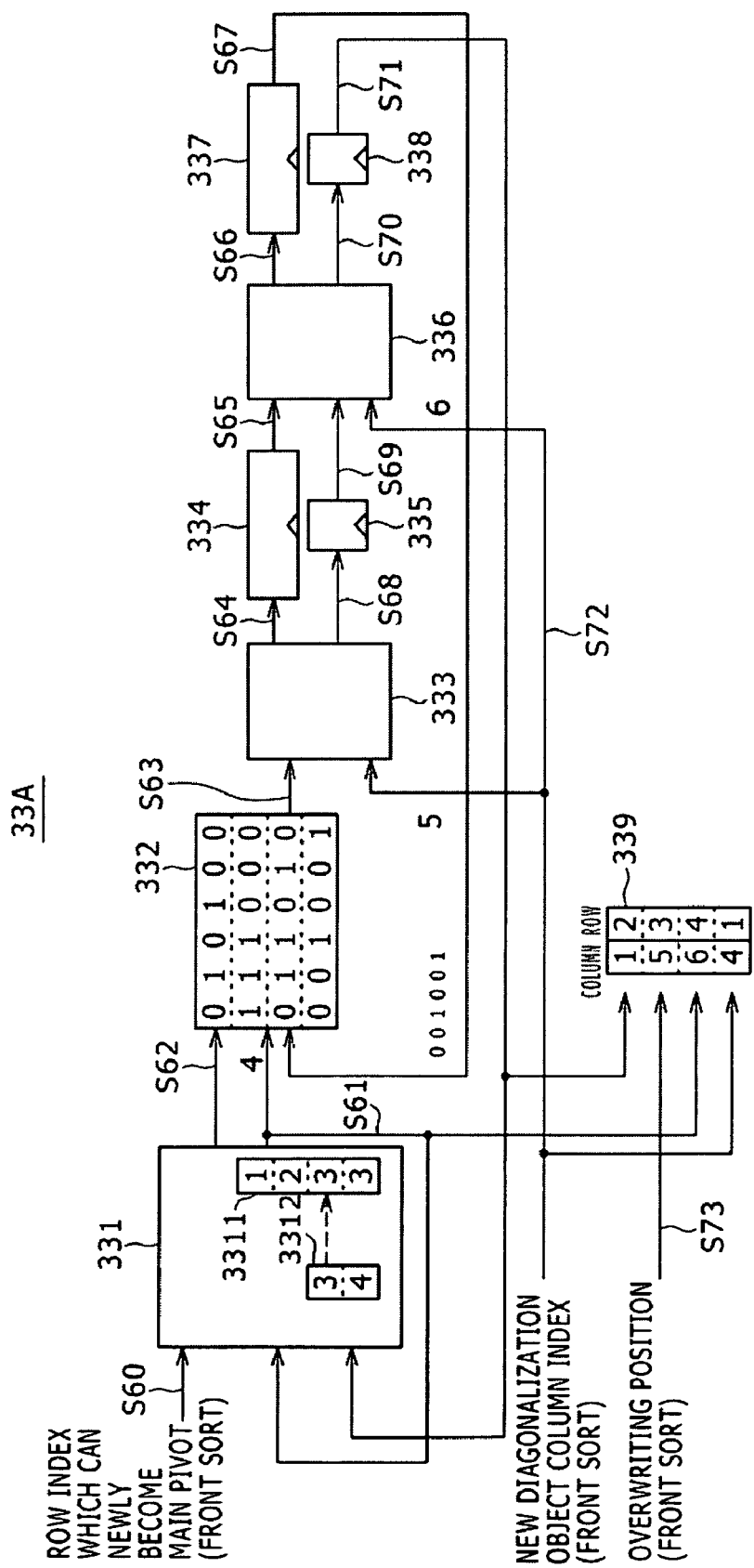

As seen in FIG. 32, since the write row index 4 and the pivot flag 1 as a pivot row of the sixth column in the present cycle arrive at the pivot column and row index memory 339, the pivot row 4 is written corresponding to the pivot column 6 into the pivot column and row index memory 339.

Thereafter, pivot search and sweeping out are performed similarly as seen in FIGS. 33, 34, 35 and 36 until they are completed.

After the pivot search and sweeping out are completed, a diagonalization object column index and a corresponding pivot row are thereafter outputted for belief propagation (BP).

In the processing of FIGS. 37 to 40, diagonalization object columns and corresponding pivot rows are read out in order from the pivot column and row index memory 339.

Figure 37:
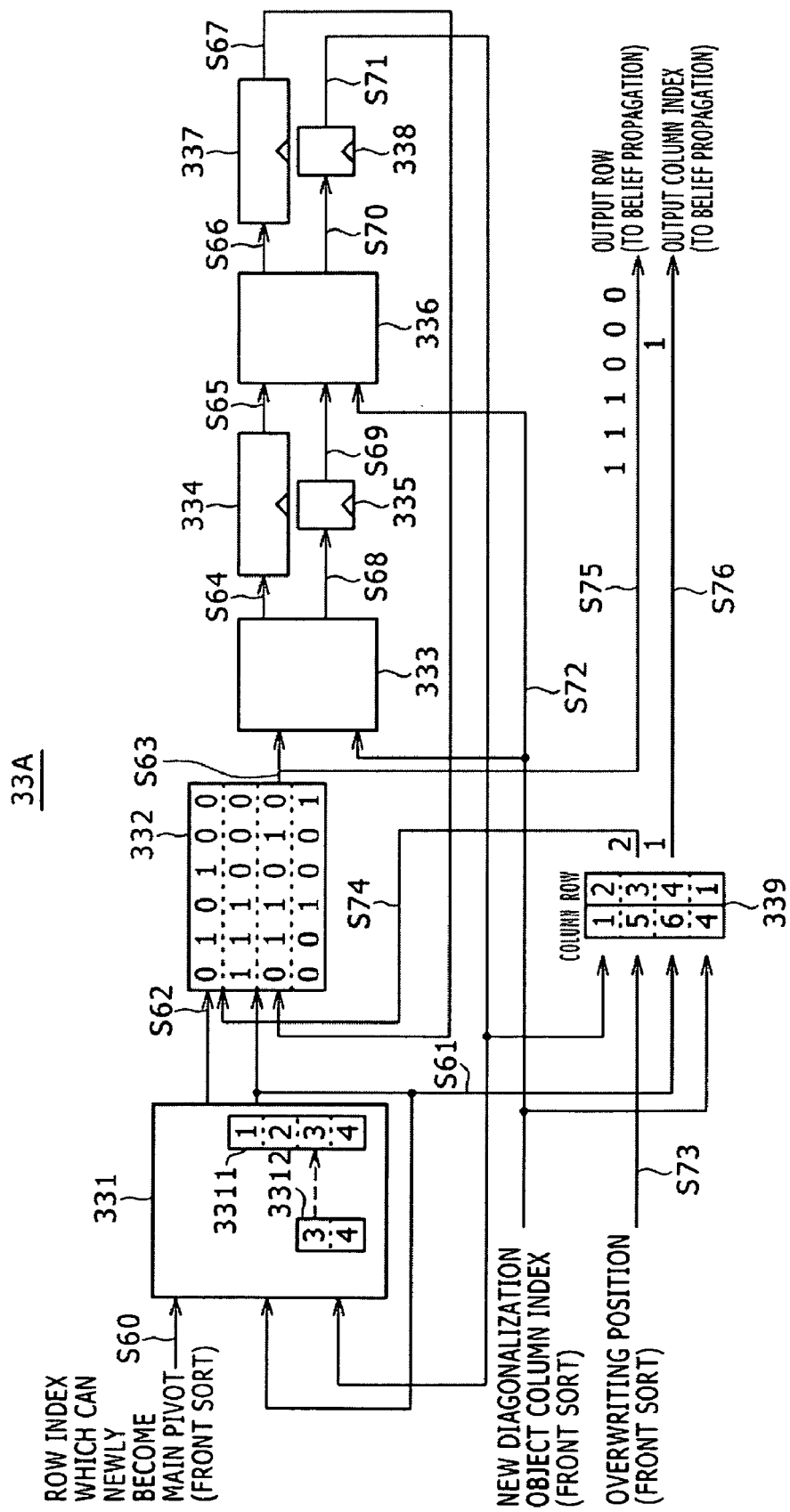
Figure 38:
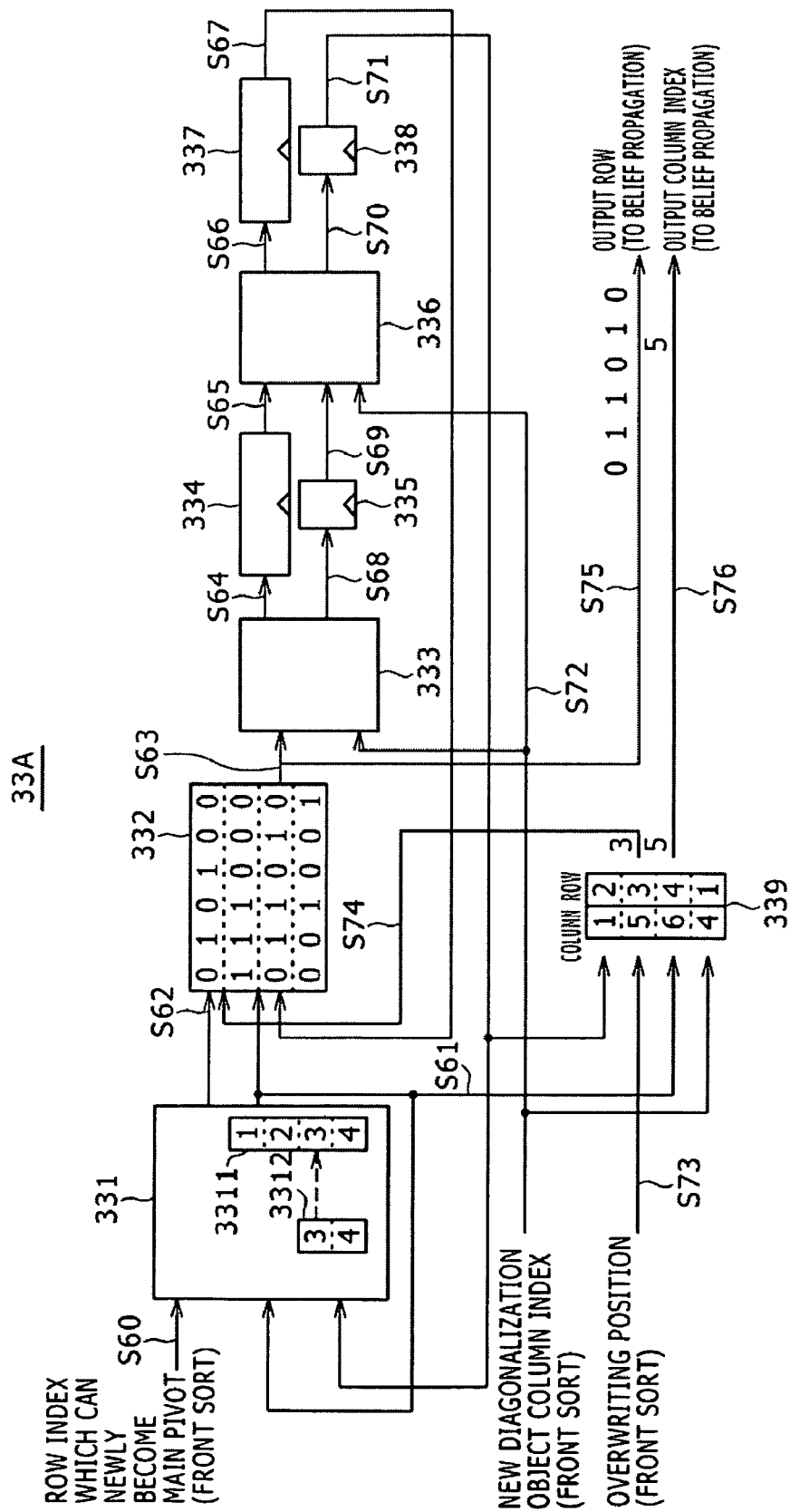
Figure 39:
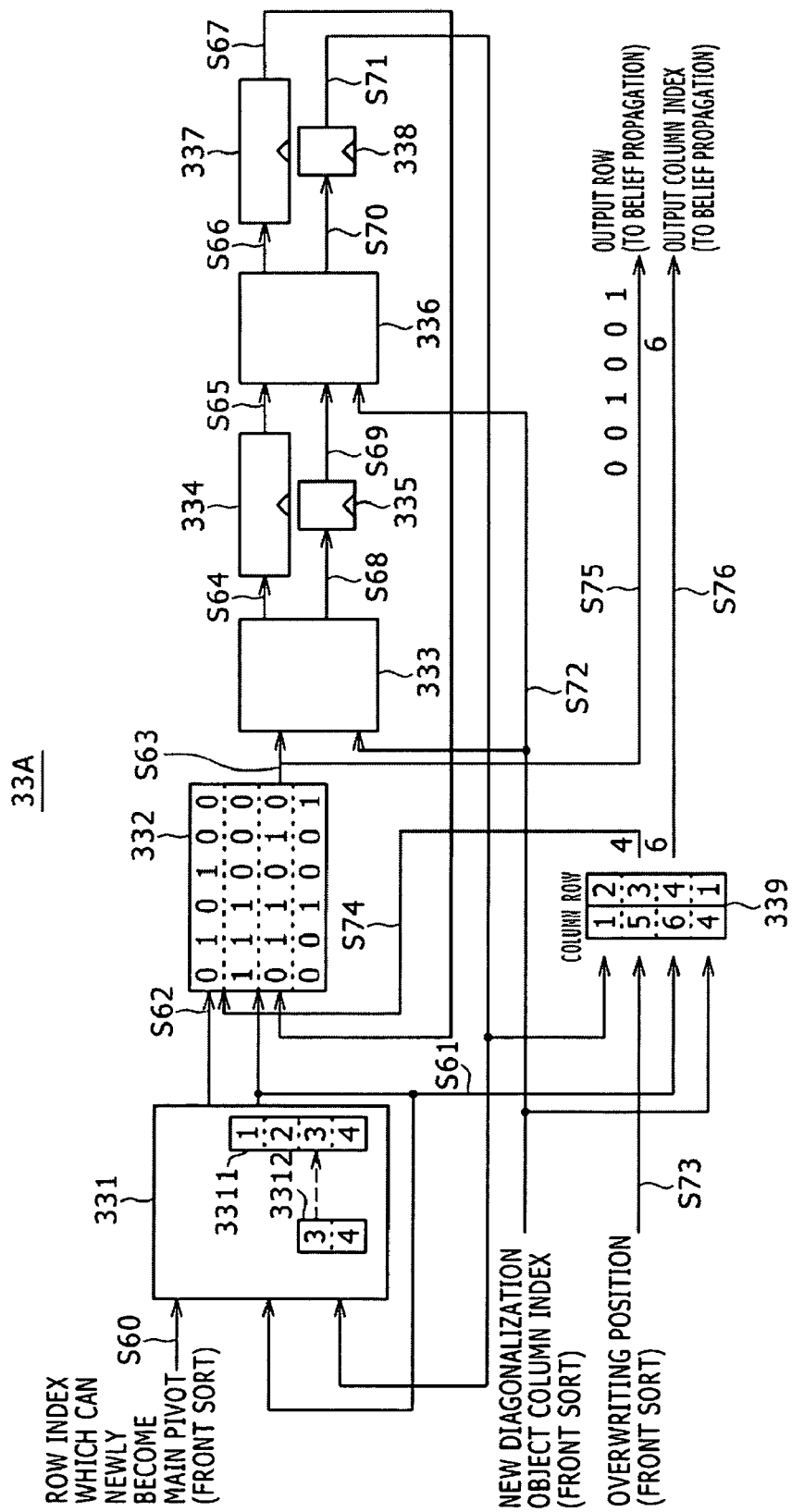
Figure 40:
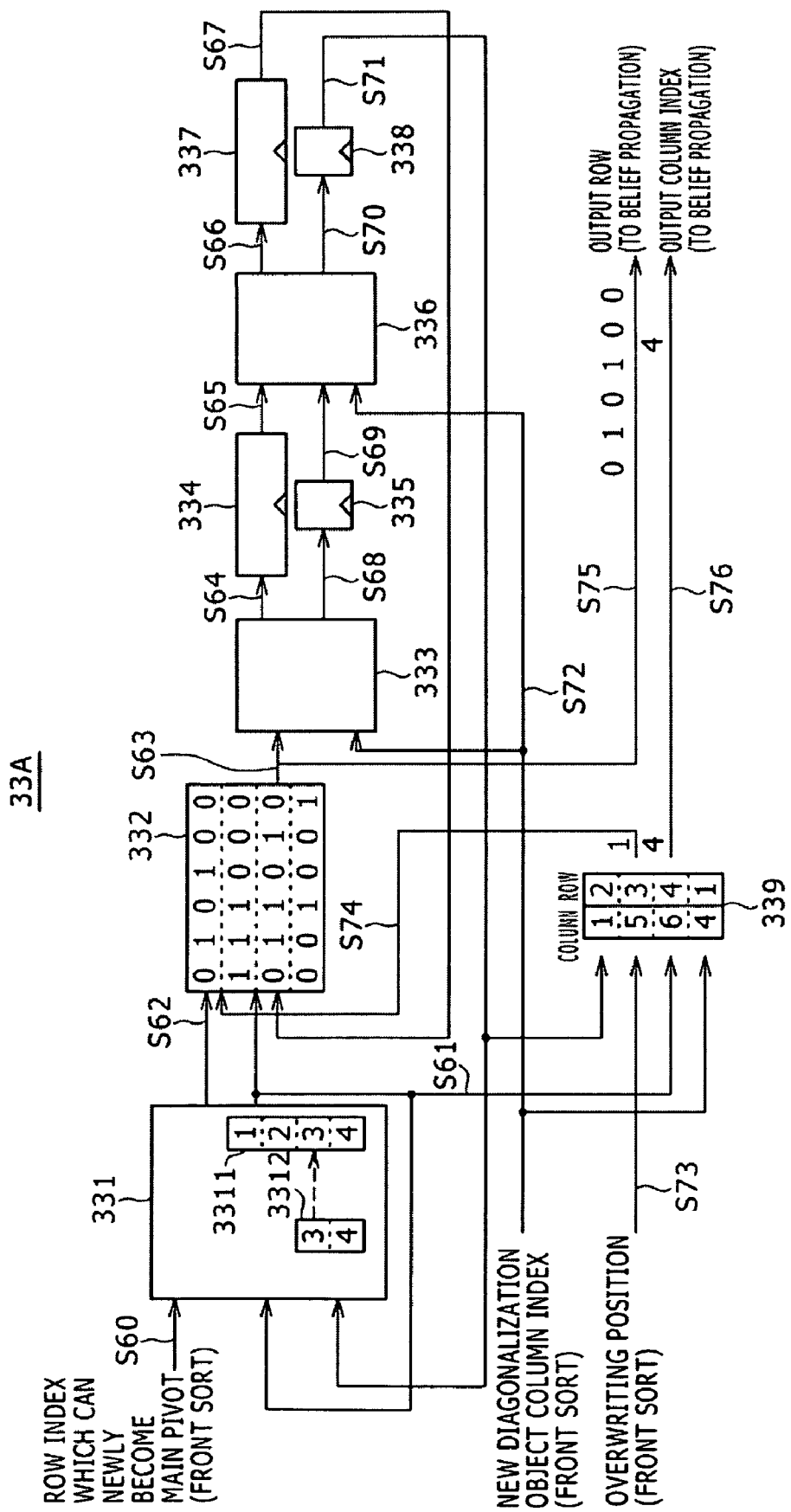

For example, as seen FIG. 37, the value 1 of a column index S76 and the value 2 of a row index S74 are read out from the top address of the pivot column and row index memory 339. In the meantime, a row S75 read out based on the column index S76 and the row index S74 is outputted.

By repeating the diagonalization and the belief propagation (BP) described above, the diagonalization section in the ABP decoder is established.

Figure 41:
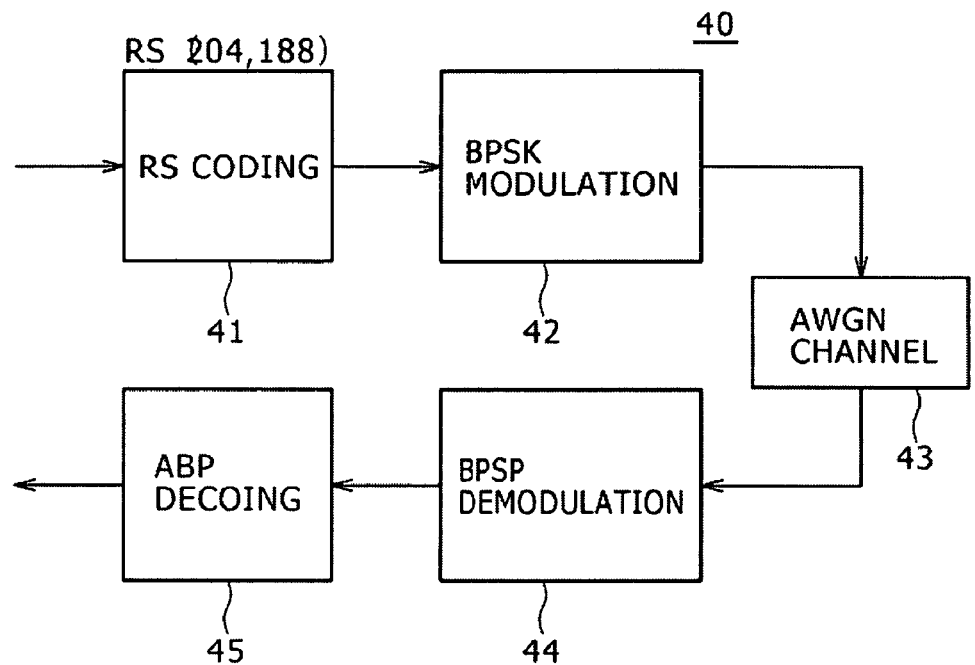
FIG. 41 is a block diagram showing a simulation model.

FIG. 41 shows a simulation model.

Referring to FIG. 41, the simulation model 40 shown includes a RS encoder 41, a BPS modulator 42, an AWGN channel 43, a BPSK demodulator 44 and an ABP decoder 45.

Figure 42:
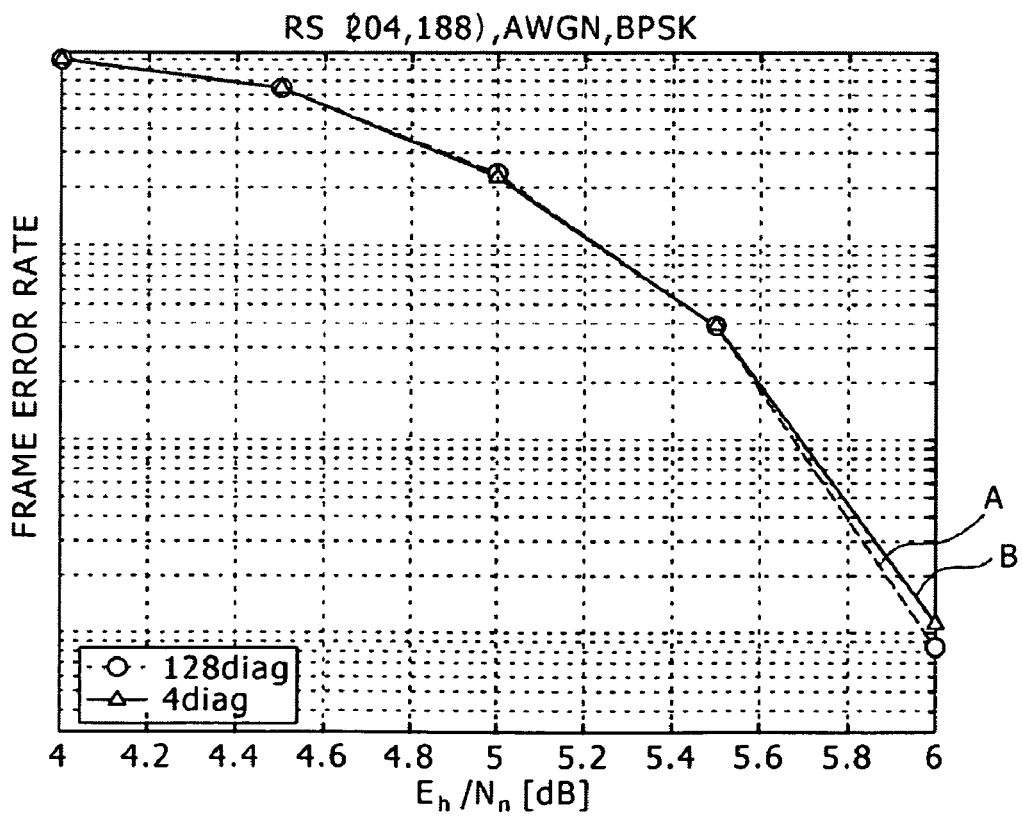
FIG. 42 is a graph illustrating a result of a simulation by the simulation model of FIG. 41.

FIG. 42 illustrates a result of the simulation.

In particular, FIG. 42 illustrates a frame error rate where a Reed-Solomon code RS(204, 188) is assumed, and in FIG. 42, a curve indicated by A illustrates a decoding performance of an existing technique while another curve indicated by B illustrates a decoding performance of the technique according to the present embodiment.

It is confirmed by a simulation that, in the second or later cycle of the inner repetition described hereinabove, even where exchange of a diagonalization object column set and a non-object column set only of four columns is performed and ABP decoding of re-diagonalization only of four columns is used, when compared with an existing technique, performance deterioration little occurs with such a simulation model as shown in FIG. 41 as seen from FIG. 42.

Figure 43:
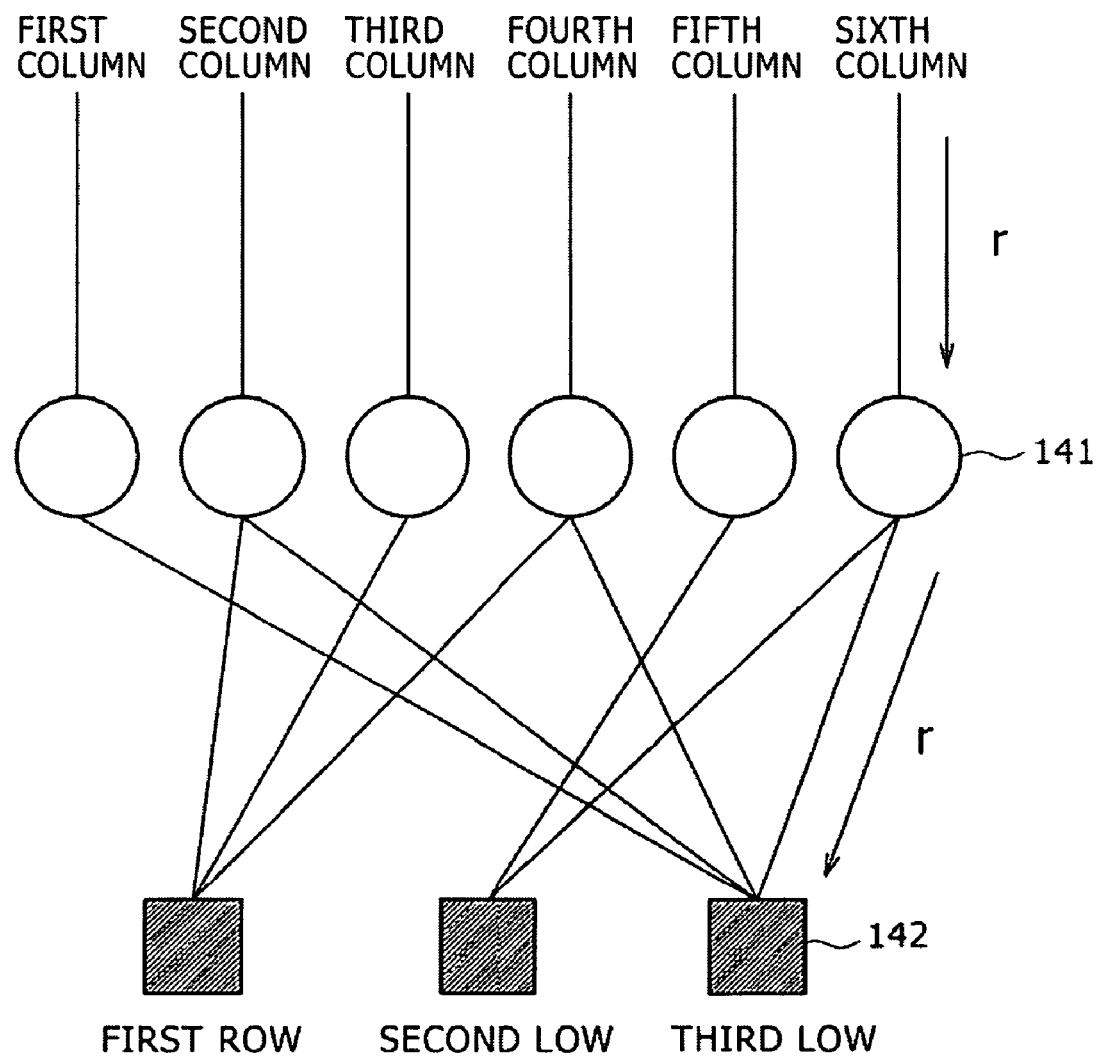
FIGS. 43 to 45 are views illustrating first, second and third flows of messages on a Tanner graph of repeated decoding in which adaptive belief propagation according to a third embodiment of the present invention is used, respectively.
Figure 44:
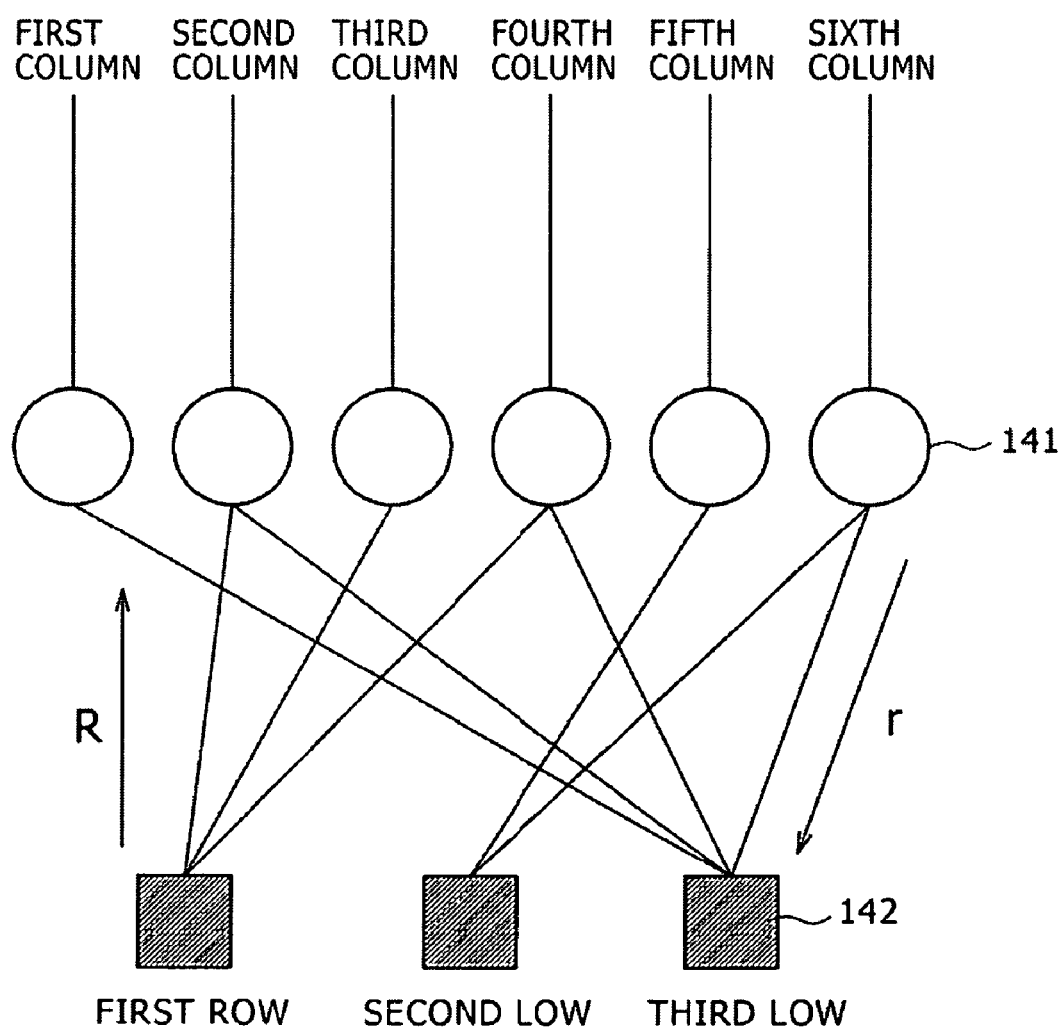
Figure 45:
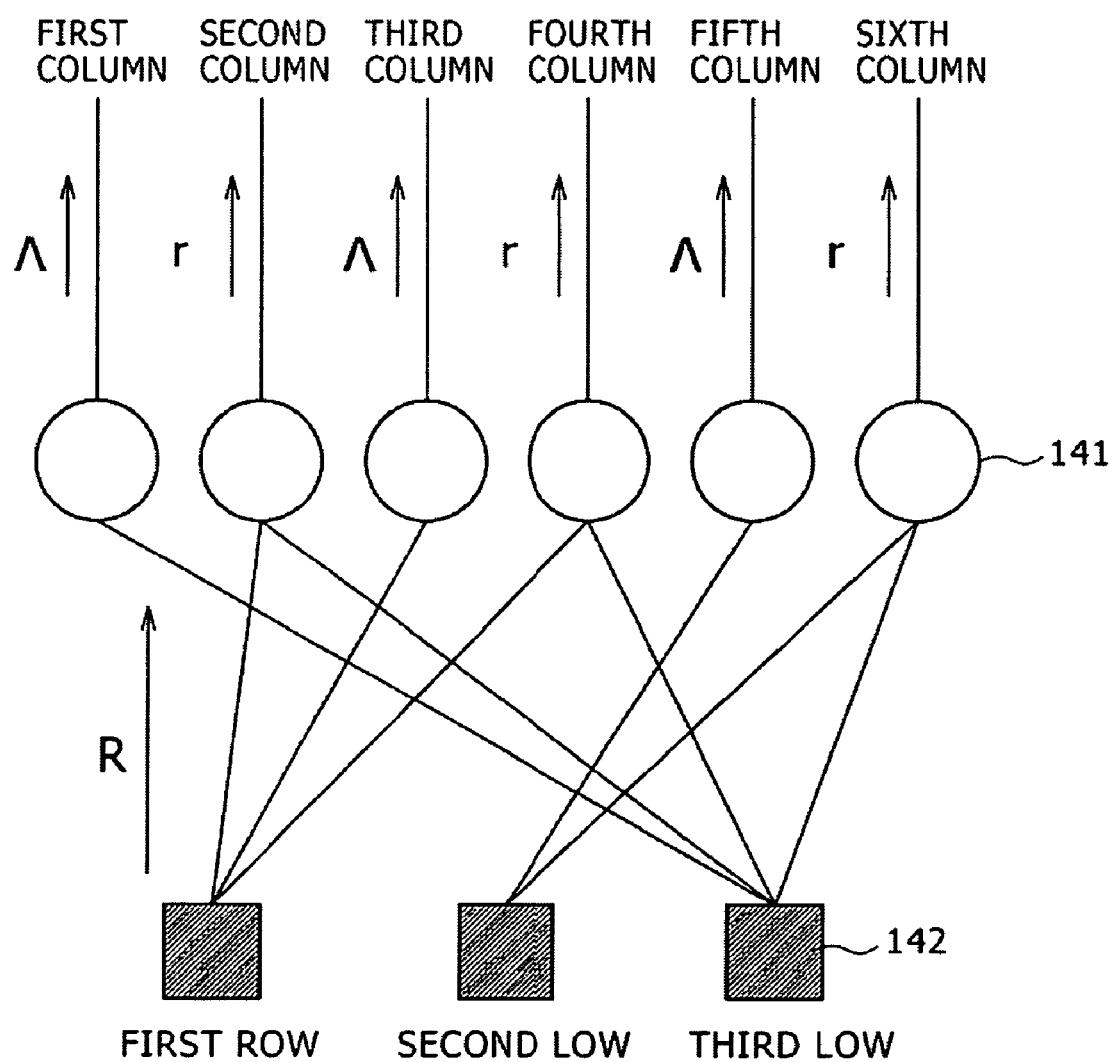

FIGS. 43, 44 and 45 illustrate flows of messages on a Tanner graph of repeated decoding using the adaptive belief propagation (ABP) according to a third embodiment of the present invention.

In the present embodiment, the number of times of repetition of the belief propagation (BP) is suppressed to one and the reliability s updated only for diagonalization object columns.

Referring first to FIG. 43, an initial value of a message from a variable node 141 to a check node 142 is determined first. To the initial value, a received word ri is set. In other words, the initial value is given by the following expression:

$$Q_{l,j}=r_l \quad \text{[Expression 29]}$$

Then, referring to FIG. 44, a message from the check node 142 to the variable node 141 is calculated in the following manner:

$$R_{i,j}=2\tan h^{-1}(\pi_{l \in I(j) \setminus i} \tan h(Q_{l,j}/2)) \quad \text{[Expression 30]}$$

Finally, referring to FIG. 45, since the repetition number is 1, variable node mathematical operation for the variable node 141 is not performed, and the LLR of each bit is updated. The values are updated with regard to the first, third and fifth columns which are diagonalization object columns, and are outputted as updated values given below:

$$\Lambda_i^x = \sum_{l \in J(i)} R_{i,l} \quad \text{[Expression 31]}$$
$$\Lambda_1^q = r_i + \alpha_1 \Lambda_i^x$$

With regard to the second, fourth and sixth columns which are not diagonalization object columns, the received word ri is outputted as it is as an updated value.

According to the foregoing, the amount of mathematical operation decreases, and particularly, there is no necessity to perform variable node mathematical operation.

Figure 46:
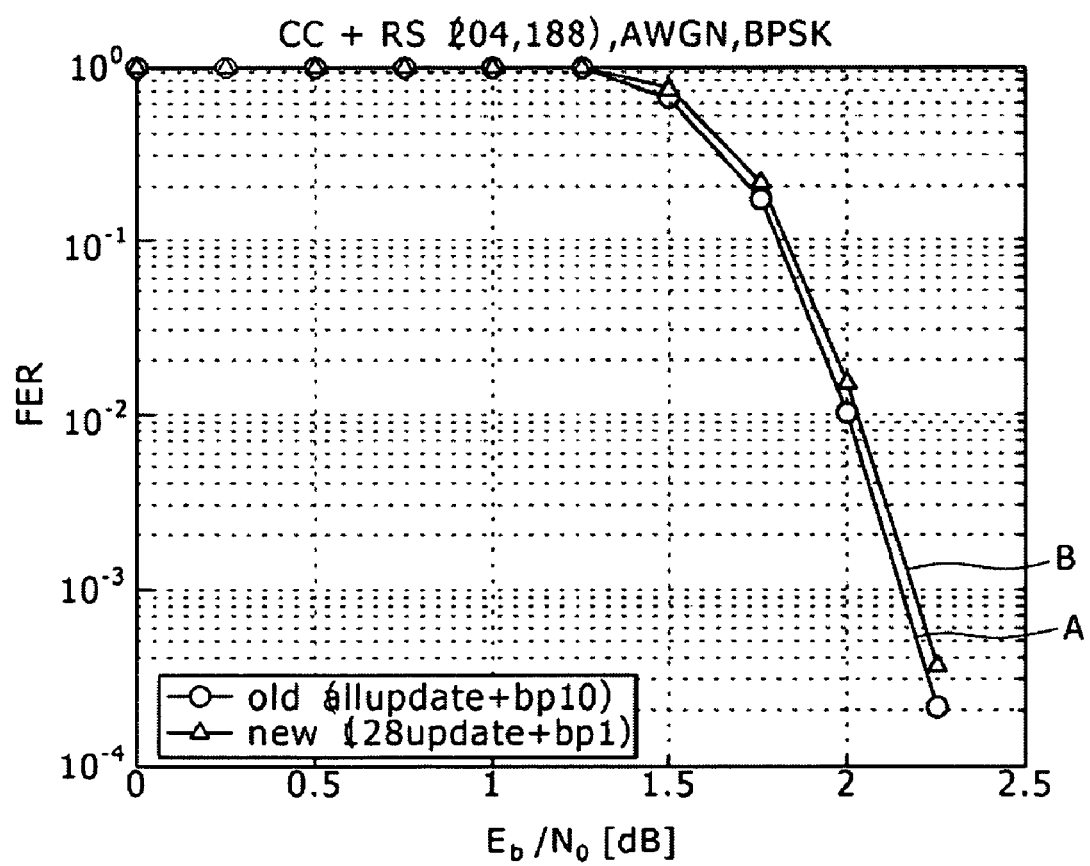
FIG. 46 is a graph for comparison between decoding performances in which simulations by an existing technique and a technique according to the third embodiment of the present invention.

FIG. 46 shows a graph for comparison between decoding performances by an existing method and the method according to the present method obtained using a simulation.

Figure 47:
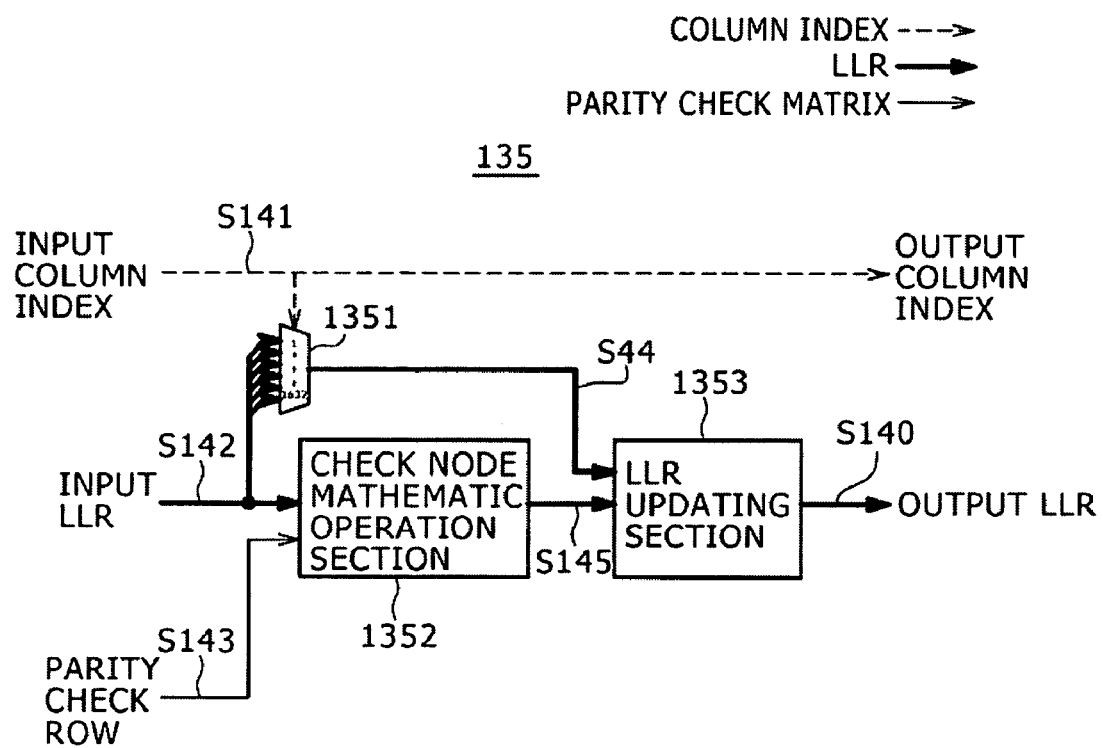
FIG. 47 is a block diagram showing an example of a configuration of a belief propagation (BP) section of the ABP decoder according to the third embodiment of the present invention.

In particular, FIG. 46 illustrates a frame error rate where a Reed-Solomon code RS(204, 188) is assumed. Referring to FIG. 47, a curve A indicates a decoding performance of an existing technique, and another curve B indicates a decoding performance of the technique of the present embodiment.

It is to be noted that it is indicated by the simulation that, in a simulation model associated with a convolution code, performance deterioration is found little with the technique of the present embodiment as seen in FIG. 46.

Figure 48:
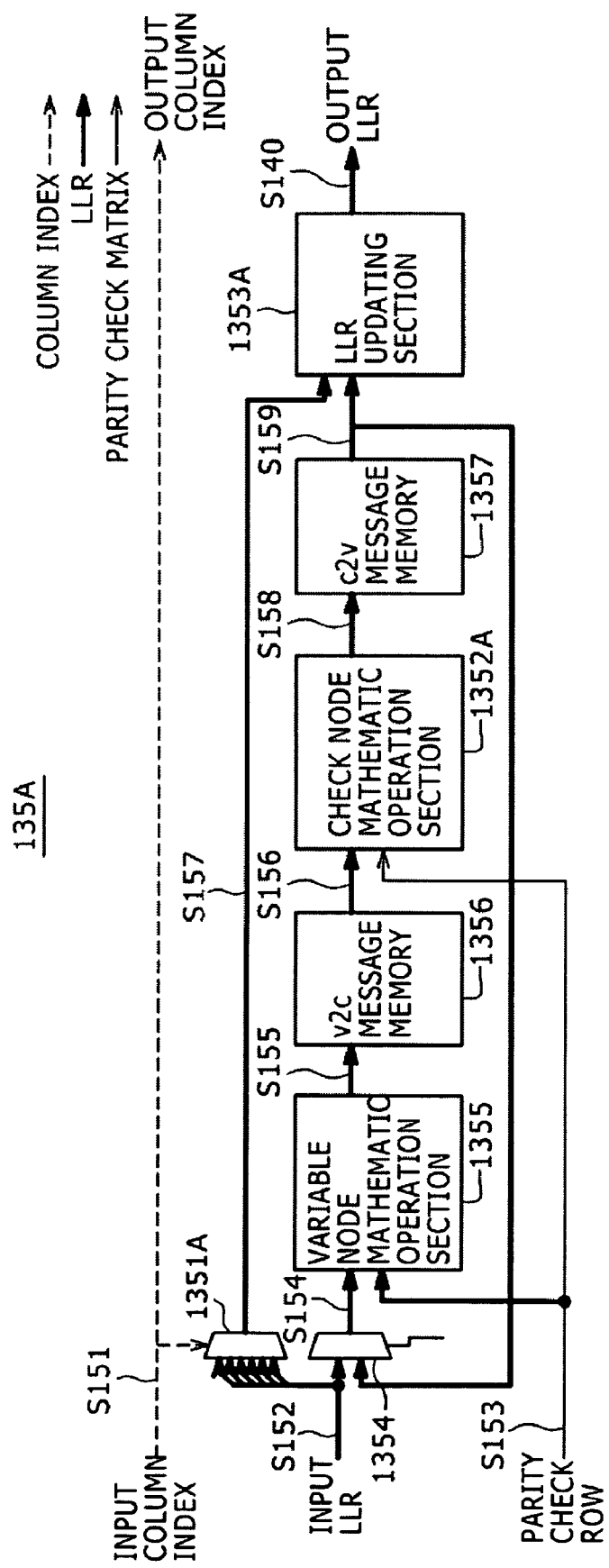
FIG. 48 is a block diagram showing an example of a configuration of a belief propagation (BP) section of an ABC decoder wherein the decoding method according to the third embodiment of the present invention is not applied.

FIG. 47 shows an example of a configuration of a belief propagation (BP) section of an ABP decoder according to the embodiment of the present invention. Meanwhile, FIG. 48 shows an example of a configuration of a belief propagation (PB) section of another ABP decoder to which the decoding method according to the embodiment of the present invention is not applied.

Referring first to FIG. 47, the belief propagation (BP) section 135 shown includes an updating column LLR selection section 1351, a check node mathematical operation section 1352, and an LLR updating section 1353.

For example, where a Reed-Solomon code RS(204, 188) is assumed, if an LLR S142 of all of 1,632 columns is inputted, then an LLR S142 of columns to be updated is selected based on an index S141 of the columns to be updated by the a updating column LLR selection section 1351.

Further, the check node mathematical operation section 1352 utilizes an input LLR S144 and a parity check row S143 to perform check node mathematical operation.

Here, since a viable node to be updated always is a diagonalization object column, only one check node is connected to the variable node without fail. In other words, in response to row inputting and LLR inputting in one cycle, all messages arriving at the variable node to be updated are mathematically operated.

Therefore, the LLR of the index S141 is updated if a message S145 updated by the check node mathematical operation and the input LLR S144 selected by the updating column LLR selection section 1351 are added by the LLR updating section 1353, that is, by performing mathematical operation of the following expression:

$$LLR_{S90}=LLR_{S87}+\alpha_1 msg_{S88}$$

Referring now to FIG. 48, the belief propagation (BP) section 135A shown includes an updating column LLR selection section 1351A, a check node mathematical operation section 1352A, and an LLR updating section 1353A. The belief propagation (BP) section 135A further includes a variable node mathematical operation input selection section 1354, a variable node mathematical operation section 1355, a v2c message memory 1356 and a c2v message memory 1357.

The updating column LLR selection section 1351A selects the LLR of an column index S151 to be updated from an input LLR S152 having LLR values corresponding to the code length.

The variable node mathematical operation input selection section 1354 selects, in the first cycle of repetition of the belief propagation (BP), the input LLR S152, but selects, in the second or later cycle of repetition, a message S159 after check node arithmetic operation.

The v2c message memory 1356 functions as a message memory for a message from a variable node to a check node. The c2v message memory 1357 functions as a message memory for a message from a check node to a variable node.

In the belief propagation (BP) section 135A of FIG. 48, the variable node mathematical operation section 1355 first utilizes a message after check node mathematical operation to perform variable node mathematical operation, and outputs an updated message S155.

However, as described hereinabove, in the first cycle of repetition, the updated message S155 is set to the input LLR S152. After completion of the viable node mathematical operation, a message from a variable node to a check node is outputted from the v2c message memory 1356, and check node mathematical operation is performed by the check node mathematical operation section 1352A.

Thereafter, an updating message is retained into the c2v message memory 1357. A message S159 is sent from the c2v message memory 1357 to the variable node mathematical operation section 1355.

Thereafter, the sequence of operations described is repeated. After the sequence is repeated by a number of times of the repetition number, the LLR updating section 1353A updates the LLR making use of the LLR S157 to be updated and the message S159 and outputs the LLR.

In this manner, in the belief propagation (BP) section 135A of FIG. 48, both of check node mathematical operation and variable node mathematical operation must be performed, and both of a parity check row and a column of a parity check matrix are requisite for the two mathematical operations.

Further, the message memory demands a number of words equal to the number of 1s of the parity check matrix.

In contrast, in the belief propagation (BP) section 135 of FIG. 47 according to the third embodiment of the present invention, the variable node mathematical operation section and the message memory are not requisite. Accordingly, increase of the circuit scale can be prevented.

Further, since only a parity check row is requisite while no column is requisite for the check node mathematical operation, it is necessary for the diagonalization section 133 to output only a parity check row S137 to the belief propagation (BP) section 135, and this can be implemented without difficulty from a general configuration of a memory. Consequently, the amount of calculation is reduced, and also reduction of the operation frequency can be anticipated.

As described above, according to the third embodiment of the present invention described above, the number of times of repetition of belief propagation (BP) can be reduced to one. Further, by updating the reliability only for diagonalization object columns, the amount of calculation can be reduced.

Particularly, in the apparatus, since the number of times of repetition of belief propagation (BP) is one, there is no necessity to perform variable node mathematical operation. As a result, the variable node mathematical operation apparatus can be omitted, and the circuit scale can be reduced.

Further, the necessity to read out columns of a parity check matrix necessary for variable node mathematical operation from the diagonalization section is eliminated. Furthermore, where the reliability is updated only for diagonalization object columns, the number of check nodes connecting to a variable node which updates the LLR is one. Therefore, since, if a check node mathematical operation updating message and the LLR of a column to be updated are inputted directly to the LLR updating section, then LLR updating is completed, there is no necessity to provide a message memory at a stage succeeding the check node mathematical operation section.

Note that the decoding method described above in detail can be implemented as a program corresponding to the above-described procedure, and that such a program can be executed by a computer such as a CPU.

Also note that such a program can be stored in a storage medium such as a semiconductor memory, a magnetic disk, an optical disk, or a floppy (registered trademark) disk, and that a computer for which the storage medium is prepared can access and execute the program.

While preferred embodiments of the present invention have been described using specific terms, such description is for illustrative purpose only, and it is to be understood that changes and variations may be made without departing from the spirit or scope of the following claims.

What is claimed is:

1. A decoding method for sorting received words in the order of the magnitude of the reliability of the received words, performing belief propagation using a parity check matrix diagonalized in the order to update the reliabilities, and repetitively performing the sorting and the belief propagation for the updated values, comprising
    an inner repeated decoding process step of performing belief propagation using a parity check matrix diagonalized in an order of columns corresponding to symbols having comparatively low reliability values of the received words to update the reliability and repetitively performing the belief propagation based on the updated reliability;
    the inner repeated decoding process step in the second or later cycle of repetition thereof including diagonalization of the parity check matrix for restricted ones of the columns of the parity check matrix.

2. The decoding method according to claim 1, wherein, in the second or later cycle of repetition of the inner repeating decoding process, pivot rows corresponding to those columns newly excepted from an object of diagonalization are removed from a past pivot row list and the diagonalization is performed only for column indexes which newly become an object of diagonalization using the matrix after the diagonalization in the preceding cycle.

3. The decoding method according to claim 2, wherein, in the second or later cycle of repetition of the inner repeating decoding process, exchange between column indexes which become an object of diagonalization and column indexes which do not become an object of the diagonalization is performed only for restricted sequences.

4. The decoding method according to claim 3, wherein, in the second or later cycle of repetition of the inner repeating decoding process, when the reliability values of those column indexes which become an object of diagonalization upon the preceding cycle of repetition are updated and newly sorted, sequences whose updated reliability values are comparatively high and sequences whose reliability values are comparatively low from among those column indexes which are excepted from an object of diagonalization in the preceding cycle of repetition are compared with each other and those sequences whose reliability values are comparatively low are added to the object of diagonalization but those sequences whose reliability values are comparatively high are excepted from the object of diagonalization.

5. The decoding method according to claim 3, wherein, in the second or later cycle of repetition of the inner repeating decoding process, those sequences whose updated reliability values are comparatively high from among the column indexes which become the object of diagonalization in the preceding cycle of repetition are compulsorily excepted from the object of diagonalization and those sequences whose reliability values are comparatively low from among the column indexes which are excepted from the object of diagonalization in the preceding cycle of repetition are compulsorily set as a new object of diagonalization.

6. A decoding apparatus which sorts received words in the order of the magnitude of the reliability of the received words, performs belief propagation using a parity check matrix diagonalized in the order to update the reliabilities, and repetitively performs the sorting and the belief propagation for the updated values, comprising
    a processing section for performing, when belief propagation is performed using a parity check matrix diagonalized in an order of columns corresponding to symbols having comparatively low reliability values of the received words to update the reliability and the belief propagation is repetitively performed based on the updated reliability, in the second or later cycle of repetition, diagonalization of the parity check matrix for restricted ones of the columns of the parity check matrix.

7. The decoding apparatus according to claim 6, wherein said processing section removes, in the second or later cycle of repetition of the inner repeating decoding process, pivot rows corresponding to those columns newly excepted from an object of diagonalization from a past pivot row list and performs the diagonalization only for column indexes which newly become an object of diagonalization using the matrix after the diagonalization in the preceding cycle.

8. The decoding apparatus according to claim 7, wherein said processing section performs, in the second or later cycle of repetition of the inner repeating decoding process, exchange between column indexes which become an object of diagonalization and column indexes which do not become an object of the diagonalization only for restricted sequences.

9. The decoding apparatus according to claim 8, wherein said processing section compares, in the second or later cycle of repetition of the inner repeating decoding process, when the reliability values of those column indexes which become an object of diagonalization upon the preceding cycle of repetition are updated and newly sorted, sequences whose updated reliability values are comparatively high and sequences whose reliability values are comparatively low from among those column indexes which are excepted from an object of diagonalization in the preceding cycle of repetition with each other and excepts those sequences whose reliability values are comparatively low are added to the object of diagonalization but those sequences whose reliability values are comparatively high from the object of diagonalization.

10. The decoding apparatus according to claim 8, wherein said processing section compulsorily excepts, in the second or later cycle of repetition of the inner repeating decoding process, those sequences whose updated reliability values are comparatively high from among the column indexes which become the object of diagonalization in the preceding cycle of repetition from the object of diagonalization and compulsorily sets those sequences whose reliability values are comparatively low from among the column indexes which are excepted from the object of diagonalization in the preceding cycle of repetition as a new object of diagonalization.

11. A program for causing a computer to execute a decoding process for sorting received words in the order of the magnitude of the reliability of the received words, performing belief propagation using a parity check matrix diagonalized in the order to update the reliabilities, and repetitively performing the sorting and the belief propagation for the updated values, comprising
 an inner repeated decoding process step of performing belief propagation using a parity check matrix diagonalized in an order of columns corresponding to symbols having comparatively low reliability values of the received words to update the reliability and repetitively performing the belief propagation based on the updated reliability;
 the inner repeated decoding process step in the second or later cycle of repetition thereof including diagonalization of the parity check matrix for restricted ones of the columns of the parity check matrix.

12. The program according to claim 11, wherein, in the second or later cycle of repetition of the inner repeating decoding process, pivot rows corresponding to those columns newly excepted from an object of diagonalization are removed from a past pivot row list and the diagonalization is performed only for column indexes which newly become an object of diagonalization using the matrix after the diagonalization in the preceding cycle.

13. The program according to claim 12, wherein, in the second or later cycle of repetition of the inner repeating decoding process, exchange between column indexes which become an object of diagonalization and column indexes which do not become an object of the diagonalization is performed only for restricted sequences.

14. The program according to claim 13, wherein, in the second or later cycle of repetition of the inner repeating decoding process, when the reliability values of those column indexes which become an object of diagonalization upon the preceding cycle of repetition are updated and newly sorted, sequences whose updated reliability values are comparatively high and sequences whose reliability values are comparatively low from among those column indexes which are excepted from an object of diagonalization in the preceding cycle of repetition are compared with each other and those sequences whose reliability values are comparatively low are added to the object of diagonalization but those sequences whose reliability values are comparatively high are excepted from the object of diagonalization.

15. The program according to claim 13, wherein, in the second or later cycle of repetition of the inner repeating decoding process, those sequences whose updated reliability values are comparatively high from among the column indexes which become the object of diagonalization in the preceding cycle of repetition are compulsorily excepted from the object of diagonalization and those sequences whose reliability values are comparatively low from among the column indexes which are excepted from the object of diagonalization in the preceding cycle of repetition are compulsorily set as a new object of diagonalization.

16. A decoding method for sorting received words in the order of the magnitude of the reliability of the received words, performing belief propagation using a parity check matrix diagonalized in the order to update the reliabilities, and repetitively performing the sorting and the belief propagation for the updated values, comprising
 a belief propagation step of performing belief propagation of the reliability of the received words;
 the belief propagation at the belief propagation step being performed only using indexes of columns to be updated, pivot columns of the parity check matrix corresponding to the columns and reliability values of all columns.

17. The decoding method according to claim 16, wherein the belief propagation step includes:
 a first step of performing check node mathematical operation using input reliability values and parity check rows to produce updating messages; and
 a second step of updating reliability values of columns to be updated with reliability values of the columns to be updated selected based on the indexes of the columns to be updated and the updating messages produced at the first step.

18. A decoding apparatus which sorts received words in the order of the magnitude of the reliability of the received words, performs belief propagation using a parity check matrix diagonalized in the order to update the reliabilities, and repetitively performs the sorting and the belief propagation for the updated values, comprising
 a belief propagation section performing belief propagation of the reliability of the received words;
 said belief propagation section performing the belief propagation only using indexes of columns to be updated, pivot columns of the parity check matrix corresponding to the columns and reliability values of all columns.

19. A program for causing a computer to execute a decoding process for sorting received words in the order of the magnitude of the reliability of the received words, performing belief propagation using a parity check matrix diagonalized in the order to update the reliabilities, and repetitively performing the sorting and the belief propagation for the updated values, comprising:
 a belief propagation step of performing belief propagation of the reliability of the received words;
 the belief propagation at the belief propagation step being performed only using indexes of columns to be updated, pivot columns of the parity check matrix corresponding to the columns and reliability values of all columns.

20. A decoding apparatus which sorts received words in the order of the magnitude of the reliability of the received words, performs belief propagation using a parity check matrix diagonalized in the order to update the reliabilities, and repetitively performs the sorting and the belief propagation for the updated values, comprising processing means for performing, when belief propagation is performed using a parity check matrix diagonalized in an order of columns corresponding to symbols having comparatively low reliability values of the received words to update the reliability and the belief propagation is repetitively performed based on the updated reliability, in the second or later cycle of repetition, diagonalization of the parity check matrix for restricted ones of the columns of the parity check matrix.

21. A decoding apparatus which sorts received words in the order of the magnitude of the reliability of the received words, performs belief propagation using a parity check matrix diagonalized in the order to update the reliabilities, and repetitively performs the sorting and the belief propagation for the updated values, comprising belief propagation means performing belief propagation of the reliability of the received words;

said belief propagation means performing the belief propagation only using indexes of columns to be updated, pivot columns of the parity check matrix corresponding to the columns and reliability values of all columns.

* * * * *